United States Patent
Kare

(10) Patent No.: US 9,602,077 B2
(45) Date of Patent: Mar. 21, 2017

(54) SURFACE ACOUSTIC WAVE DEVICE HAVING SELECTABLE ELECTRODE ELEMENTS

(71) Applicant: Elwha LLC, Bellevue, WA (US)

(72) Inventor: Jordin T. Kare, Seattle, WA (US)

(73) Assignee: Elwha LLC

( * ) Notice: Subject to any disclaimer, the term of this patent is extended or adjusted under 35 U.S.C. 154(b) by 218 days.

(21) Appl. No.: 14/539,031

(22) Filed: Nov. 12, 2014

(65) Prior Publication Data

US 2016/0134256 A1 May 12, 2016

(51) Int. Cl.
H03H 9/64 (2006.01)
H03H 9/72 (2006.01)
H03H 9/145 (2006.01)

(52) U.S. Cl.
CPC .......... *H03H 9/6403* (2013.01); *H03H 9/145* (2013.01); *H03H 9/72* (2013.01)

(58) Field of Classification Search
CPC ......... H03H 9/6403; H03H 9/145; H03H 9/72
USPC ................................ 333/17.1, 133, 193–196
See application file for complete search history.

(56) References Cited

U.S. PATENT DOCUMENTS

| | | | |
|---|---|---|---|
| 3,723,919 A * | 3/1973 | Adler ................. | H03H 9/14508 310/313 B |
| 3,745,564 A * | 7/1973 | Gandolfo ............ | H03H 9/0296 310/313 B |
| 4,764,701 A | 8/1988 | Garbacz et al. | |
| 5,410,742 A | 4/1995 | Yajima | |
| 5,838,091 A | 11/1998 | Watanabe | |
| 5,923,231 A | 7/1999 | Ohkubo et al. | |
| 5,937,515 A * | 8/1999 | Johnson .............. | H01L 22/22 257/E21.526 |

(Continued)

OTHER PUBLICATIONS

Hoang, Trang; "SAW Parameters Analysis and Equivalent Circuit of SAW Device"; Acoustic Waves—From Microdevices to Helioseismology; Bearing a date of Nov. 14, 2011; pp. 443-483; InTech.

(Continued)

*Primary Examiner* — Robert Pascal
*Assistant Examiner* — Jorge Salazar, Jr.

(57) ABSTRACT

Described embodiments include a surface acoustic wave device, method, and apparatus. The device includes a piezoelectric substrate and a configurable electrode assembly. The configurable electrode assembly includes a plurality of spaced-apart elongated electrode elements electromechanically coupled with the piezoelectric substrate. The assembly includes a first signal bus crossing each of the plurality of electrode elements and electrically isolated therefrom. The assembly includes a first matrix of addressable switches. Each addressable switch of the first matrix configured to electrically couple a respective electrode element of the plurality of electrode elements with the first signal bus. The assembly includes a second signal bus crossing each of the plurality of electrode elements and electrically isolated therefrom. The assembly includes a second matrix of addressable switches. Each addressable switch of the second matrix configured to electrically couple a respective electrode element of the plurality of electrode elements with the second signal bus.

43 Claims, 22 Drawing Sheets

(56) References Cited

U.S. PATENT DOCUMENTS

| | | |
|---|---|---|
| 6,291,924 B1 * | 9/2001 | Lau ................. H03H 9/145 310/313 B |
| 6,459,345 B1 | 10/2002 | Kosinski et al. |
| 6,541,893 B2 | 4/2003 | Zhu et al. |
| 7,439,826 B2 | 10/2008 | Son et al. |
| 7,573,356 B2 | 8/2009 | Kawai et al. |
| 7,750,752 B1 | 7/2010 | Kosinski |
| 7,932,789 B2 | 4/2011 | Hay |
| 8,106,727 B2 | 1/2012 | Kawai et al. |
| 8,339,220 B2 | 12/2012 | Fedan |
| 8,564,384 B2 | 10/2013 | Kawai et al. |
| 8,565,349 B2 | 10/2013 | Brunn et al. |
| 8,648,666 B2 | 2/2014 | Kawai et al. |
| 2010/0052818 A1 | 3/2010 | Yip et al. |
| 2011/0012696 A1 * | 1/2011 | Skarp ............... H03H 9/02007 333/195 |
| 2012/0175230 A1 * | 7/2012 | Hammond ............ B81B 7/008 200/181 |
| 2014/0070338 A1 | 3/2014 | Wang et al. |

OTHER PUBLICATIONS

Kawai et al.; "Center Frequency, Bandwidth, and Transfer Function Tunable Bandpass Filter Using Ring Resonator and J-Inverter"; Proceedings of the 39$^{th}$ European Microwave Conference; Bearing dates of Sep. 29-Oct. 1, 2009; pp. 1207-1210; EuMA.

Lu et al.; "Reconfigurable Multiband SAW Filters for LTE Applications"; PAWR; Bearing a date of 2013; pp. 82-84; IEEE.

Lu et al.; "SAW Filters with Reconfigurable Transition Bands"; Frequency Control Symposium; Bearing dates of May 21-24, 2012; 4 Total Pages; IEEE.

"Working Principles and Applications of SAW/FBAR Devices"; Section 2—Taiyo Yuden Navigator; Created on Aug. 11, 2014; pp. 10-15.

* cited by examiner

SURFACE ACOUSTIC WAVE DEVICE HAVING SELECTABLE ELECTRODE ELEMENTS

If an Application Data Sheet (ADS) has been filed on the filing date of this application, it is incorporated by reference herein. Any applications claimed on the ADS for priority under 35 U.S.C. §§119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)).

PRIORITY APPLICATIONS

None.

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

SUMMARY

For example, and without limitation, an embodiment of the subject matter described herein includes a surface acoustic wave device. The device includes a piezoelectric substrate and a configurable electrode assembly. The configurable electrode assembly includes a plurality of spaced-apart elongated electrode elements electromechanically coupled with the piezoelectric substrate. The configurable electrode assembly includes a first signal bus proximate to each of the plurality of electrode elements and electrically isolated therefrom. The configurable electrode assembly includes a first matrix of addressable switches. Each addressable switch of the first matrix configured to electrically couple a respective electrode element of the plurality of electrode elements with the first signal bus. The configurable electrode assembly includes a second signal bus proximate to each of the plurality of electrode elements, and electrically isolated therefrom. The configurable electrode assembly includes a second matrix of addressable switches. Each addressable switch of the second matrix configured to electrically couple a respective electrode element of the plurality of electrode elements with the second signal bus.

In an embodiment, the configurable electrode assembly includes a switch controller configured to operate an addressable switch of the first matrix of addressable switches and an addressable switch of the second matrix of addressable switches. In an embodiment, the configurable electrode assembly includes a configuration manager configured to (i) receive a request for a surface acoustic wave characteristic, and (ii) select settings of the first and second matrices of addressable switches of the configurable electrode assembly implementing the requested surface acoustic wave characteristic. In an embodiment, the surface acoustic wave device includes a receiver configured to receive a request for a surface acoustic wave characteristic.

For example, and without limitation, an embodiment of the subject matter described herein includes a method implemented in a configurable electrode assembly of a surface acoustic wave device. The method includes receiving a request for a surface acoustic wave characteristic. The method includes selecting an electrode pattern producing the requested surface acoustic wave characteristic in the configurable electrode assembly having a plurality of spaced-apart electrode elements. The method includes selecting settings of a first matrix of switches implementing the selected electrode pattern in a first electrode element of the plurality of electrode elements. The method includes electrically coupling the first electrode element with a first signal bus by implementing the selected settings of the first matrix of switches. The method includes selecting settings of a second matrix of switches implementing the selected electrode pattern in a second electrode element of the plurality of electrode elements. The method includes electrically coupling the second electrode element with a second signal bus by implementing the selected settings of the second matrix of switches.

For example, and without limitation, an embodiment of the subject matter described herein includes a surface acoustic wave device. The device includes a surface wave propagating region of the piezoelectric substrate. The device includes a piezoelectric substrate, an input electrode assembly, and an output electrode assembly. The input electrode assembly or the output electrode assembly further including a configurable electrode assembly. The configurable electrode assembly including a plurality of spaced-apart elongated electrode elements electromechanically coupled with the piezoelectric substrate. The configurable electrode assembly including a first signal bus proximate to each of the plurality of electrode elements, and electrically isolated therefrom. The configurable electrode assembly including a first matrix of addressable switches. Each addressable switch of the first matrix of addressable switches configured to electrically couple a respective electrode element of the plurality of electrode elements with the first signal bus. The configurable electrode assembly including a second signal bus proximate to each of the plurality of electrode elements, and electrically isolated therefrom. The configurable electrode assembly including a second matrix of addressable switches. Each addressable switch of the second matrix of addressable switches configured to electrically couple a respective electrode element of the plurality of electrode elements with the second signal bus.

In an embodiment, the configurable electrode assembly includes a switch controller configured to operate an addressable switch of the first matrix of addressable switches and an addressable switch of the second matrix of addressable switches. In an embodiment, the device includes a switch controller coupled to an addressable switch of the first matrix of addressable switches and an addressable switch of the second matrix of addressable switches of the configurable electrode assembly. In an embodiment, the configurable electrode assembly includes a configuration manager configured to (i) receive a request for a device characteristic, and (ii) select settings of the first and second matrices of addressable switches of the configurable electrode assembly implementing the requested device characteristic. In an embodiment, the device includes a configuration manager configured to (i) receive a request for a device characteristic, and (ii) select settings of the first and second matrices of addressable switches of the configurable electrode assembly implementing the requested device characteristic. In an embodiment, the configurable electrode assembly includes a ground bus proximate to each electrode element of the plurality of electrode elements, and electrically isolated therefrom; and a third matrix of addressable switches. Each addressable switch of the third set configured to electrically couple a respective electrode element of the plurality of electrode elements with the third signal bus. In an embodiment, the device includes a switch controller configured to operate an addressable switch of the first matrix of addressable switches, an addressable switch of the second matrix of addressable switches, and an addressable switch of the third matrix of addressable switches.

For example, and without limitation, an embodiment of the subject matter described herein includes a method. The method includes selecting an electrode pattern producing a requested acoustic wave device characteristic in the configurable electrode assembly having a plurality of electrode elements, wherein an input electrode assembly or an output electrode assembly of the surface acoustic wave device includes the configurable electrode assembly. The method includes selecting settings of a first matrix of switches implementing the selected electrode pattern in a first electrode element of the plurality of electrode elements. The method includes electrically coupling the first electrode element with a first signal bus by implementing the selected settings of the first matrix of switches. The method includes selecting settings of a second matrix of switches implementing the selected electrode pattern in a second electrode element of the plurality of electrode elements. The method includes electrically coupling the second electrode element with a second signal bus by implementing the selected settings of the second matrix of switches. In an embodiment, the method includes receiving the request for an acoustic wave device characteristic.

For example, and without limitation, an embodiment of the subject matter described herein includes a surface acoustic wave device. The device includes a piezoelectric substrate. The device includes an input electrode assembly. The input electrode assembly includes a plurality of spaced-apart elongated input electrode elements electromechanically coupled with the piezoelectric substrate. The input electrode assembly includes a first input signal bus proximate to each of the plurality of input electrode elements, and electrically isolated therefrom. The input electrode assembly includes a first input-matrix of addressable switches. Each addressable switch of the first input-matrix configured to electrically couple a respective input electrode element of the plurality of input electrode elements with the first input signal bus. The input electrode assembly includes a second input signal bus proximate to each of the plurality of input electrode elements, and electrically isolated therefrom. The input electrode assembly includes a second input-matrix of addressable switches. Each addressable switch of the second input-matrix configured to electrically couple a respective input electrode element of the plurality of input electrode elements with the second input signal bus. The device includes an output electrode assembly that includes a plurality of spaced-apart elongated output electrode elements electromechanically coupled with the piezoelectric substrate. The output electrode assembly includes a first output signal bus proximate to each of the plurality of output electrode elements, and electrically isolated therefrom. The output electrode assembly includes a first output-matrix of individually addressable switches. Each addressable switch of the first output-matrix configured to electrically couple a respective output electrode element of the plurality of output electrode elements with the first output signal bus. The output electrode assembly includes a second output signal bus proximate to each of the plurality of output electrode elements, and electrically isolated therefrom. The output electrode assembly includes a second output-matrix of individually addressable switches. Each addressable switch of the second output-matrix configured to electrically couple a respective output electrode element of the plurality of output electrode elements with the second output signal bus.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
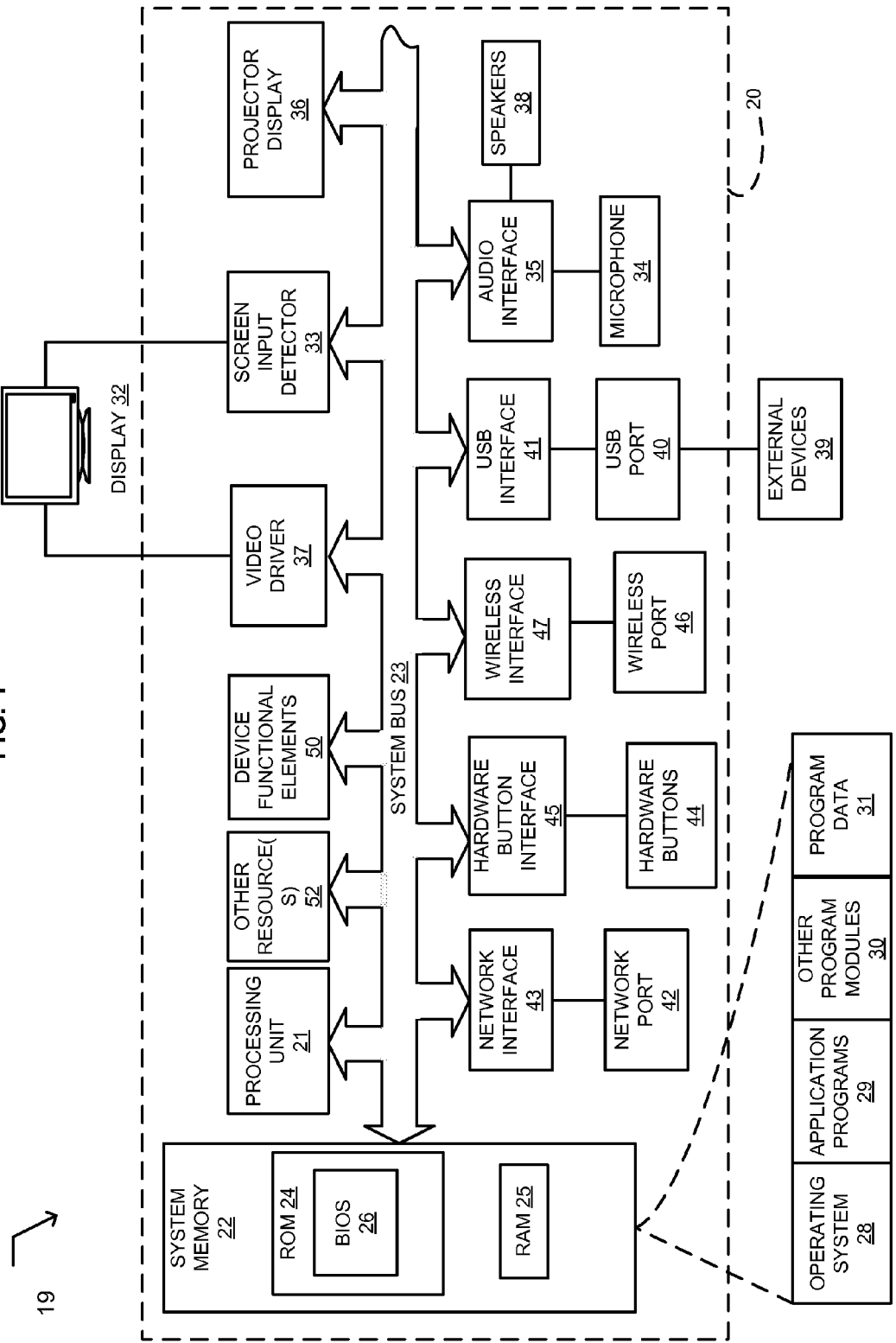
FIG. 1 illustrates an example embodiment of an environment 19 that includes a thin computing device 20 in which embodiments may be implemented.

This application makes reference to technologies described more fully in U.S. patent application Ser. No. 14/539,053, SURFACE ACOUSTIC WAVE DEVICE HAVING COMBINABLE SELECTABLE ELECTRODE SUB-ELEMENTS, naming Jordin T. Kare as inventor, filed on Nov. 12, 2014, is related to the present application. That application is incorporated by reference herein, including any subject matter included by reference in that application.

This application makes reference to technologies described more fully in U.S. patent application Ser. No. 14/539,071, SURFACE ACOUSTIC WAVE DEVICE HAVING MATRICES OF COMBINABLE SELECTABLE ELECTRODE SUB-ELEMENTS, naming Jordin T. Kare as inventor, filed on Nov. 12, 2014, is related to the present application. That application is incorporated by reference herein, including any subject matter included by reference in that application.

This application makes reference to technologies described more fully in U.S. patent application Ser. No. 14/539,091, entitled SURFACE ACOUSTIC WAVE DEVICE HAVING END-TO END COMBINABLE SELECTABLE ELECTRODE SUB-ELEMENTS, naming Jordin T. Kare as inventor, filed on Nov. 12, 2014, is related to the present application. That application is incorporated by reference herein, including any subject matter included by reference in that application.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various implementations by which processes and/or systems and/or other technologies described herein can be effected (e.g., hardware, software, and/or firmware), and that the preferred implementation will vary with the context in which the processes and/or systems and/or other technologies are deployed. For example, if an implementer determines that speed and accuracy are paramount, the implementer may opt for a mainly hardware and/or firmware implementation; alternatively, if flexibility is paramount, the implementer may opt for a mainly software implementation; or, yet again alternatively, the implementer may opt for some combination of hardware, software, and/or firmware. Hence, there are several possible implementations by which the processes and/or devices and/or other technologies described herein may be effected, none of which is inherently superior to the other in that any implementation to be utilized is a choice dependent upon the context in which the implementation will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures suitable to implement an operation. Electronic circuitry, for example, may manifest one or more paths of electrical current constructed and arranged to implement various logic functions as described herein. In some implementations, one or more media are configured to bear a device-detectable implementation if such media hold or transmit a special-purpose device instruction set operable to perform as described herein. In some variants, for example, this may manifest as an update or other modification of existing software or firmware, or of gate arrays or other programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or otherwise invoking circuitry for enabling, triggering, coordinating, requesting, or otherwise causing one or more occurrences of any functional operations described below. In some variants, operational or other logical descriptions herein may be expressed directly as source code and compiled or otherwise invoked as an executable instruction sequence. In some contexts, for example, C++ or other code sequences can be compiled directly or otherwise implemented in high-level descriptor languages (e.g., a logic-synthesizable language, a hardware description language, a hardware design simulation, and/or other such similar mode(s) of expression). Alternatively or additionally, some or all of the logical expression may be manifested as a Verilog-type hardware description or other circuitry model before physical implementation in hardware, especially for basic operations or timing-critical applications. Those skilled in the art will recognize how to obtain, configure, and optimize suitable transmission or computational elements, material supplies, actuators, or other common structures in light of these teachings.

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, module, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will also recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Figure 2:
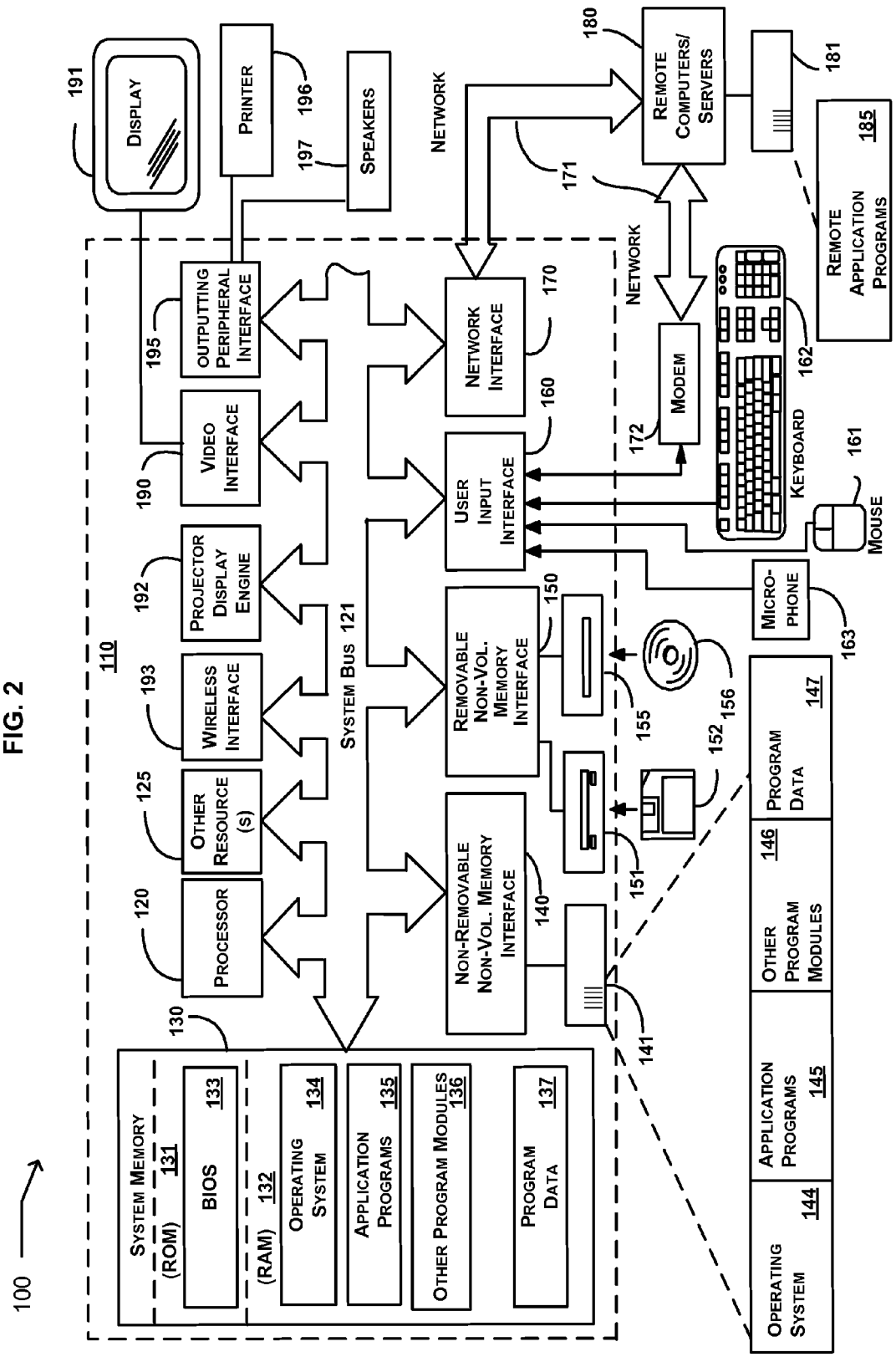
FIG. 2 illustrates an example embodiment of an environment 100 that includes a general-purpose computing system 110 in which embodiments may be implemented.

FIGS. 1 and 2 provide respective general descriptions of several environments in which implementations may be implemented. FIG. 1 is generally directed toward a thin computing environment 19 having a thin computing device 20, and FIG. 2 is generally directed toward a general purpose computing environment 100 having general purpose computing device 110. However, as prices of computer components drop and as capacity and speeds increase, there is not always a bright line between a thin computing device and a general purpose computing device. Further, there is a continuous stream of new ideas and applications for environments benefited by use of computing power. As a result, nothing should be construed to limit disclosed subject matter herein to a specific computing environment unless limited by express language.

FIG. 1 and the following discussion are intended to provide a brief, general description of a thin computing environment 19 in which embodiments may be implemented. FIG. 1 illustrates an example system that includes a thin computing device 20, which may be included or embedded in an electronic device that also includes a device functional element 50. For example, the electronic device may include any item having electrical or electronic components playing a role in a functionality of the item, such as for example, a refrigerator, a car, a digital image acquisition device, a camera, a cable modem, a printer an ultrasound device, an x-ray machine, a non-invasive imaging device, or an airplane. For example, the electronic device may include any item that interfaces with or controls a functional element of the item. In another example, the thin computing device may be included in an implantable medical apparatus or device. In a further example, the thin computing device may be operable to communicate with an implantable or implanted medical apparatus. For example, a thin computing device may include a computing device having limited resources or limited processing capability, such as a limited resource computing device, a wireless communication device, a mobile wireless communication device, a smart phone, an electronic pen, a handheld electronic writing device, a scanner, a cell phone, a smart phone (such as an Android® or iPhone® based device), a tablet device (such as an iPad®) or a Blackberry® device. For example, a thin computing device may include a thin client device or a mobile thin client device, such as a smart phone, tablet, notebook, or desktop hardware configured to function in a virtualized environment.

The thin computing device 20 includes a processing unit 21, a system memory 22, and a system bus 23 that couples various system components including the system memory 22 to the processing unit 21. The system bus 23 may be any of several types of bus structures including a memory bus or memory controller, a peripheral bus, and a local bus using any of a variety of bus architectures. The system memory includes read-only memory (ROM) 24 and random access memory (RAM) 25. A basic input/output system (BIOS) 26, containing the basic routines that help to transfer information between sub-components within the thin computing device 20, such as during start-up, is stored in the ROM 24. A number of program modules may be stored in the ROM 24 or RAM 25, including an operating system 28, one or more application programs 29, other program modules 30 and program data 31.

A user may enter commands and information into the computing device 20 through one or more input interfaces. An input interface may include a touch-sensitive screen or display surface, or one or more switches or buttons with suitable input detection circuitry. A touch-sensitive screen or display surface is illustrated as a touch-sensitive display 32 and screen input detector 33. One or more switches or buttons are illustrated as hardware buttons 44 connected to the system via a hardware button interface 45. The output circuitry of the touch-sensitive display 32 is connected to the system bus 23 via a video driver 37. Other input devices may include a microphone 34 connected through a suitable audio interface 35, or a physical hardware keyboard (not shown). Output devices may include the display 32, or a projector display 36. The system bus 23 also may be connected to other resources 52 that may be accessed and used by the processing unit 21 or by other components of the thin computing device 20.

In addition to the display 32, the computing device 20 may include other peripheral output devices, such as at least one speaker 38. Other external input or output devices 39, such as a joystick, game pad, satellite dish, scanner or the like may be connected to the processing unit 21 through a USB port 40 and USB port interface 41, to the system bus 23. Alternatively, the other external input and output devices 39 may be connected by other interfaces, such as a parallel port, game port or other port. The computing device 20 may further include or be capable of connecting to a flash card memory (not shown) through an appropriate connection port (not shown). The computing device 20 may further include or be capable of connecting with a network through a network port 42 and network interface 43, and through wireless port 46 and corresponding wireless interface 47 may be provided to facilitate communication with other peripheral devices, including other computers, printers, and so on (not shown). It will be appreciated that the various components and connections shown are examples and other components and means of establishing communication links may be used.

The computing device 20 may be primarily designed to include a user interface. The user interface may include a character, a key-based, or another user data input via the touch sensitive display 32. The user interface may include using a stylus (not shown). Moreover, the user interface is not limited to an actual touch-sensitive panel arranged for directly receiving input, but may alternatively or in addition respond to another input device such as the microphone 34. For example, spoken words may be received at the microphone 34 and recognized. Alternatively, the computing device 20 may be designed to include a user interface having a physical keyboard (not shown).

The device functional elements 50 are typically application specific and related to a function of the electronic device, and are coupled with the system bus 23 through an interface (not shown). The functional elements may typically perform a single well-defined task with little or no user configuration or setup, such as a refrigerator keeping food cold, a cell phone connecting with an appropriate tower and transceiving voice or data information, a camera capturing and saving an image, or communicating with an implantable medical apparatus.

In certain instances, one or more elements of the thin computing device 20 may be deemed not necessary and omitted. In other instances, one or more other elements may be deemed necessary and added to the thin computing device.

FIG. 2 and the following discussion are intended to provide a brief, general description of an environment in which embodiments may be implemented. FIG. 2 illustrates an example embodiment of a general-purpose computing system in which embodiments may be implemented, shown as a computing system environment 100. Components of the computing system environment 100 may include, but are not limited to, a general purpose computing device 110 having a processor 120, a system memory 130, and a system bus 121 that couples various system components including the system memory to the processor 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, also known as Mezzanine bus.

The computing system environment 100 typically includes a variety of computer-readable media products. Computer-readable media may include any media that can be accessed by the computing device 110 and include both volatile and nonvolatile media, removable and non-removable media. By way of example, and not of limitation, computer-readable media may include computer storage media. By way of further example, and not of limitation, computer-readable media may include a communication media.

Computer storage media includes volatile and nonvolatile, removable and non-removable media implemented in any method or technology for storage of information such as computer-readable instructions, data structures, program modules, or other data. Computer storage media includes, but is not limited to, random-access memory (RAM), read-only memory (ROM), electrically erasable programmable read-only memory (EEPROM), flash memory, or other memory technology, CD-ROM, digital versatile disks (DVD), or other optical disk storage, magnetic cassettes, magnetic tape, magnetic disk storage, or other magnetic storage devices, or any other medium which can be used to store the desired information and which can be accessed by the computing device 110. In a further embodiment, a computer storage media may include a group of computer storage media devices. In another embodiment, a computer storage media may include an information store. In another embodiment, an information store may include a quantum memory, a photonic quantum memory, or atomic quantum memory. Combinations of any of the above may also be included within the scope of computer-readable media. Computer storage media is a non-transitory computer-readable media.

Communication media may typically embody computer-readable instructions, data structures, program modules, or other data in a modulated data signal such as a carrier wave or other transport mechanism and include any information delivery media. The term "modulated data signal" means a signal that has one or more of its characteristics set or changed in such a manner as to encode information in the signal. By way of example, and not limitation, communications media may include wired media, such as a wired network and a direct-wired connection, and wireless media such as acoustic, RF, optical, and infrared media. Communication media is a transitory computer-readable media.

The system memory 130 includes computer storage media in the form of volatile and nonvolatile memory such as ROM 131 and RAM 132. A RAM may include at least one of a DRAM, an EDO DRAM, a SDRAM, a RDRAM, a VRAM, or a DDR DRAM. A basic input/output system (BIOS) 133, containing the basic routines that help to transfer information between elements within the computing device 110, such as during start-up, is typically stored in ROM 131. RAM 132 typically contains data and program modules that are immediately accessible to or presently being operated on by the processor 120. By way of example, and not limitation, FIG. 2 illustrates an operating system 134, application programs 135, other program modules 136, and program data 137. Often, the operating system 134 offers services to applications programs 135 by way of one or more application programming interfaces (APIs) (not shown). Because the operating system 134 incorporates these services, developers of applications programs 135 need not redevelop code to use the services. Examples of APIs provided by operating systems such as Microsoft's "WINDOWS" ® are well known in the art.

The computing device 110 may also include other removable/non-removable, volatile/nonvolatile computer storage media products. By way of example only, FIG. 2 illustrates a non-removable non-volatile memory interface (hard disk interface) 140 that reads from and writes for example to non-removable, non-volatile magnetic media. FIG. 2 also illustrates a removable non-volatile memory interface 150 that, for example, is coupled to a magnetic disk drive 151 that reads from and writes to a removable, non-volatile magnetic disk 152, or is coupled to an optical disk drive 155 that reads from and writes to a removable, non-volatile optical disk 156, such as a CD ROM. Other removable/non-removable, volatile/non-volatile computer storage media that can be used in the example operating environment include, but are not limited to, magnetic tape cassettes, memory cards, flash memory cards, DVDs, digital video tape, solid state RAM, and solid state ROM. The hard disk drive 141 is typically connected to the system bus 121 through a non-removable memory interface, such as the interface 140, and magnetic disk drive 151 and optical disk drive 155 are typically connected to the system bus 121 by a removable non-volatile memory interface, such as interface 150.

The drives and their associated computer storage media discussed above and illustrated in FIG. 2 provide storage of computer-readable instructions, data structures, program modules, and other data for the computing device 110. In FIG. 2, for example, hard disk drive 141 is illustrated as storing an operating system 144, application programs 145, other program modules 146, and program data 147. Note that these components can either be the same as or different from the operating system 134, application programs 135, other program modules 136, and program data 137. The operating system 144, application programs 145, other program modules 146, and program data 147 are given different numbers here to illustrate that, at a minimum, they are different copies.

A user may enter commands and information into the computing device 110 through input devices such as a microphone 163, keyboard 162, and pointing device 161, commonly referred to as a mouse, trackball, or touch pad. Other input devices (not shown) may include at least one of a touch-sensitive screen or display surface, joystick, game pad, satellite dish, and scanner. These and other input devices are often connected to the processor 120 through a user input interface 160 that is coupled to the system bus, but may be connected by other interface and bus structures, such as a parallel port, game port, or a universal serial bus (USB).

A display 191, such as a monitor or other type of display device or surface may be connected to the system bus 121 via an interface, such as a video interface 190. A projector display engine 192 that includes a projecting element may be coupled to the system bus. In addition to the display, the computing device 110 may also include other peripheral output devices such as speakers 197 and printer 196, which may be connected through an output peripheral interface 195. The system bus 121 also may be connected to other resources 125 that may be accessed and used by the processor unit 120 or by other components of the computing device 110.

The computing system environment 100 may operate in a networked environment using logical connections to one or more remote computers, such as a remote computer 180. The remote computer 180 may be a personal computer, a server, a router, a network PC, a peer device, or other common network node, and typically includes many or all of the elements described above relative to the computing device 110, although only a memory storage device 181 has been illustrated in FIG. 2. The network logical connections depicted in FIG. 2 include a local area network (LAN) and a wide area network (WAN), and may also include other networks such as a personal area network (PAN) (not shown). Such networking environments are commonplace in offices, enterprise-wide computer networks, intranets, and the Internet.

When used in a networking environment, the computing system environment 100 is connected to the network 171 through a network interface, such as the network interface 170, the modem 172, or the wireless interface 193. The network may include a LAN network environment, or a WAN network environment, such as the Internet. In a networked environment, program modules depicted relative to the computing device 110, or portions thereof, may be stored in a remote memory storage device. By way of example, and not limitation, FIG. 2 illustrates remote application programs 185 as residing on memory storage device 181. It will be appreciated that the network connections shown are examples and other means of establishing a communication link between the computers may be used.

In certain instances, one or more elements of the computing device 110 may be deemed not necessary and omitted. In other instances, one or more other elements may be deemed necessary and added to the computing device.

Figure 3:
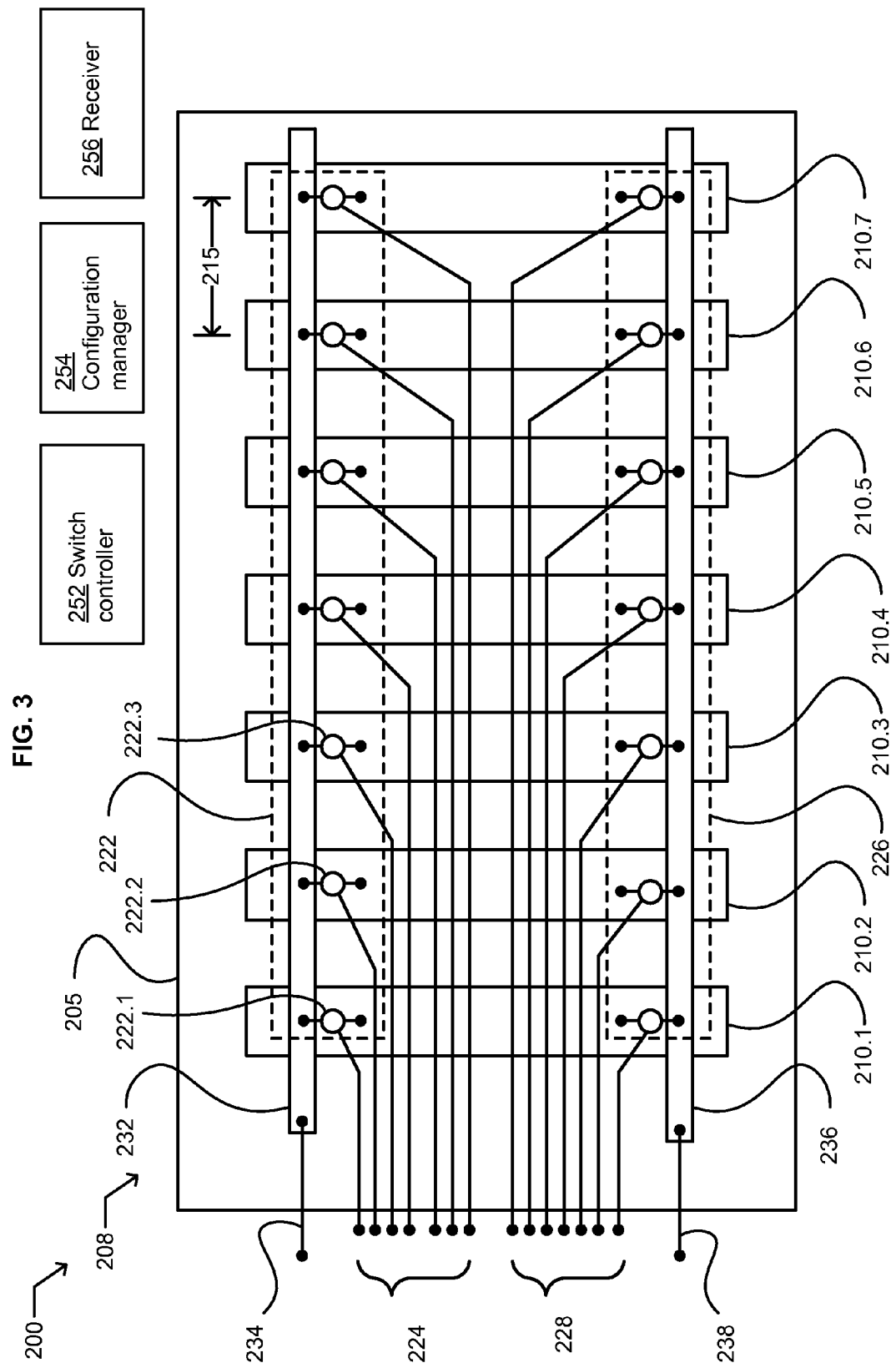
FIG. 3 illustrates a surface acoustic wave device 200.

FIG. 3 illustrates a surface acoustic wave device 200. The surface acoustic wave device includes a piezoelectric substrate 205. In an embodiment, the piezoelectric substrate may include a piezoelectric substrate of a type or structure known to those skilled in the art as useful in fabricating an interdigital transducer or interdigitated transducer, or a resonator. The surface acoustic wave device includes a configurable electrode assembly 208. The configurable electrode assembly including a plurality of spaced-apart elongated electrode elements electromechanically coupled with the piezoelectric substrate. The plurality of elongated electrode elements 210 are illustrated in FIG. 3 as elongated electrode elements 210.1-210.7. The configurable electrode assembly includes a first signal bus 232 proximate to each of the plurality of electrode elements, and electrically isolated therefrom. The configurable electrode assembly includes a first matrix of addressable switches 222. Each addressable switch of the first matrix is configured to electrically couple a respective electrode element of the plurality of electrode elements with the first signal bus. Addressable switches of this document are symbolically illustrated by addressable switches 222.1, 222.2, and 222.3 of the first matrix of addressable switches. Address lines for the first matrix of addressable switches are illustrated by address lines 224. In an alternative embodiment, the address lines 224 describe a first switching bus. The configurable electrode assembly includes a second signal bus 236 proximate to each of the plurality of electrode elements, and electrically isolated therefrom. In an embodiment, the second signal bus may include a ground bus. The configurable electrode assembly includes a second matrix of addressable switches 226. Each addressable switch of the second matrix is configured to electrically couple a respective electrode element of the plurality of electrode elements with the second signal bus. Address lines for the second matrix of addressable switches are illustrated by address lines 228. In an alternative embodiment, the address lines 228 describe a second switching bus. In an embodiment, once programmed or configured, the configurable electrode assembly electromechanically coupled with the piezoelectric substrate may be described as an interdigital transducer or interdigitated transducer. In FIG. 3 and subsequent figures, the same symbol is used for individual addressable switches but no reference number is assigned in the interest of compact prosecution, and their respective address lines are not separately illustrated also in the interest of compact prosecution. In an embodiment, the device is configured as a resonator or a filter, such as with a variable load.

In an embodiment, the elongated electrode elements 210 are applied to the piezoelectric substrate 205. In an embodiment, the elongated electrode elements include a conductive coating applied to the piezoelectric substrate. In an embodiment, the elongated electrode elements are adhered, or pressed on a surface of the piezoelectric substrate. In an embodiment, the elongated electrode elements include thin film elongated electrode elements electromechanically coupled to a surface of the piezoelectric substrate. In an embodiment, the elongated electrode elements are capacitively coupled to a surface of the piezoelectric substrate. In an embodiment, the elongated electrode elements are fabricated on a surface of the piezoelectric substrate. In an embodiment, the elongated electrode elements are deposited on the piezoelectric substrate. In an embodiment, the plurality of elongated electrode elements 210 have a center-to-center transverse spacing 215 of not more than $\lambda/2$ (where the surface wavelength $\lambda$ on the piezoelectric substrate=acoustic wave velocity VSAW/center frequency f0 of the device). In an embodiment, the transverse spacing includes a longitudinal spacing. In an embodiment, a subgroup of the plurality of elongated electrode elements have a center-to-center transverse spacing of not more than $\lambda/4$. In an embodiment, a subgroup of the plurality of elongated electrode elements have a center-to-center transverse spacing of more than $\lambda/4$. In an embodiment, a subgroup of the plurality of elongated electrode elements have a center-to-center transverse spacing of not more than $\lambda/8$.

In an embodiment, each elongated electrode element of the plurality of elongated electrode elements has a width of not more than $\lambda/4$. In an embodiment, the first signal bus is carried by the piezoelectric substrate. In an embodiment, the first signal bus is disposed on the piezoelectric substrate. In an embodiment, the first signal bus crosses each of the plurality of electrode elements. In an embodiment, the second signal bus is carried by the piezoelectric substrate. In an embodiment, the second signal bus is disposed on the piezoelectric substrate. In an embodiment, the second signal bus crosses each of the plurality of electrode elements. In an embodiment, the second signal bus 236 includes a third signal bus. In an embodiment, the second signal bus includes a complementary signal bus. In an embodiment, the third signal bus may include a ground bus.

In an embodiment of the device 200, if the first signal bus 232 is electrically coupled to a first selected electrode element (for example the electrode element 210.1) of the plurality of electrode elements 210 by the respective addressable switches (for example the switch 222.1) of the first matrix 222, and if the second signal bus 236 is electrically coupled to a second selected electrode element (for example the electrode element 210.3) of the plurality of electrode elements by the respective addressable switches of the second matrix 226, the second electrode elements not including the first selected electrode element (i.e., disjoint sets), the configurable electrode assembly 208 has an electrical response to a signal applied across the first signal bus at a first electrical contact 234 and the second signal bus 236 at a second electrical contact 238 that is a function of the first selected electrode element and the second selected electrode element. In an embodiment, an electrical response includes a frequency response, impulse response, or impedance as a function of signal frequency. In another embodiment, the first selected electrode element includes electrode elements 210.1 and 210.5, and the second selected electrode element includes electrode elements 210.3 and 210.7. In an embodiment, the configurable electrode assembly is configured to generate mechanical or acoustic strain in the substrate in response to an electrical signal applied across the first signal bus and the second input signal bus. In an embodiment, an addressable switch of the first matrix of addressable switches or of the second matrix of addressable switches includes a switch having at least two on states. In an embodiment, the switch having at least two on states includes a switch having a variable or selectable attenuation. For example, the variable or selectable attenuation may be provided by two or more different resistance settings.

In an embodiment of the device 200, an addressable switch of the first matrix of addressable switches 222 or the second matrix of addressable switches 226 includes a semiconductor switch. In an embodiment, an addressable switch includes a floating-gate transistor. In an embodiment, an addressable switch includes a memory cell architecture having a floating-gate transistor. In an embodiment, the first matrix of addressable switches and the second matrix of addressable switches are included in a device having addressable memory elements. Each addressable memory element configured to electrically couple a respective electrode sub-element with the first signal bus or the second signal bus. In an embodiment, the device having addressable memory elements includes a flash device having addressable MOSFET transistor switches. Each addressable MOSFET transistor switch configured to electrically couple a respective electrode sub-element with the first signal bus or the second signal bus. In an embodiment, the flash device includes two or more flash devices. In an embodiment, an addressable switch of the first matrix of addressable switches or the second matrix of addressable switches includes a MEMS device. In an embodiment, an addressable switch of the first matrix of addressable switches or the second matrix of addressable switches includes a refreshable CMOS device. In an embodiment, an addressable switch of the first matrix of addressable switches or the second matrix of addressable switches includes a one-time programmable switch. In an embodiment, the one-time programmable switch includes a fuse or an antifuse programmable switch. In an embodiment, an addressable switch of the first matrix of addressable switches or the second matrix of addressable switches includes a reprogrammable switch. For example, the individual switches may be one-time settable (either opening or closing), bulk resettable, or individually toggleable (i.e. can be turned on or off). For example, the individual switches may be controlled by a memory device that may have the one-time settable (either opening or closing), bulk resettable, or individually toggleable properties. In an embodiment, an addressable switch of the first matrix of addressable switches or the second matrix of addressable switches includes a diode or a diode bridge. In an embodiment, an addressable switch of the first matrix of addressable switches or the second matrix of addressable switches includes a randomly accessible switch. In an embodiment, an addressable switch of the first matrix of addressable switches or the second matrix of addressable switches is addressable by application of a switching signal across an address line of the switch and a signal bus coupled to the individual addressable switch. For example, the switching signal may include a DC voltage. For example, the switching signal may include a voltage pulse. In an embodiment, the first matrix of addressable switches or the second matrix of addressable switches includes coupled cells that are coupled with a memory array and are configured to be changed in a single operation. For example, the memory array may include a double buffered or a ping-pong buffered memory array.

In an embodiment, the first matrix of addressable switches 222 and the second matrix of addressable switches 226 are configured to be collectively switched between a first arbitrary state and a second arbitrary state in less than one-tenth of a second. In an embodiment, the first matrix of addressable switches and the second matrix of addressable switches are configured to be collectively switched between a first arbitrary state and a second arbitrary state in less than one-hundredth of a second. In an embodiment, the first matrix of addressable switches and the second matrix of addressable switches are configured to be collectively switched between a first arbitrary state and a second arbitrary state in less than one millisecond. In an embodiment, the first matrix of addressable switches and the second matrix of addressable switches are configured to be collectively switched between a first arbitrary state and a second arbitrary state in less than one microsecond.

In an embodiment, the configurable electrode assembly 208 includes a reconfigurable electrode assembly. In an embodiment, the configurable electrode assembly includes a one-time configurable electrode assembly. In an embodiment, the configurable electrode assembly includes a programmable, configurable electrode assembly.

In an embodiment, the device 200 includes a switch controller 252 configured to operate an addressable switch of the first matrix of addressable switches 222 and an addressable switch of the second matrix of addressable switches 226. In an embodiment, the switch controller includes a first switch controller configured to operate an addressable switch of the first matrix of addressable switches and a second first switch controller configured to operate an addressable switch of the second matrix of addressable switches.

In an embodiment, the device 200 includes a configuration manager 254. The configuration manager is configured to (i) receive a request for a device parameter or sensitivity of the acoustic wave device, and (ii) select settings of the first and second matrices of addressable switches of the configurable electrode assembly 208 implementing the requested device parameter or sensitivity. In an embodiment, the request includes a request for an arbitrary device parameter or sensitivity of the device. In an embodiment, the request for a device parameter or sensitivity includes at least one of a requested center frequency $f_0$, bandwidth, or transfer function.

In an embodiment, the (ii) select settings includes (a) select an electrode pattern predicted to produce the requested device parameter or sensitivity and (b) select settings of the first and second matrices of addressable switches of the configurable electrode assembly implementing the selected electrode pattern in the electrode sub-elements. In an embodiment, the electrode pattern is selected responsive to the requested device parameter or sensitivity of the device and at least one or more optimization parameters. For example, the optimization parameters may include optimization parameters stored by the device, or may be specified in the received request. In an embodiment, the select an electrode pattern includes select an optimized electrode pattern predicted to produce the requested device parameter or sensitivity. In an embodiment, the (ii) select settings includes select the settings in response to a feedback loop monitoring a performance by the configurable electrode assembly with respect to the requested device parameter or sensitivity, implementing a change in the settings of the first and second matrices of addressable switches in response to the monitored performance, and then evaluating the performance by the configurable electrode assembly with the changed settings with respect to the requested device parameter or sensitivity. For example, the feedback loop may be a real time feedback loop. In an embodiment, the configuration manager may be implemented in part or in whole using the processing unit 21 and one or more components of the thin computing device 20 described in conjunction with FIG. 1, or the processor 120 and one or more components of the general purpose computing device 100 described in conjunction with FIG. 2. In an embodiment, the device 200 includes a receiver 256 configured to receive a request for an surface acoustic wave characteristic.

In an embodiment, the device 200 includes a receiver 256 configured to receive a request for a device parameter or sensitivity of the device. In an embodiment, the request for a device parameter or sensitivity includes a requested frequency response. For example, the request may use a curve or parametric format. In an embodiment, the request for a device parameter or sensitivity includes a requested impulse response. In an embodiment, the request for a device parameter or sensitivity includes a requested amplitude or phase response. In an embodiment, the request for a device parameter or sensitivity includes requested finger positions, spacings, or widths. In an embodiment, the request for a device parameter or sensitivity includes a request for a selected electrode pattern in the electrode elements. In an embodiment, the request for a device parameter or sensitivity includes requested settings of the first and second matrices of addressable switches of the configurable electrode assembly implementing a selected electrode pattern in the electrode elements. In an embodiment, the request includes a request for a stored electrode pattern. In an embodiment, the receiver is further configured to store the request for a selected electrode pattern in the electrode elements.

In an embodiment, the piezoelectric substrate 205 includes a second interdigitated transducer and a third interdigitated transducer. In an embodiment, the acoustic surface wave device 200 is located on the piezoelectric substrate in a surface acoustic wave propagation pathway between the second interdigitated transducer and the third interdigitated transducer.

For example, in an embodiment, the acoustic surface wave device 200 may be used as a one-port resonator, or as an intermediate filter structures. In these uses, the acoustic surface wave device functions as a passive (not connected to an input or output) element that reflects or absorbs with a particular frequency response.

In an embodiment, an "arbitrary" selection or action includes at a person or a machine's discretion rather than according to a standard. In an embodiment, an "arbitrary" selection or action includes at a person or a machine's choice or preference. In an embodiment, an "arbitrary" selection or action includes a selection or an action within an acceptable range. In an embodiment, an "arbitrary" selection of a database may include selecting one or more databases from a universe of known databases.

Figure 4:
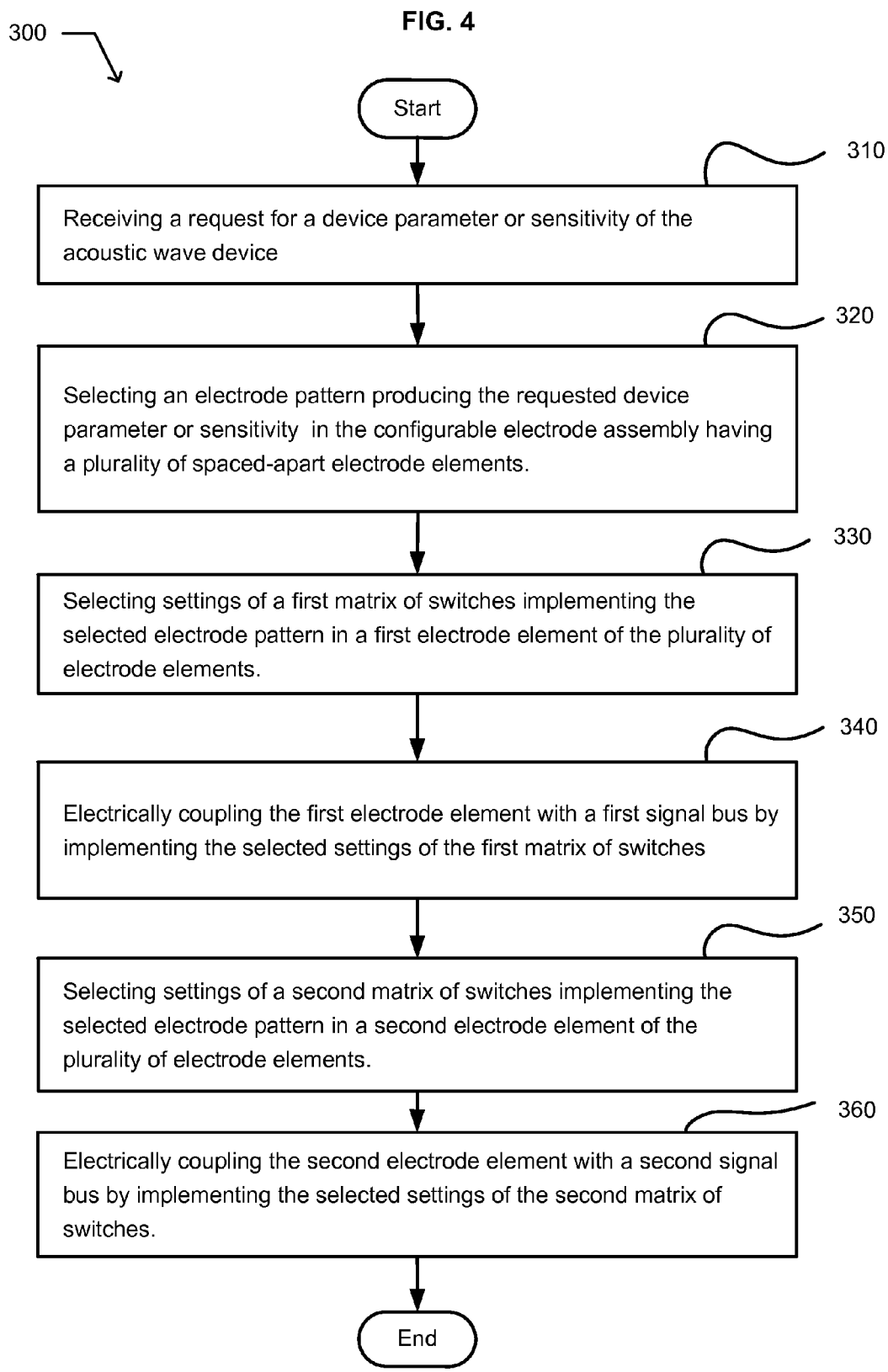
FIG. 4 illustrates an example operational flow 300.

FIG. 4 illustrates an example operational flow 300 implemented in a configurable electrode assembly of a surface acoustic wave device. After a start operation, the operational flow includes a reception operation 310. The reception operation includes receiving a request for a device parameter or sensitivity of the acoustic wave device. In an embodiment, the reception operation may be implemented using the receiver 256 described in conjunction with FIG. 3. A configuration operation 320 includes selecting an electrode pattern producing the requested device parameter or sensitivity in the configurable electrode. The configurable electrode assembly including a plurality of spaced-apart electrode elements. In an embodiment, the configurable electrode assembly includes a plurality of spaced-apart elongated electrode elements electromechanically coupled with a piezoelectric substrate. In an embodiment, the selecting may include selecting an optimized electrode pattern predicted to produce the surface acoustic wave characteristic in a configurable electrode assembly. In an embodiment, the configuration operation may be implemented using the configuration manager 254 described in conjunction with FIG. 3. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first choosing operation 330 includes selecting settings of a first matrix of switches implementing the selected electrode pattern in a first electrode element of the plurality of electrode elements. Each switch is configured to electrically couple a respective electrode element of the electrode elements with a first signal bus. In an embodiment, the first matrix of switches includes a first matrix of addressable switches. In an embodiment, the first choosing operation may be implemented using the configuration manager 254 described in conjunction with FIG. 3. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first implementing operation 340 includes electrically coupling the first electrode element with a first signal bus by implementing the selected settings of the first matrix of switches. In an embodiment, the first implementing operation may be implemented using the switch controller 252 described in conjunction with FIG. 3. A second choosing operation 350 includes selecting settings of a second matrix of switches implementing the selected electrode pattern in a second electrode element of the plurality of electrode elements. In an embodiment, each switch is configured to electrically couple a respective electrode element of the electrode elements with a second signal bus. In an embodiment, the second matrix of switches includes a second matrix of addressable switches. In an embodiment, the second choosing operation may be implemented using the configuration manager 254 described in conjunction with FIG. 3. In an embodiment, the second choosing operation may be further implemented in part or in whole using the processing unit 21 and one or more components of the thin computing device 20 described in conjunction with FIG. 1, or the processor 1200 and one or more components of the general purpose computing device 100 described in conjunction with FIG. 2. A second implementing operation 360 includes electrically coupling the second electrode element with a second signal bus by implementing the selected settings of the second matrix of switches. In an embodiment, the second implementing operation may be implemented using the switch controller 252 described in conjunction with FIG. 3. The operational flow includes an end operation.

In an embodiment, the reception operation 310 includes receiving a request for a device parameter or sensitivity includes at least one of a requested center frequency $f_0$ or bandwidth. In an embodiment, the reception operation includes receiving a request for an arbitrary device parameter or sensitivity.

In an embodiment, the operational flow 300 includes applying an input signal across the first signal bus and the second signal bus, and initiating surface acoustic waves on the piezoelectric substrate having amplitude or phase characteristics that are a function of the first electrode element and the second electrode element.

In an embodiment of the configuration operation 320, the plurality of electrode elements have a center-to-center transverse spacing of not more than $\lambda/2$ (where the surface wavelength $\lambda$ on the piezoelectric substrate=acoustic wave velocity $V_{SAW}$/center frequency $f_0$ of the device). In an embodiment, each electrode element has a width of not more than $\lambda/4$.

Figure 5:
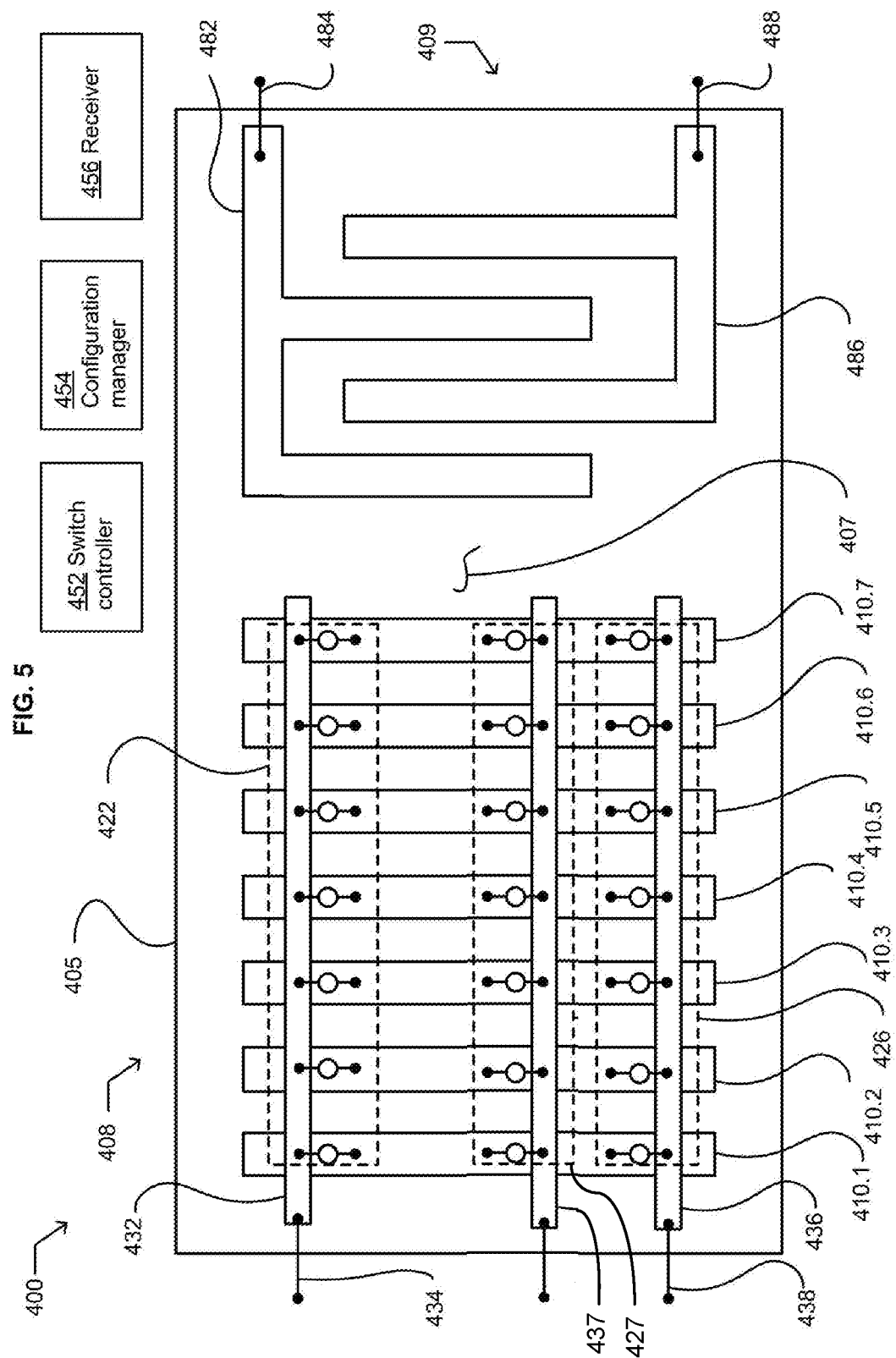
FIG. 5 illustrates a surface acoustic wave device 400.

FIG. 5 illustrates a surface acoustic wave device 400. The surface acoustic wave device includes a piezoelectric substrate 405. The surface acoustic wave device includes an input electrode assembly and an output electrode assembly. In an embodiment, once programmed or configured, the input electrode assembly electromechanically coupled with the piezoelectric substrate may be described as an input interdigital transducer. In an embodiment, once programmed or configured, the output electrode assembly electromechanically coupled with the piezoelectric substrate may be described as an output interdigital transducer. The surface acoustic wave device includes a surface wave propagating region 407 of the piezoelectric substrate. In an embodiment, the surface wave propagating region is located in a propagation path between the input electrode assembly and the output electrode assembly.

The surface acoustic wave device 400 includes a configurable electrode assembly 408 and another electrode assembly, illustrated by a fixed electrode assembly 409. In the surface acoustic wave device, the input electrode assembly or the output electrode assembly includes the configurable electrode assembly. In an embodiment, the another electrode assembly may include another configurable electrode assembly or a fixed electrode assembly. A fixed electrode assembly is illustrated by a first fixed electrode 482, illustrated in an embodiment with a first electrical contact 484, and a second fixed electrode 486, illustrated in an embodiment with a second electrical contact 488. The configurable electrode assembly 408 includes a plurality of spaced-apart elongated electrode elements 410 electromechanically coupled with the piezoelectric substrate 405. The plurality of spaced-apart elongated electrode elements 410 are illustrated by electrode elements 410.1-410.7. The configurable electrode assembly includes a first signal bus 432 proximate to each of the plurality of electrode elements, and electrically isolated therefrom. In an embodiment, an electrical contact 434 is coupled to the first signal bus. The configurable electrode assembly includes a first matrix of addressable switches 422. Each addressable switch of the first matrix of addressable switches is configured to electrically couple a respective electrode element of the plurality of electrode elements with the first signal bus. The configurable electrode assembly includes a second signal bus 436 proximate to each of the plurality of electrode elements, and electrically isolated therefrom. In an embodiment, a second electrical contact 438 is coupled to the second signal bus. The configurable electrode assembly includes a second matrix of addressable switches 426. Each addressable switch of the second matrix of addressable switches is configured to electrically couple a respective electrode element of the plurality of electrode elements with the second signal bus.

In an embodiment, the surface acoustic wave device 400 includes a Rayleigh surface acoustic wave device. In an embodiment, the surface acoustic wave device includes a pseudo surface acoustic wave device. For example, a pseudo surface acoustic wave device may include a leaky SAW device, surface skimming bulk wave device, or a surface transverse wave device.

In an embodiment of the device 400, if the input electrode assembly includes the configurable electrode assembly, if the first signal bus 432 is electrically coupled to a first selected electrode element (for example the electrode element 410.1) of the plurality of electrode elements 410 by the respective addressable switches of the first matrix 422, and if the second signal bus 436 is electrically coupled to a second selected electrode element (for example the electrode element 410.3) of the plurality of electrode elements by the respective addressable switches of the second matrix 426, the second electrode elements not including the first selected electrode element (i.e., disjoint sets), the input electrode assembly is configured in response to an input signal applied across the first signal bus at the first electrical contact 434 and the second signal bus at the second electrical contact 438 to initiate surface waves on the piezoelectric substrate 405 having amplitude or phase characteristics that are a function of the first selected electrode element and the second selected electrode element. In another embodiment, the first selected electrode element includes electrode elements 410.1 and 410.5, and the second selected electrode element includes electrode elements 410.3 and 410.7. In an embodiment, the input electrode assembly is configured to generate mechanical strain in the substrate in response to electrical signals applied across the first input signal bus and the second input signal bus. In an embodiment, the input generated mechanical strain is a function of the first selected electrode element and the second selected electrode element.

In an embodiment of the device 400, if the output electrode assembly includes the configurable electrode assembly, if the first signal bus 432 is electrically coupled to a first selected electrode element (for example the electrode element 410.1) of the plurality of electrode elements 410 by the respective addressable switches of the first matrix 422, and if the second signal bus 436 is electrically coupled to a second selected electrode element (for example the electrode element 410.3) of the plurality of electrode elements by the respective addressable switches of the second matrix 426, the second electrode elements not including the first selected electrode element (i.e., disjoint sets), the output electrode assembly is configured to receive a surface acoustic wave initiated by the input electrode assembly and generate an electrical signal across the first signal bus and the second signal bus in response thereto. The generated electrical signal having amplitude or phase characteristics that are a function of the first selected electrode element and the second selected electrode element. In an embodiment, the output electrode assembly is configured to generate electrical signals in response to mechanical or acoustic strain in the substrate. In an embodiment, the generated electrical signal is a function of a response of the first selected electrode element and the second selected electrode element to the mechanical strain in the substrate.

In an embodiment, the plurality of electrode elements 410 have a center-to-center transverse spacing of not more than $\lambda/2$ (where the surface wavelength $\lambda$ on the piezoelectric substrate=acoustic wave velocity $V_{SAW}$/center frequency $f_0$ of the device). In an embodiment, each electrode element has a width of not more than $\lambda/4$.

In an embodiment, a switch of the first matrix of addressable switches 422 or the second matrix of addressable switches 426 includes a semiconductor switch. In an embodiment, a switch of the first matrix of addressable switches or the second matrix of addressable switches includes a floating-gate transistor. In an embodiment, the switches of the first matrix of addressable switches and the second matrix of addressable switches are included in a flash device having addressable MOSFET transistor switches. Each addressable MOSFET transistor switch is configured to electrically couple a respective input electrode sub-element with the first input signal bus or the second input signal bus. In an embodiment, the first matrix of addressable switches and the second matrix of addressable switches are included in a device having addressable memory elements. Each addressable memory element is configured to electrically couple a respective input electrode sub-element with the first input signal bus or the second input signal bus. In an embodiment, a switch of the first matrix of addressable switches or the second matrix of addressable switches includes a MEMS device. In an embodiment, a switch of the first matrix of addressable switches or the second matrix of addressable switches includes a refreshable CMOS device. In an embodiment, a switch of the first matrix of addressable switches or the second matrix of addressable switches includes a one-time programmable switch. In an embodiment, a switch of the first matrix of addressable switches or the second matrix of addressable switches includes a randomly accessible switch. In an embodiment, a switch of the first matrix of addressable switches or the second matrix of addressable switches includes a programmable switch.

In an embodiment, the input electrode assembly includes a first instance of the configurable electrode assembly 408 and the output electrode assembly includes a second instance of the configurable electrode assembly 408. In an embodiment, the input electrode assembly includes the configurable electrode assembly 408 and the output electrode assembly includes a static electrode assembly 480. In an embodiment, the input electrode assembly includes static electrode assembly and the output electrode assembly includes the configurable electrode assembly.

In an embodiment, the input electrode assembly has an input center frequency $f_{iO}$ and the output electrode assembly has an output center frequency $f_{oO}$. In an embodiment, input center frequency $f_{iO}$ and the output center frequency $f_{oO}$ are substantially identical. In an embodiment, the input center frequency $f_{iO}$ and the output center frequency $f_{oO}$ are not substantially identical.

In an embodiment, the configurable electrode assembly 408 includes a switch controller 452 configured to operate an addressable switch of the first matrix of addressable switches 422 and an addressable switch of the second matrix of addressable switches 426. In an embodiment, the switch controller is fabricated on the substrate 405. In an embodiment, the switch controller is configured to operate an addressable switch of the first matrix of matrix of addressable switches and an addressable switch of the second matrix of matrix of addressable switches in response to a signal specifying switch settings selected to implement a device characteristic. In an embodiment, the device characteristic includes at least one of a requested center frequency $f_0$, bandwidth or passband width, impulse response, or transfer function. In an embodiment, a transfer function may include a specified amplitude and/or phase response to an applied signal, and it may be a nonlinear phase or a nonsymetric amplitude response around the center frequency $f_0$. In an embodiment, the switch controller is configured to initiate a permanent one-time programming of a switch of the first matrix of addressable switches and of a switch of the second matrix of addressable switches. For example, a one-time programmable switch may include an OTP NVM, ROM, PROM or FPROM one-time programmable switch. In an embodiment, the switch controller is configured to initiate a state change (conducting state) (non-conducting state) of a switch of the first matrix of addressable switches and of a switch of the second matrix of addressable switches.

In an embodiment, the device 400 includes the switch controller 452 coupled to an addressable switch of the first matrix of addressable switches 422 and an addressable switch of the second matrix of addressable switches 426 of the configurable electrode assembly 408.

In an embodiment, the device 400 includes a configuration manager 454 configured to (i) receive a request for a device characteristic, and (ii) select settings of the first and second matrices of addressable switches of the configurable electrode assembly implementing the requested device characteristic. In an embodiment, the requested device characteristic may include a requested filter characteristic. In an embodiment, the request for device characteristic includes a request for an amplitude or phase response by the surface acoustic wave device. In an embodiment, the device characteristic includes an arbitrary device characteristic. In an embodiment, the acoustic wave transfer function includes at least one of a requested center frequency $f_0$, bandwidth, impulse response, or transfer function. In an embodiment, the (ii) select settings includes (a) select an electrode pattern predicted to produce the device characteristic and (b) select settings of the first and second matrices of addressable switches implementing the selected electrode pattern in the electrode elements. In an embodiment, the (ii) select settings includes (a) select an optimized electrode pattern to produce the device characteristic and (b) select settings of the first and second matrices of addressable switches implementing the selected optimized electrode pattern in the input electrode elements. In an embodiment, the electrode pattern is selected responsive to the requested device parameter or sensitivity of the device and at least one or more optimization parameters.

In an embodiment, the device 400 includes the configuration manager 454 configured to (i) receive a request for a device characteristic, and (ii) select settings of the first and second matrices of addressable switches of the configurable electrode assembly implementing the requested device characteristic.

In an embodiment, the configurable electrode assembly 408 includes a third signal bus 437 proximate to each electrode element of the plurality of electrode elements, and electrically isolated therefrom; and a third matrix of addressable switches 427. Each addressable switch of the third matrix of addressable switches 427 is configured to electrically couple a respective electrode element 410 of the plurality of electrode elements with the third signal bus 437.

In an embodiment, the device 400 includes the switch controller 452 configured to operate an addressable switch of the first matrix of addressable switches, an addressable switch of the second matrix of addressable switches, and an addressable switch of the third matrix of addressable switches.

In an embodiment, the device 400 includes a receiver 456 configured to receive a request for a device characteristic. In an embodiment, the request for a device characteristic includes an amplitude or phase response. In an embodiment, the request for a device characteristic includes a requested frequency response. In an embodiment, the request for a device characteristic includes a requested impulse response. In an embodiment, the request for a device characteristic includes requested finger positions, length, spacing, or width. In an embodiment, the request for a device characteristic includes a request for a selected electrode pattern in the electrode elements. In an embodiment, the request for a device characteristic includes requested settings of the first and second matrices of addressable switches of the configurable electrode assembly implementing a selected electrode pattern in the electrode sub-elements. In an embodiment, the request for a device characteristic includes a request for a stored electrode pattern. In an embodiment, the receiver is further configured to store the request for a device characteristic.

Figure 6:
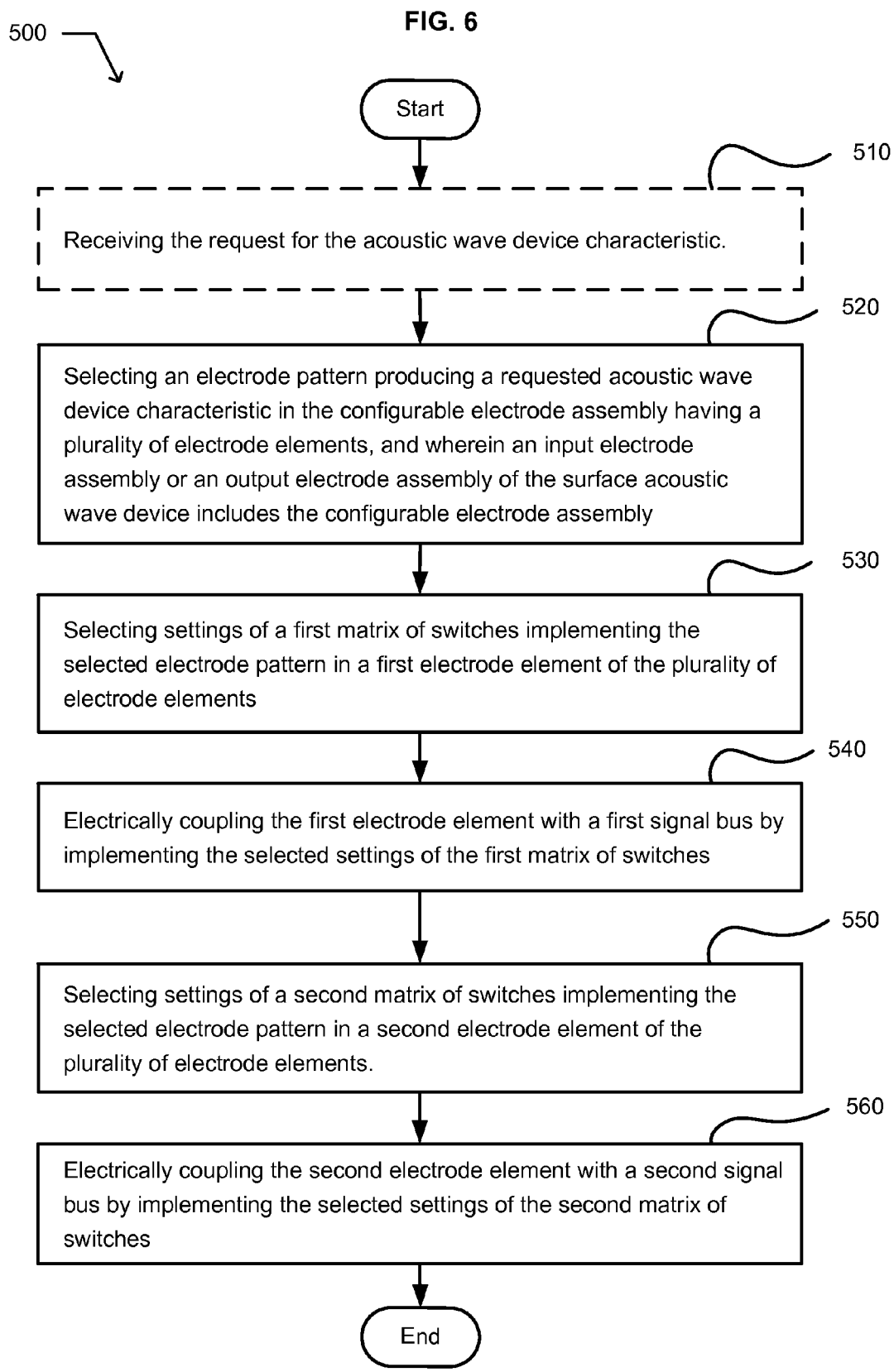
FIG. 6 illustrates an example operational flow 500 implemented in a configurable electrode assembly of a surface acoustic wave device.

FIG. 6 illustrates an example operational flow 500 implemented in a configurable electrode assembly of a surface acoustic wave device. After a start operation, the operational flow includes a configuration operation 520. The configuration operation includes selecting an electrode pattern producing a requested acoustic wave device characteristic in the configurable electrode assembly having a plurality of electrode elements, and wherein an input electrode assembly or an output electrode assembly of the surface acoustic wave device includes the configurable electrode assembly. In an embodiment, the configurable electrode assembly includes a plurality of spaced-apart elongated electrode elements electromechanically coupled with a piezoelectric substrate. In an embodiment, the selecting may include selecting an optimized electrode pattern predicted to produce the surface acoustic wave characteristic in a configurable electrode assembly. In an embodiment, the configuration operation may be implemented using the configuration manager 454 described in conjunction with FIG. 5. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first choosing operation 530 includes selecting settings of a first matrix of switches implementing the selected electrode pattern in a first electrode element of the plurality of electrode elements. In an embodiment, each switch is configured to electrically couple a respective electrode element of the plurality of electrode elements with a first signal bus. In an embodiment, the first matrix of switches includes a first matrix of addressable switches. In an embodiment, the first choosing operation may be implemented using the configuration manager 454 described in conjunction with FIG. 5. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first implementing operation 540 includes electrically coupling the first electrode element with a first signal bus by implementing the selected settings of the first matrix of switches. In an embodiment, the first implementing operation may be implemented using the switch controller 452 described in conjunction with FIG. 5. A second choosing operation 550 includes selecting settings of a second matrix of switches implementing the selected electrode pattern in a second electrode element of the plurality of electrode elements. In an embodiment, each switch is configured to electrically couple a respective electrode element of the electrode elements with a second signal bus. In an embodiment, the second matrix of switches includes a second matrix of addressable switches. In an embodiment, the second choosing operation may be implemented using the configuration manager 454 described in conjunction with FIG. 5. In an embodiment, the second choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A second implementing operation 560 includes electrically coupling the second electrode element with a second signal bus by implementing the selected settings of the second matrix of switches. In an embodiment, the second implementing operation may be implemented using the switch controller 452 described in conjunction with FIG. 5. The operational flow includes an end operation.

In an embodiment, the operational flow 500 includes a reception operation 510. The reception operation includes receiving the request for the acoustic wave device characteristic. In an embodiment, the reception operation may be implemented using the receiver 456 described in conjunction with FIG. 5. In an embodiment, the receiving a request includes receiving a request for an arbitrary device characteristic. For example, the arbitrary device characteristic may include at least one of a requested center frequency $f_0$, bandwidth, or transfer function.

In an embodiment, if the input electrode assembly includes the configurable electrode assembly, the operational flow 500 includes applying an input signal across the first signal bus and the second signal bus, and initiating surface waves on the piezoelectric substrate having amplitude or phase characteristics that are a function of the first electrode element and the second electrode element.

In an embodiment, if the output electrode assembly includes the configurable electrode assembly, the operational flow 500 includes receiving a surface acoustic wave initiated by the input electrode assembly and generating an electrical signal in response thereto. The generated electrical signal having amplitude or phase characteristics that are a function of the first electrode element and the second electrode element.

In an embodiment, the configuration operation 520 includes selecting an optimized electrode pattern known or predicted to produce the device characteristic in a configurable electrode assembly of a surface wave device. In an embodiment, the surface wave device includes an input electrode assembly and an output electrode assembly. In an embodiment, plurality of electrode elements have a center-to-center transverse spacing of not more than $\lambda/2$ (where the surface wavelength $\lambda$ on the piezoelectric substrate=acoustic wave velocity $V_{SAW}$/center frequency $f_0$ of the device).

Figure 7:
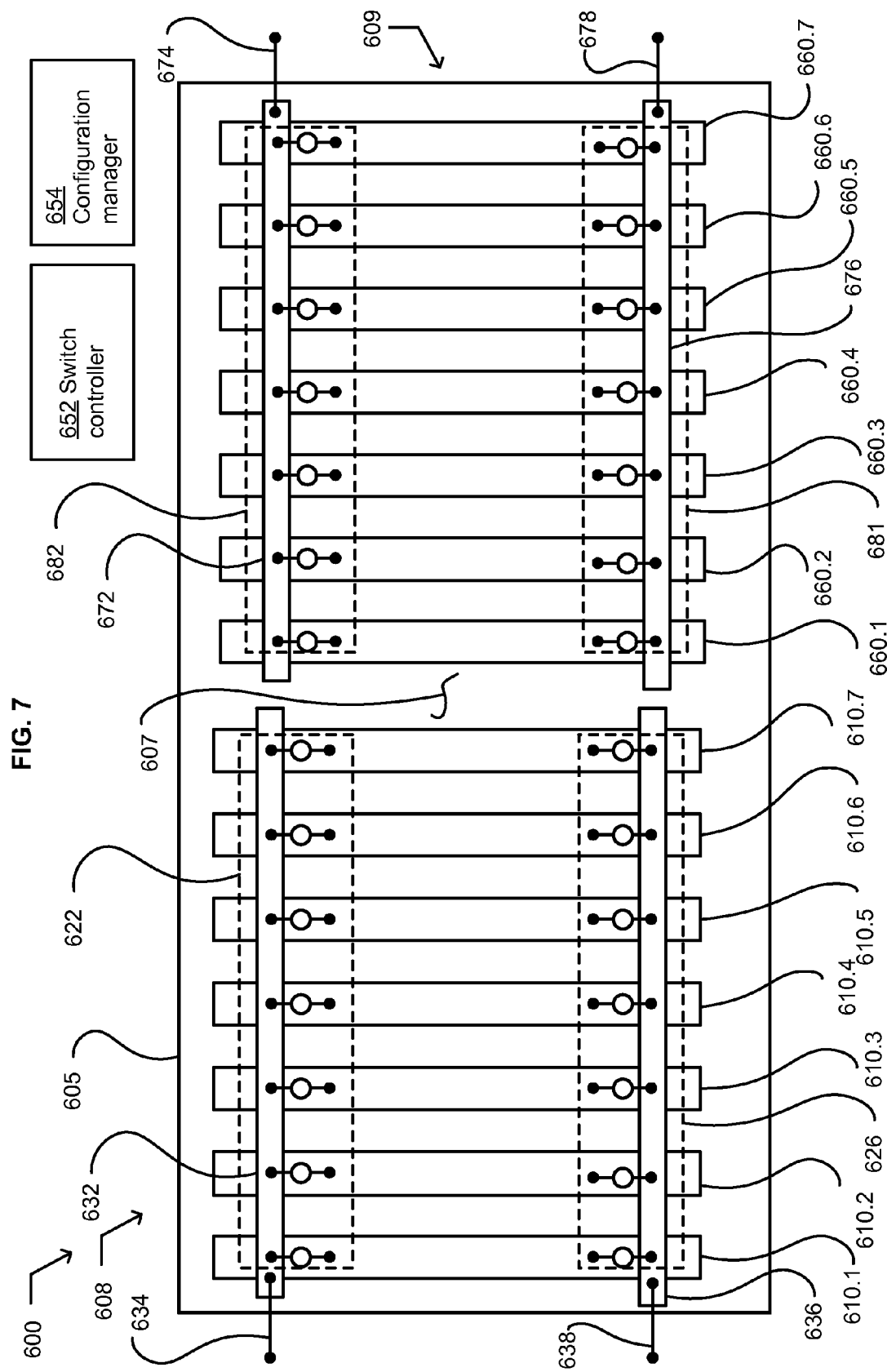
FIG. 7 illustrates an example surface wave device 600.

FIG. 7 illustrates an example surface wave device 600. The surface wave device includes a piezoelectric substrate 605. In an embodiment, the piezoelectric substrate may include a piezoelectric substrate of a type or structure known to those skilled in the art as useful in fabricating an interdigital transducer or interdigitated transducer, or a resonator. The surface wave device includes an input electrode assembly 608. The input electrode assembly includes a plurality of spaced-apart elongated input electrode elements 610 electromechanically coupled with the piezoelectric substrate. The plurality of elongated input electrode elements are illustrated as elongated input electrode elements 610.1-610.7. The input electrode assembly includes a first input signal bus 632 proximate to each of the plurality of input electrode elements, and electrically isolated therefrom. The input electrode assembly includes a first input-matrix of addressable switches 622. Each addressable switch of the first input-matrix is configured to electrically couple a respective input electrode element of the plurality of input electrode elements with the first input signal bus. The input electrode assembly includes a second input signal bus 636 proximate to each of the plurality of input electrode elements, and electrically isolated therefrom. The input electrode assembly includes a second input-matrix of addressable switches 626. Each addressable switch of the second input-matrix is configured to electrically couple a respective input electrode element of the plurality of input electrode elements with the second input signal bus.

The surface wave device includes an output electrode assembly 609. The output electrode assembly includes a plurality of spaced-apart elongated output electrode elements 660 electromechanically coupled with the piezoelectric substrate. The plurality of elongated output electrode elements are illustrated as elongated output electrode elements 660.1-660.7. The output electrode assembly includes a first output signal bus 672 proximate to each of the plurality of output electrode elements, and electrically isolated therefrom. The output electrode assembly includes a first output-matrix of individually addressable switches 682. Each addressable switch of the first output-matrix is configured to electrically couple a respective output electrode element of the plurality of output electrode elements with the first output signal bus. The output electrode assembly includes a second output signal bus 676 proximate to each of the plurality of output electrode elements, and electrically isolated therefrom. The output electrode assembly includes a second output-matrix of individually addressable switches 681. Each addressable switch of the second output-matrix is configured to electrically couple a respective output electrode element of the plurality of output electrode elements with the second output signal bus.

In an embodiment of the device 600, if the first input signal bus 632 is electrically coupled to a first selected input electrode element (for example the input electrode element 610.1) of the plurality of input electrode elements 610 by the respective addressable switches of the first input-matrix 622, and if the second input signal bus 636 is electrically coupled to a second input electrode element (for example the input electrode element 610.3) of the plurality of input electrode elements by the respective addressable switches of the second input-matrix 626, the second selected input electrode elements not including the first selected input electrode elements (i.e., disjoint sets), the input electrode assembly 608 is configured to initiate in response to an input signal applied across the first input signal bus at the first electrical contact 634 and the second input signal bus at the second electrical contact 638 surface waves on the piezoelectric substrate 607 having amplitude or phase characteristics that are a function of the first selected input electrode element and the second selected input electrode element. In an embodiment, the first selected input electrode element includes input electrode elements 610.1 and 610.5, and the second selected input electrode element includes input electrode elements 610.3 and 610.7.

In an embodiment of the device 600, if the first output signal bus 672 is electrically coupled to a first selected output electrode element (for example the output electrode element 660.1) of the plurality of output electrode elements 660 by the respective addressable switches of the first output-matrix 682, and if the second output signal bus 676 is electrically coupled to a second selected output electrode element (for example the output electrode element 660.3) of the plurality of output electrode elements 660 by the respective addressable switches of the second output-matrix 681, the second selected output electrode element not including the first selected output electrode element, the output electrode assembly is configured to receive a surface acoustic wave initiated by the input electrode assembly 608 and generate an electrical signal in response thereto. The generated electrical signal having amplitude or phase characteristics that are a function of the first selected output electrode elements and the second selected output electrode elements. In an embodiment, the first selected output electrode element includes output electrode elements 660.1 and 650.5, and the second selected output electrode element includes output electrode elements 660.3 and 660.7.

In an embodiment, the plurality of spaced-apart elongated input electrode elements 610 have a center-to-center transverse spacing of not more than $\lambda/2$ (where the surface wavelength $\lambda$ on the piezoelectric substrate=acoustic wave velocity $V_{SAW}$/center frequency $f_0$ of the device). In an embodiment, the plurality of spaced-apart elongated output electrode elements 660 have a center-to-center transverse spacing of not more than $\lambda/2$.

Figure 8:
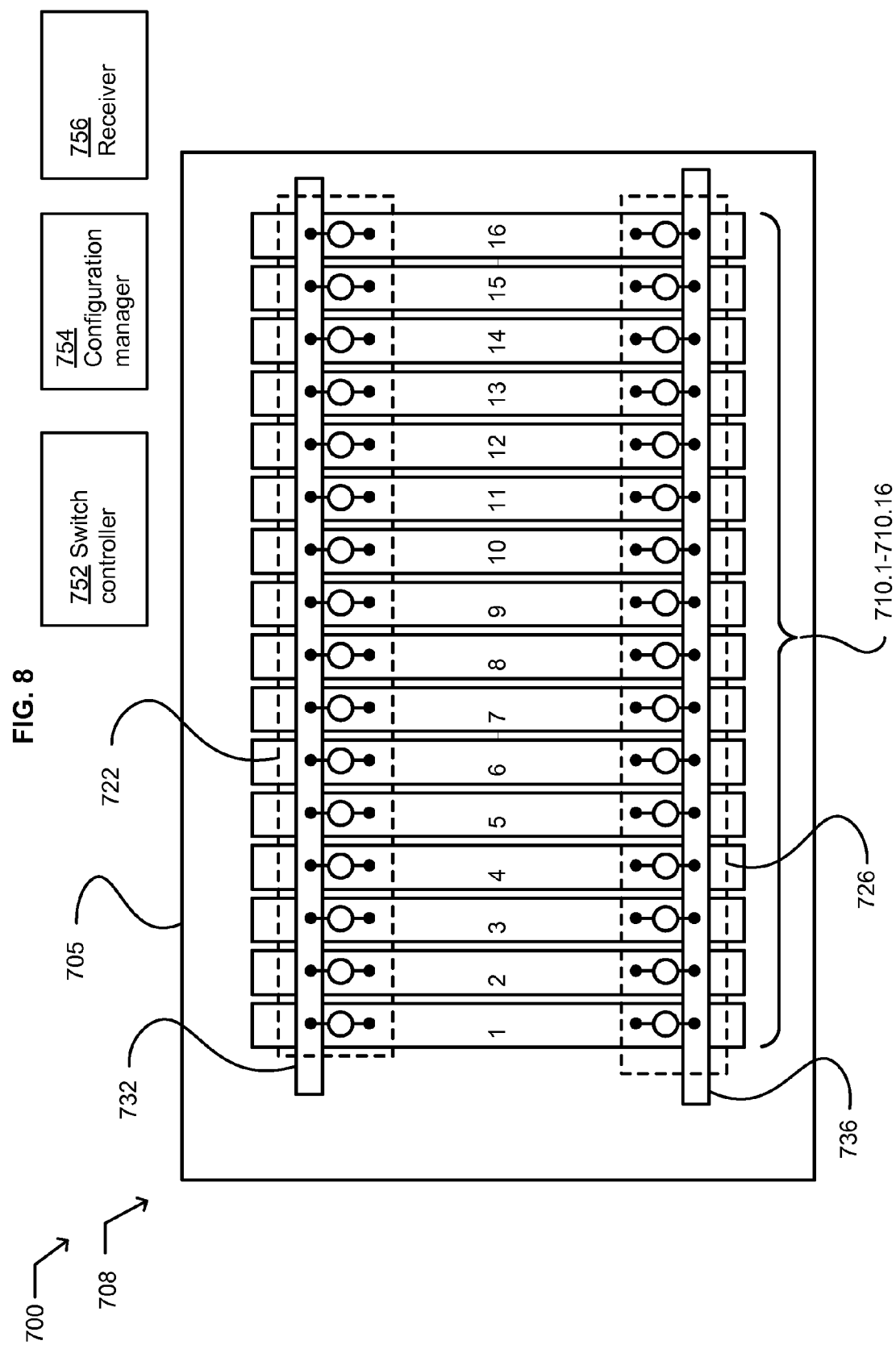
FIG. 8 illustrates an example surface acoustic wave device 700.

FIG. 8 illustrates an example surface acoustic wave device 700. The surface acoustic wave device includes a piezoelectric substrate 705. The surface acoustic wave device includes a configurable electrode assembly 708. The configurable electrode assembly includes a plurality M of spaced-apart elongated electrode sub-elements 710 electromechanically coupled with the piezoelectric substrate. The plurality M of spaced-apart elongated electrode sub-elements 710, where M=16, are illustrated in FIG. 8 by electrode sub-elements 710.1-710.16. The configurable electrode assembly includes a first signal bus 732 proximate to each electrode sub-element of the plurality M of electrode sub-elements, and electrically isolated therefrom. The configurable electrode assembly includes a first matrix of addressable switches 722. Each addressable switch of the first matrix is configured to electrically couple a respective electrode sub-element of the plurality M of electrode sub-elements with the first signal bus. The configurable electrode assembly includes a second signal bus 736 proximate to each electrode sub-element of the plurality of electrode sub-elements, and electrically isolated therefrom. The configurable electrode assembly includes a second matrix of addressable switches 726. Each addressable switch of the second matrix is configured to electrically couple a respective electrode sub-element of the plurality M of electrode sub-elements with the second signal bus.

In an embodiment, the surface acoustic wave device 700 includes a Rayleigh surface acoustic wave device. In an embodiment, the surface acoustic wave device includes a pseudo surface acoustic wave device. In an embodiment, the first signal bus is carried by the piezoelectric substrate. In an embodiment, the second signal bus is carried by the piezoelectric substrate.

In an embodiment, the plurality M of electrode sub-elements 710 includes a plurality of thin film electrode sub-elements. In an embodiment, the plurality M of electrode sub-elements includes a row of a plurality M of electrode sub-elements. In an embodiment, the plurality M of electrode sub-elements each have a width of less than $\lambda/8$ (where the surface acoustic wavelength $\lambda$ on the piezoelectric substrate=acoustic wave velocity $V_{SAW}$/center frequency $f_0$ of the device). In an embodiment, the plurality M of electrode sub-elements are arranged in a transverse orientation. In an embodiment, the individual electrode sub-elements of the plurality M of electrode sub-elements are not all parallel. In an embodiment, the plurality M of sub-elements are transversely arranged in a parallel or a slanted orientation.

In an embodiment, the first signal bus 732 orthogonally crosses each electrode sub-element of the plurality M of electrode sub-elements 710. In an embodiment, the first matrix of addressable switches are deposited on another substrate and the surface acoustic wave device includes a fabrication consisting of sandwiching together the piezoelectric substrate and the another substrate bearing the switches in an alignment.

Figure 9:
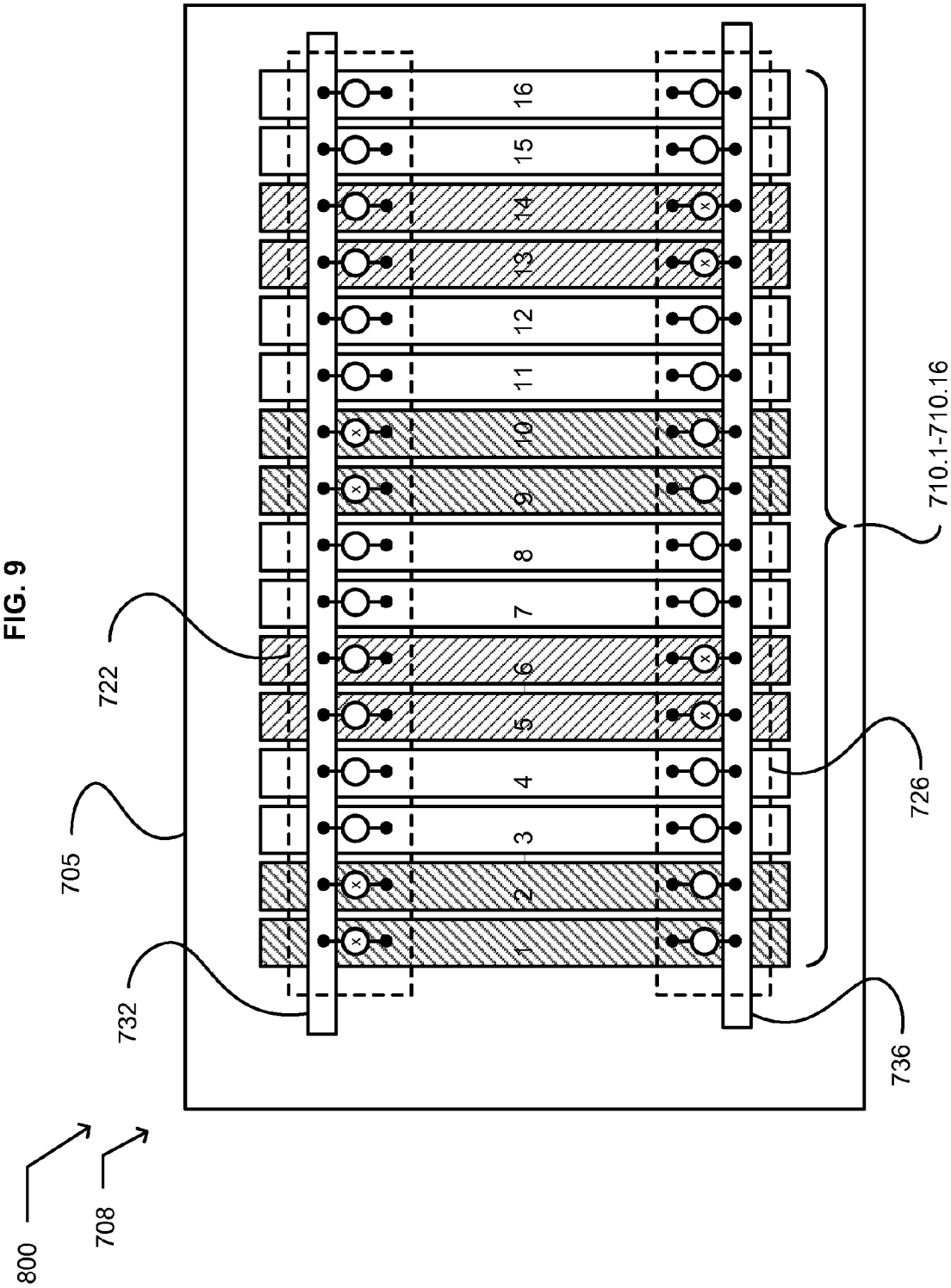
FIG. 9 illustrates an embodiment 800 of the surface wave device 600 of FIG. 8.

FIG. 9 illustrates an embodiment 800 of the surface wave device 600 of FIG. 8. If the first signal bus 732 is electrically coupled to a first selection of at least two adjacent electrode sub-elements (illustrated as the electrode sub-elements 710.1 & 710.2, and 710.9 & 710.10) of the plurality of electrode sub-elements 710 by the respective addressable switches of the first matrix 722, and if the second signal bus 736 is electrically coupled to a second selection of at least two adjacent electrode sub-elements (illustrated as the electrode sub-elements 710.5 & 710.6, and 710.13 & 710.14) of the plurality of electrode sub-elements by the respective addressable switches of the second matrix 736, the second selection of at least two adjacent electrode sub-elements not including any members of the first selection of at least two adjacent electrode sub-elements (i.e., disjoint sets), the electrode assembly 708 is configured in response to a signal applied across the first signal bus and the second signal bus to initiate surface waves on the piezoelectric substrate 705 having amplitude or phase characteristics that are a function of the first selection of at least two adjacent electrode sub-elements and the second selection of at least two adjacent electrode sub-elements. In an embodiment, each finger defined by the first selection of at least two adjacent electrode sub-elements is transversely separated from each finger defined by the second selection of at least two adjacent electrode sub-elements by a selected transverse distance. For example, the selected electrode sub-elements 710.1 & 710.2 are transversely separated from the selected electrode sub-elements 710.5 & 710.6 by electrode sub-elements 710.3 & 710.4. In an embodiment, the selected transverse distance is at least $\lambda/4$.

Returning to FIG. 8, in an embodiment, the surface wave device 800 includes a switch controller 752 configured to operate an addressable switch of the first matrix of addressable switches 722 and an addressable switch of the second matrix of addressable switches 726. In an embodiment, the device includes a configuration manager 754 configured to (i) receive a request for a device characteristic, and (ii) select settings of the first and second matrices of addressable switches of the configurable electrode assembly 705 implementing the requested device characteristic. In an embodiment, the request for device characteristic includes a request for an amplitude or phase response by the surface acoustic wave device. In an embodiment, the request for a device characteristic includes a request for an arbitrary device characteristic. In an embodiment, the request for a surface acoustic wave characteristic includes at least one of a requested center frequency $f_0$, bandwidth, or transfer function. In an embodiment, the device includes a receiver 756 configured to receive a request for a device characteristic. In an embodiment, the request for the device characteristic includes requested finger positions, length, spacing, or width. In an embodiment, the request for the device characteristic includes requested settings of the first and second matrices of addressable switches of the configurable electrode assembly. In an embodiment, the request includes a request for a stored electrode pattern.

In an embodiment, an addressable switch of the first matrix of addressable switches 722 or the second matrix of addressable switches 726 includes a one-time programmable switch. In an embodiment, an addressable switch of the first matrix of addressable switches or the second matrix of addressable switches includes a programmable switch.

Figure 10:
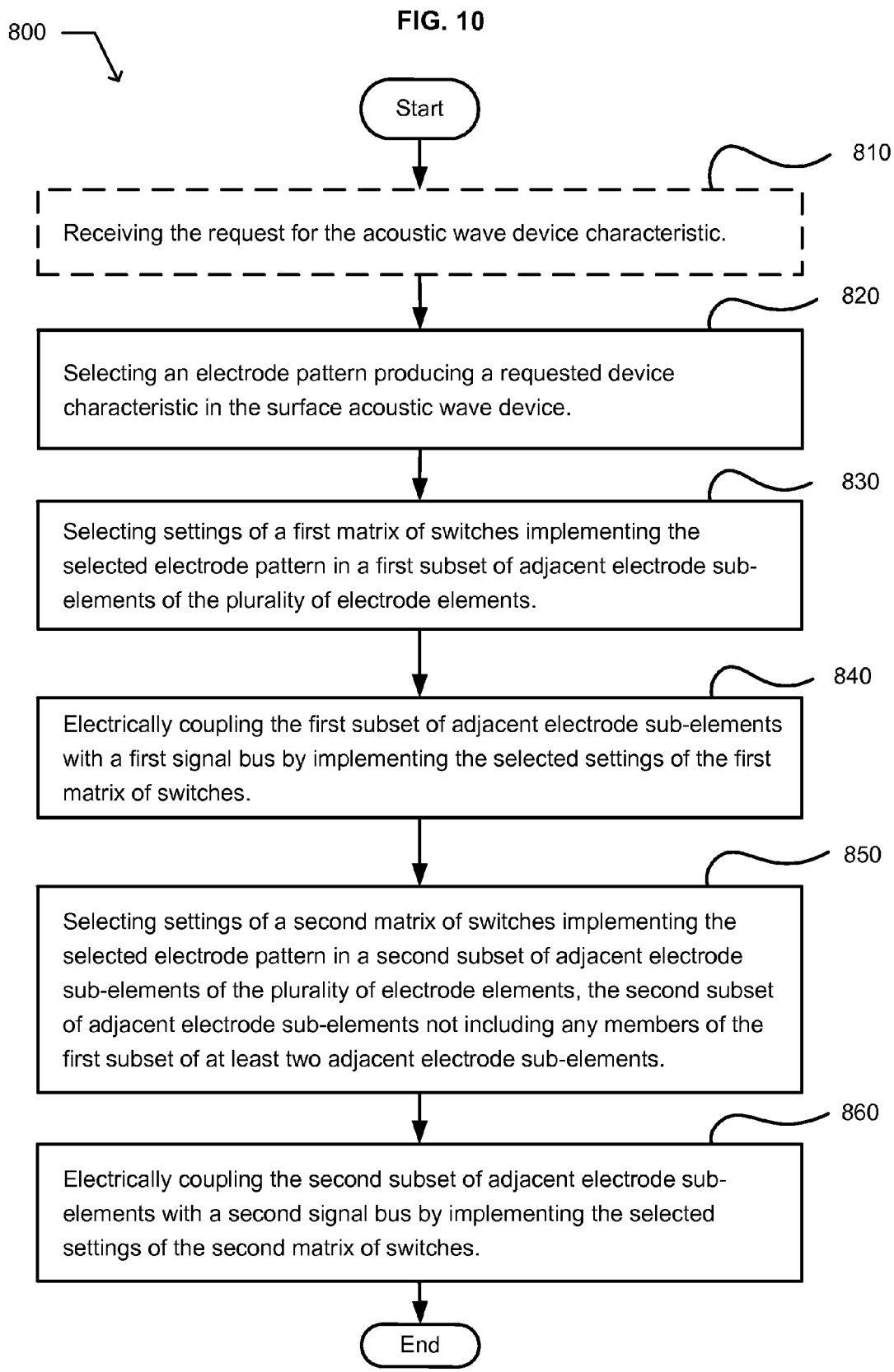
FIG. 10 illustrates an example operational flow 800 implemented in a configurable electrode assembly of a surface acoustic wave device.

FIG. 10 illustrates an example operational flow 800 implemented in a configurable electrode assembly of a surface acoustic wave device. The configurable electrode assembly having a plurality of spaced-apart electrode sub-elements. After a start operation, the operational flow includes a configuration operation 820. The configuration operation includes selecting an electrode pattern producing a requested device characteristic in the surface acoustic wave device. In an embodiment, the selecting may include selecting an electrode pattern predicted to produce the surface acoustic wave characteristic in a configurable electrode assembly. In an embodiment, the configuration operation may be implemented using the configuration manager 754 described in conjunction with FIG. 8. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2.

A first choosing operation 830 includes selecting settings of a first matrix of switches implementing the selected electrode pattern in a first subset of adjacent electrode sub-elements of the plurality of electrode elements. In an embodiment, each switch of the first matrix of switches is configured to electrically couple a respective electrode sub-element of the plurality of electrode sub-elements with a first signal bus. In an embodiment, the first matrix of switches includes a first matrix of addressable switches. In an embodiment, the first choosing operation may be implemented using the configuration manager 754 described in conjunction with FIG. 8. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first implementing operation 840 includes electrically coupling the first subset of adjacent electrode sub-elements with a first signal bus by implementing the selected settings of the first matrix of switches. In an embodiment, the implementing operation may be implemented using the switch controller 752 described in conjunction with FIG. 8.

A second choosing operation 850 includes selecting settings of a second matrix of switches implementing the selected electrode pattern in a second subset of adjacent electrode sub-elements of the plurality of electrode elements. The second subset of adjacent electrode sub-elements not including any members of the first subset of at least two adjacent electrode sub-elements. In an embodiment, each switch of the second matrix of switches is configured to electrically couple a respective electrode sub-element of the plurality of electrode sub-elements with a second signal bus. In an embodiment, the second matrix of switches includes a second matrix of addressable switches. In an embodiment, the second choosing operation may be implemented using the configuration manager 754 described in conjunction with FIG. 8. In an embodiment, the second choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A second implementing operation 860 includes electrically coupling the second subset of adjacent electrode sub-elements with a second signal bus by implementing the selected settings of the second matrix of switches. In an embodiment, the second implementing operation may be implemented using the switch controller 752 described in conjunction with FIG. 8. The operational flow includes an end operation.

In an embodiment, the operational flow 800 includes receiving 810 the request for the acoustic wave device characteristic. In an embodiment, the plurality of sub-elements each have a width of less than $\lambda/8$ (where the surface acoustic wavelength $\lambda$ on the piezoelectric substrate=acoustic wave velocity $V_{SAW}$/center frequency $f_0$ of the device). In an embodiment, the operational flow 800 includes applying an input signal across the first signal bus and the second signal bus, and initiating surface waves on the piezoelectric substrate having amplitude or phase characteristics that are a function of the first subset of at least two adjacent electrode sub-elements and the second subset of at least two adjacent electrode sub-elements.

Figure 11:
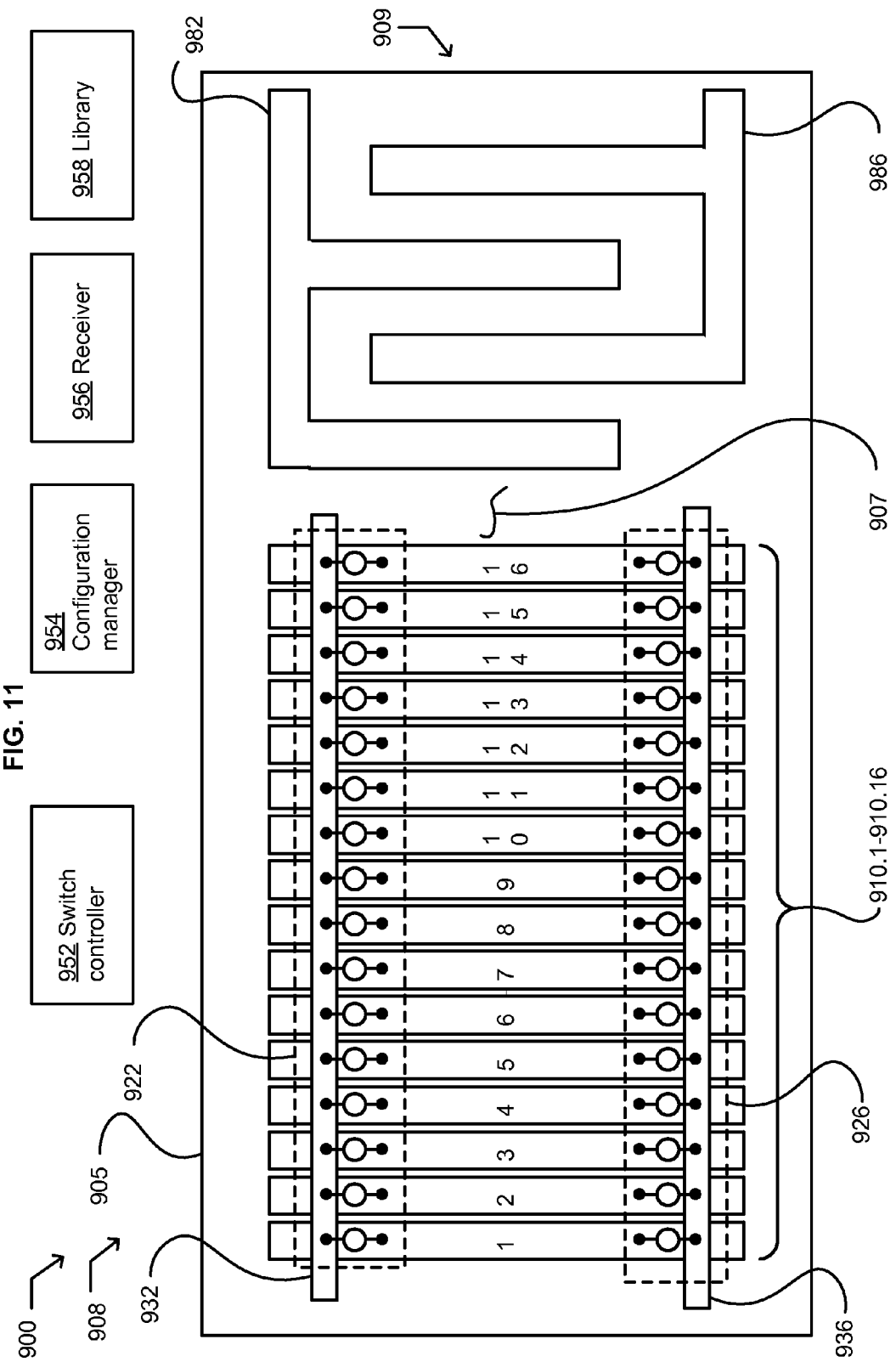
FIG. 11 illustrates a surface acoustic wave device 900.

FIG. 11 illustrates a surface acoustic wave device 900. The surface wave device includes a piezoelectric substrate 905. The surface acoustic wave device includes an input electrode assembly and an output electrode assembly. In an embodiment, once programmed or configured, the input electrode assembly electromechanically coupled with the piezoelectric substrate may be described as an input interdigital transducer. In an embodiment, once programmed or configured, the output electrode assembly electromechanically coupled with the piezoelectric substrate may be described as an output interdigital transducer. The surface acoustic wave device includes a surface wave propagating region 907 of the piezoelectric substrate. In an embodiment, the surface wave propagating region is located in a propagation path between the input electrode assembly and the output electrode assembly.

The surface acoustic wave device 900 includes a configurable electrode assembly 908 and another electrode assembly, illustrated by a fixed electrode assembly 909. In the surface acoustic wave device, the input electrode assembly or the output electrode assembly includes the configurable electrode assembly. In an embodiment, the another electrode assembly may include another configurable electrode assembly or a fixed electrode assembly. A fixed electrode assembly 909 is illustrated by a first fixed electrode 982, and a second fixed electrode 986.

The configurable electrode assembly 908 includes a plurality M of spaced-apart elongated electrode sub-elements 910 electromechanically coupled with the piezoelectric substrate 905. The plurality M of spaced-apart elongated electrode sub-elements 910, where M=16, are illustrated by electrode sub-elements 910.1-910.16. The configurable electrode assembly includes a first signal bus 932 proximate to each electrode sub-element of the plurality M of electrode sub-elements, and electrically isolated therefrom. The configurable electrode assembly includes a first matrix of addressable switches 922. Each addressable switch of the first matrix is configured to electrically couple a respective electrode sub-element of the plurality of electrode sub-elements with the first signal bus. The configurable electrode assembly includes a second signal bus 936 proximate to each electrode sub-element of the plurality of electrode sub-elements, and electrically isolated therefrom. The configurable electrode assembly includes a second matrix of addressable switches 926. Each addressable switch of the second matrix is configured to electrically couple a respective electrode sub-element of the plurality of electrode sub-elements with the second signal bus.

In an embodiment, the surface acoustic wave device 908 includes a Rayleigh surface acoustic wave device. In an embodiment, the surface acoustic wave device includes a pseudo surface acoustic wave device. In an embodiment, the first signal bus is carried by the piezoelectric substrate. In an embodiment, the first signal bus is deposited on the piezoelectric substrate. In an embodiment, the first signal bus crosses each of the plurality of electrode elements. In an embodiment, the second signal bus is carried by the piezoelectric substrate. In an embodiment, the second signal bus is deposited on the piezoelectric substrate. In an embodiment, the second signal bus crosses each of the plurality of electrode elements.

In an embodiment, the plurality M of sub-elements 910 each have a width of less than $\lambda/8$ (where the surface acoustic wavelength $\lambda$ on the piezoelectric substrate=acoustic wave velocity $V_{SAW}$/center frequency $f_0$ of the device). In an embodiment, the plurality of sub-elements are arranged in a transverse orientation.

In an embodiment of the device 900, if the input electrode assembly includes the configurable electrode assembly 908, if the first signal bus 922 is electrically coupled to a first selection of at least two adjacent electrode sub-elements (for example, the electrode sub-elements 910.1 & 910.2) of the plurality M of electrode sub-elements 910 by the respective addressable switches of the first matrix 922, and if the second signal bus 926 is electrically coupled to a second selection of at least two adjacent electrode sub-elements (for example, the electrode sub-elements 910.5 & 910.6) of the plurality M of electrode sub-elements by the respective addressable switches of the second matrix 926, the second selection of at least two adjacent electrode sub-elements not including any members of the first selection of at least two adjacent electrode sub-elements, the input electrode assembly is configured in response to a signal applied across the first signal bus and the second signal bus to initiate surface waves on the piezoelectric substrate 905 having amplitude or phase characteristics that are a function of the first selection of at least two adjacent electrode sub-elements and the second selection of at least two adjacent electrode sub-elements. In another embodiment, the first selection of at least two adjacent electrode sub-elements includes electrode sub-elements 910.1 & 910.2 and 910.9 & 910.10, and the second selection of at least two adjacent electrode sub-elements includes electrode sub-elements 910.5 & 910.6 and 910.12 & 910.13. In an embodiment, each finger defined by the first selection of at least two adjacent electrode sub-elements is transversely separated from each finger defined by the second selection of at least two adjacent electrode sub-elements by a selected transverse distance. In an embodiment, the selected transverse distance is at least $\lambda/4$.

In an embodiment of the device 900, if the output electrode assembly includes the configurable electrode assembly 908, if the first signal bus 922 is electrically coupled to a first selection of at least two adjacent electrode sub-elements (for example, the electrode sub-elements 910.1 & 910.2) of the plurality M of electrode sub-elements 910 by the respective addressable switches of the first matrix 922, and if the second signal bus 926 is electrically coupled to a second selection of at least two adjacent electrode sub-elements (for example, the electrode sub-elements 910.5 & 910.6) of the plurality M of electrode sub-elements by the respective addressable switches of the second matrix 926, the second selection of at least two adjacent electrode sub-elements not including any members of the first selection of at least two adjacent electrode sub-elements, the output electrode assembly is configured to receive a surface acoustic wave initiated by the input electrode assembly and generate an electrical signal in response thereto across the first signal bus and the second signal bus. In an embodiment, the generated electrical signal has amplitude or phase characteristics that are a function of the first selection of at least two adjacent electrode sub-elements and the second selection of at least two adjacent electrode sub-elements.

In an embodiment, a length to width ratio of each of the plurality M of electrode sub-elements 910 is greater than 10:1. In an embodiment, a length to width ratio of each of the plurality M of electrode sub-elements is greater than 30:1. In an embodiment, a length to width ratio of each of the plurality M of electrode sub-elements is greater than 100:1. In an embodiment, the elongated electrode sub-elements include electrically conductive elongated electrode sub-elements. In an embodiment, the elongated electrode sub-elements include metallic conductive elongated electrode sub-elements. In an embodiment, the elongated electrode sub-elements are fabricated on piezoelectric substrate. In an embodiment, the elongated electrode sub-elements are deposited on piezoelectric substrate. In an embodiment, the plurality M of elongated electrode sub-elements are each respectively transversely spaced-apart or separated a distance of less than $\lambda/16$.

In an embodiment, a switch of the first matrix of addressable switches 922 or the second matrix of addressable switches 926 includes a semiconductor switch. In an embodiment, a switch of the first matrix of addressable switches or the second matrix of addressable switches includes a floating-gate transistor. In an embodiment, a switch of the first matrix of addressable switches or the second matrix of addressable switches includes a memory cell architecture having a floating-gate transistor. In an embodiment, a switch of the first matrix of addressable switches or the second matrix of addressable switches includes a bistable semiconductor switch. In an embodiment, a switch of the first matrix of addressable switches or the second matrix of addressable switches includes a MOSFET transistor with a storage capacitor. In an embodiment, a switch of the first matrix of addressable switches or the second matrix of addressable switches includes MOSFET flash memory element or device. In an embodiment, a switch of the first matrix of addressable switches or the second matrix of addressable switches includes MOSFET flash memory element or device with charge injected into gate wells and retained to provide static switching. In an embodiment, the switches of the first matrix of addressable switches and the second matrix of addressable switches are included in a flash device having addressable MOSFET transistor switches. Each addressable MOSFET transistor switch is configured to electrically couple a respective electrode sub-element with the first signal bus or the second signal bus. In an embodiment, the switches of the first matrix of addressable switches and the second matrix of addressable switches are included in a flash device having addressable MOSFET transistor switches with charge injected into gate wells and retained to provide static switching. In an embodiment, the switches of the first matrix of addressable switches and the second matrix of addressable switches are included in a device having addressable memory elements. Each addressable memory element is configured to electrically couple a respective electrode sub-element with the first signal bus or the second signal bus. In an embodiment, an addressable switch of the first matrix of addressable switches or the second matrix of addressable switches includes a one-time programmable switch. In an embodiment, the one-time programmable switch includes a ROM, or PROM device. In an embodiment, an addressable switch of the first matrix of addressable switches or the second matrix of addressable switches includes a programmable switch. In an embodiment, the programmable switch includes bulk/block erasable and reprogrammable switch. In an embodiment, the programmable switch includes EPROM or flash RAM device. In an embodiment, an addressable switch of the first matrix of addressable switches or the second matrix of addressable switches includes a randomly accessible switch. In an embodiment, the randomly accessible switch includes a SRAM or DRAM device. In an embodiment, an addressable switch of the first matrix of addressable switches or the second matrix of addressable switches includes a MEMS device. In an embodiment, a switch of the electrode assembly includes a refreshable CMOS device. In an embodiment, an addressable switch of the first matrix of addressable switches or the second matrix of addressable switches includes a diode device. In an embodiment, an addressable switch of the first matrix of addressable switches or the second matrix of addressable switches includes a bi-polar transistor. In an embodiment, the addressable switches of the first matrix of addressable switches or the second matrix of addressable switches are addressed using separate lines.

In an embodiment, the first matrix of addressable switches 922 and the second matrix of addressable switches 926 are configured to be collectively switched between a first arbitrary state and a second arbitrary state in less than one-tenth of a second. In an embodiment, the first matrix of addressable switches and the second matrix of addressable switches are configured to be collectively switched between a first arbitrary state and a second arbitrary state in less than one-hundredth of a second. In an embodiment, the first matrix of addressable switches and the second matrix of addressable switches are configured to be collectively switched between a first arbitrary state and a second arbitrary state in less than one millisecond. In an embodiment, the first matrix of addressable switches and the second matrix of addressable switches are configured to be collectively switched between a first arbitrary state and a second arbitrary state in less than one microsecond. In an embodiment, the first matrix of addressable switches and the second matrix of addressable switches are configured to be collectively switched between a first arbitrary state and a second arbitrary state in a time period that does not significantly affect mobile cellular voice communications. In an embodiment, the first matrix of addressable switches and the second matrix of addressable switches are configured to be collectively switched between a first arbitrary state and a second arbitrary state in a time period that does not significantly affect mobile cellular data communications.

In an embodiment, the respective switches of the first matrix of addressable switches 922 and the second matrix of addressable switches 926 are randomly accessible. For example, the respective switches may include NOR type cells. In an embodiment, the first matrix of addressable switches and the second matrix of addressable switches are configured to be collectively accessible as a block. For example, the respective switches may include NOR or NAND type cells. In an embodiment, the switches of the first matrix of addressable switches are accessible as a block. In an embodiment, the switches of the second matrix of addressable switches are accessible as a block.

In an embodiment, the configurable electrode assembly 908 includes a reconfigurable electrode assembly. In an embodiment, the configurable electrode assembly includes a one-time configurable electrode assembly.

In an embodiment, the configurable electrode assembly 908 includes a third signal bus crossing each electrode sub-element of the plurality M of electrode sub-elements 910 and electrically isolated therefrom. The configurable electrode assembly also includes a ground-matrix of individually addressable switches. Each addressable switch of the ground-matrix is configured to electrically couple a respective electrode sub-element of the plurality M of electrode sub-elements with the third signal bus.

In an embodiment, the device 900 includes a switch controller 952 configured to operate an addressable switch of the first matrix of addressable switches 922 and an addressable switch of the second matrix of addressable switches 926. In an embodiment, the switch controller is configured to operate an addressable switch of the first matrix of addressable switches and an addressable switch of the second matrix of addressable switches in response to signal specifying switch settings selected to implement a device characteristic. In an embodiment, the device characteristic includes at least one of a requested center frequency $f_0$, bandwidth, impulse response, delay, or transfer function. In an embodiment, the switch controller is configured to operate the first matrix of addressable switches and the second matrix of addressable switches by writing a switching pattern for the first and second matrices of addressable switches to a buffered memory, and then simultaneously transmitting the pattern to the addressed switches of the first matrix of addressable switches and the second matrix of addressable switches. In an embodiment, the buffered memory may include a double buffered memory or a ping-pong buffered memory. In an embodiment, the electrode assembly includes the switch controller 952 coupled to an addressable switch of the first matrix of addressable switches 922 and an addressable switch of the second matrix of addressable switches 926 of the configurable electrode assembly 908.

In an embodiment, the device 900 includes a configuration manager 954 configured to (i) receive a request for a device characteristic, and (ii) select settings of the first and second matrices of addressable switches of the configurable electrode assembly implementing the requested device characteristic. In an embodiment, the request for a device characteristic includes a request for an amplitude or phase response by the surface acoustic wave device. In an embodiment, the request for a device characteristic includes a request for an arbitrary device characteristic. In an embodiment, the (ii) select settings includes (a) selecting an electrode pattern predicted to produce the device characteristic and (b) select settings of the first and second matrices of addressable switches implementing the selected electrode pattern in the electrode sub-elements 910. In an embodiment, the configuration manager is further configured to output a signal specifying the selected settings. In an embodiment, the configuration manager is further configured to select the settings in response a library 958 of at least two selectable device characteristics. In an embodiment, the configuration manager is configured to select the settings in response to a modeled interaction of the electrode sub-elements. In an embodiment, the modeled interaction includes modeled stray capacitances. In an embodiment, the configuration manager is configured to select the settings in response to a measured interaction of the electrode sub-elements. In an embodiment, the measured interaction includes measured stray capacitances. In an embodiment, the configuration manager is configured to select the settings in response to a measured characteristic of the surface acoustic wave device. In an embodiment, the measured characteristic includes supplying one or more test settings, measuring a performance of the reconfigured electrode assembly with the test settings applied to the electrode sub-elements, and altering the test settings in response to the measured performance to converge on optimized selected settings implementing the requested device characteristics. In an embodiment, the (ii) select settings includes select the settings in response to a feedback loop monitoring a performance by the configurable electrode assembly with respect to the requested device characteristics, implementing a change in the settings of the first and second matrices of addressable switches in response to the monitored performance, and then evaluating the performance by the configurable electrode assembly with the changed settings with respect to the requested device characteristics. In an embodiment, the first and second matrices of addressable switches are fast enough to do trial runs during a call or transmit/receive change over. In an embodiment, the (ii) select settings includes (a) select an electrode pattern predicted to produce the device characteristics and (b) select settings of the first and second matrices of addressable switches implementing the selected electrode pattern in the input electrode sub-elements. In an embodiment, the electrode pattern is selected in response to data acquired during a trial configuration of the electrode sub-elements. In an embodiment, the electrode pattern is selected responsive to application of a matrix factorization, or a matrix decomposition optimization technique to data acquired during a trial configuration of the electrode sub-elements. In an embodiment, the electrode pattern is selected responsive to application of a gradient descent optimization technique to data acquired during a trial configuration of the electrode sub-elements. In an embodiment, the electrode pattern is selected responsive to application of a singular value decomposition optimization technique to data acquired during a trial configuration of the electrode sub-elements. In an embodiment, the electrode pattern is selected responsive to application of a principle component analysis optimization technique to data acquired during a trial configuration of the electrode sub-elements. In an embodiment, the electrode pattern is selected responsive to application of a best available optimization technique selected from at least two available electrode patterns. In an embodiment, the configuration manager is further configured to run at least two trial configurations of the electrode sub-elements.

In an embodiment, the device 900 includes a configuration manager 954 configured to (i) receive a request for an device characteristic that includes at least one of a requested center frequency $f_0$, bandwidth, or transfer function, and (ii) select settings of the first and second matrices of addressable switches (922 and 926) of the configurable electrode assembly 908 implementing the requested device characteristic. In an embodiment, the device includes a library 958 of at least two selectable device characteristics. Each selectable filter characteristic of the at least two selectable device characteristics includes settings of the addressable switches of the first and second-matrices of addressable switches implementing a device characteristic that includes at least one of a requested center frequency $f_0$, bandwidth, or transfer function. In an embodiment, the library may be provided by a manufacturer of the device, a third party, or saved data from several prior runs of the actual device being operated.

In an embodiment, the device 900 includes a receiver 956 configured to receive a request for the device characteristic. In an embodiment, the request for the device characteristic includes requested finger positions, length, spacing, or width. In an embodiment, the request for the device characteristic includes requested settings of the first and second matrices of addressable switches of the configurable electrode assembly. In an embodiment, the request includes a request for a stored electrode pattern.

Figure 12:
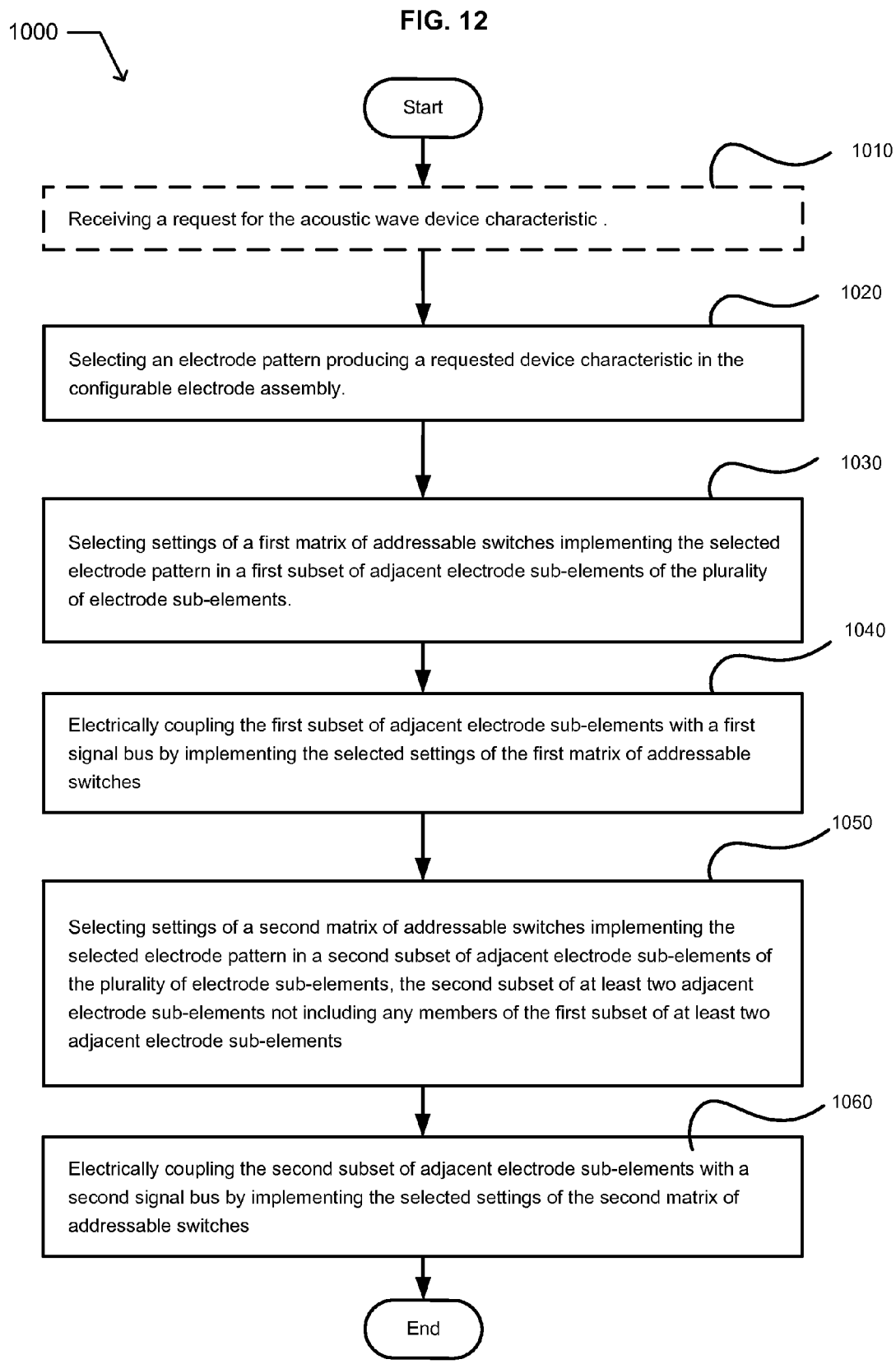
FIG. 12 illustrates an example operational flow 1000 implemented in a configurable electrode assembly of a surface acoustic wave device.

FIG. 12 illustrates an example operational flow 1000 implemented in a configurable electrode assembly of a surface acoustic wave device. The configurable electrode assembly having a plurality of spaced-apart elongated electrode sub-elements electromechanically coupled with a piezoelectric substrate. In an embodiment, the configurable electrode assembly may include the configurable electrode assembly 908 described in conjunction with FIG. 10.

After a start operation, the operational flow 1000 includes a configuration operation 1020. The configuration operation includes selecting an electrode pattern producing a requested surface acoustic wave device characteristic in the configurable electrode assembly. In an embodiment, the configuration operation includes selecting an electrode pattern predicted to produce the device characteristic. In an embodiment, the configuration operation includes selecting an electrode pattern producing the device characteristic. In an embodiment, the configurable electrode assembly is an input electrode assembly or an output electrode assembly. In an embodiment, the configuration operation may be implemented using the configuration manager 954 described in conjunction with FIG. 10. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first choosing operation 1030 includes selecting settings of a first matrix of addressable switches implementing the selected electrode pattern in a first subset of adjacent electrode sub-elements of the plurality of electrode sub-elements. In an embodiment, each switch of the first matrix of switches is configured to electrically couple a respective electrode sub-element of the plurality of electrode sub-elements with a first signal bus. In an embodiment, the first choosing operation may be implemented using the configuration manager 954 described in conjunction with FIG. 10. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first effecting operation 1040 includes electrically coupling the first subset of adjacent electrode sub-elements with a first signal bus by implementing the selected settings of the first matrix of addressable switches. The first effecting operation may be implemented using the switch controller 952 described in conjunction with FIG. 10. A second choosing operation 1050 includes selecting settings of a second matrix of addressable switches implementing the selected electrode pattern in a second subset of adjacent electrode sub-elements of the plurality of electrode sub-elements. The second subset of at least two adjacent electrode sub-elements not including any members of the first subset of at least two adjacent electrode sub-elements. In an embodiment, each switch of the second matrix of switches is configured to electrically couple a respective electrode sub-element of the plurality of electrode sub-elements with a second signal bus. The second choosing operation may be implemented using the configuration manager 954 described in conjunction with FIG. 10. In an embodiment, the second choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A second effecting operation 1060 includes electrically coupling the second subset of adjacent electrode sub-elements with a second signal bus by implementing the selected settings of the second matrix of addressable switches. The second effecting operation may be implemented using the switch controller 952 described in conjunction with FIG. 10. The operational flow includes an end operation.

In an embodiment of the example operational flow 1000, the plurality of sub-elements each have a width of less than λ/8 (where the surface acoustic wavelength λ on the piezoelectric substrate=acoustic wave velocity $V_{SAW}$/center frequency $f_0$ of the device). In an embodiment, the plurality of spaced-apart electrode sub-elements have a center-to-center transverse spacing of not more than λ/2.

In an embodiment, the operational flow 1000 includes receiving a request for the surface acoustic wave device characteristic. In an embodiment, the device characteristic includes at least one of a requested center frequency $f_0$, bandwidth, or transfer function. In an embodiment, the operational flow includes applying an input signal across the first signal bus and the second signal bus, and initiating surface waves on the piezoelectric substrate having amplitude or phase characteristics that are a function of the first subset of at least two adjacent electrode sub-elements and the second subset of at least two adjacent electrode sub-elements.

In an embodiment of the operational flow 1000, if the input electrode assembly includes the configurable electrode assembly, the operational flow includes applying an input signal across the first signal bus and the second signal bus, and initiating surface waves on the piezoelectric substrate having amplitude or phase characteristics that are a function of the first subset of at least two adjacent electrode sub-elements and the second subset of at least two adjacent electrode sub-elements. In an embodiment of the operational flow, if the output electrode assembly includes the configurable electrode assembly, the operational flow includes receiving a surface acoustic wave initiated by the input electrode assembly and generating an electrical signal in response thereto. The generated electrical signal having amplitude or phase characteristics that are a function of the first subset of at least two adjacent electrode sub-elements and the second subset of at least two adjacent electrode sub-elements.

Figure 13:
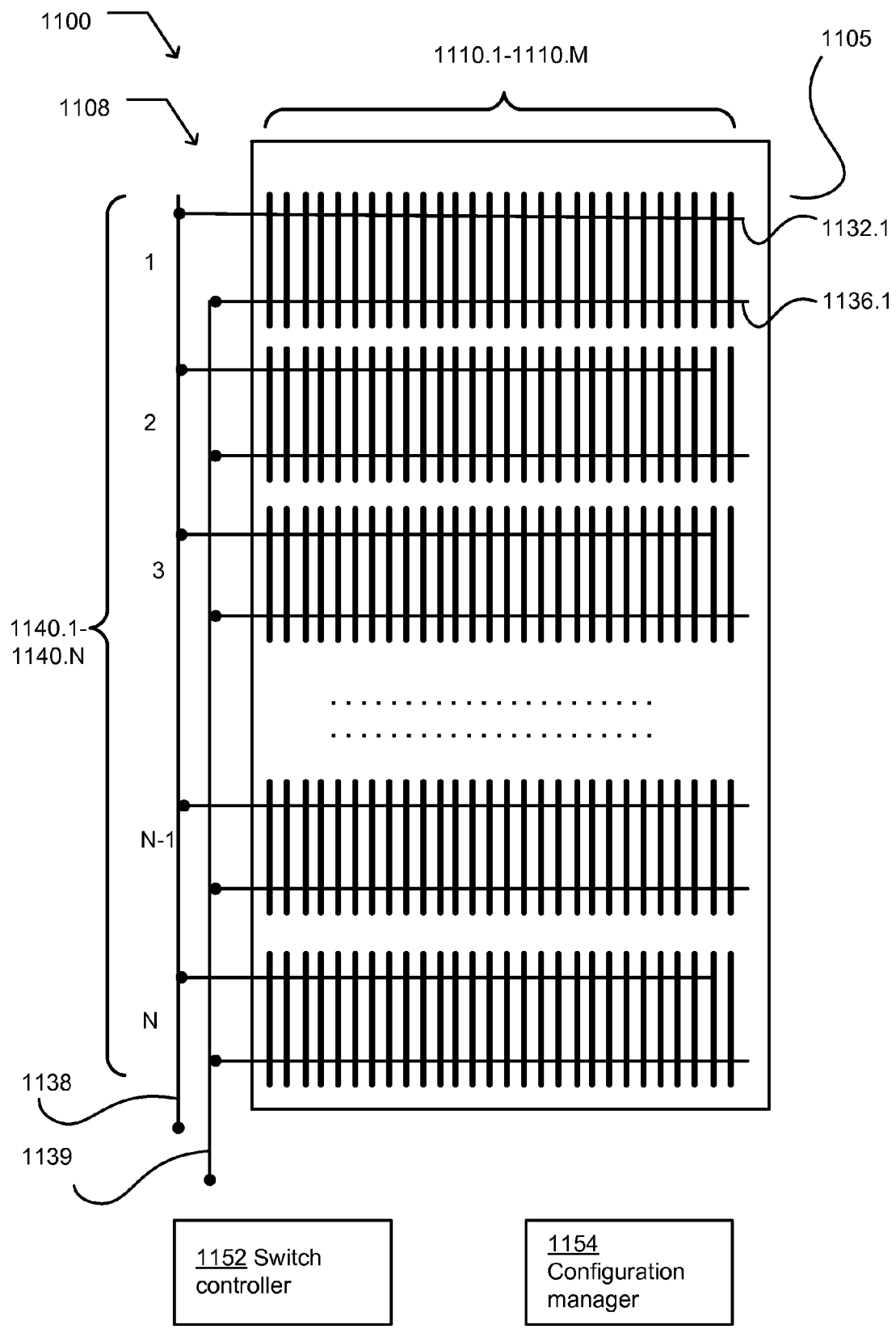
FIG. 13 illustrates an example surface acoustic wave device 1100.

FIG. 13 illustrates an example surface acoustic wave device 1100. The surface acoustic wave device includes a piezoelectric substrate 1105. The surface acoustic wave device includes a configurable electrode assembly 1108. The configurable electrode assembly includes a stack assemblage of N instances of electrode assembly sub-units. The N instances of electrode assembly sub-units are illustrated as electrode assembly sub-units 1140.1-1140.N. Each electrode assembly sub-unit including a plurality M of spaced-apart elongated electrode sub-elements electromechanically coupled with the piezoelectric substrate. The plurality M of spaced-apart elongated electrode sub-elements of an electrode assembly sub-unit are illustrated in FIG. 13 as electrode sub-elements 1110.1-1110.M. For example, an embodiment of an electrode assembly sub-unit is described in conjunction with FIG. 8 by the configurable electrode assembly 708 where M=16. See also FIG. 11. Each electrode assembly sub-unit of the configurable electrode assembly includes a first signal bus crossing each of the electrode sub-elements of the plurality M of electrode sub-elements and is electrically isolated therefrom. For example, the first signal bus of the electrode assembly sub-unit 1140.1 is illustrated as a first signal bus 1132.1. Each electrode assembly sub-unit of the configurable electrode assembly includes a second signal bus crossing each of the electrode sub-elements of the plurality M of electrode sub-elements and is electrically isolated therefrom. For example, the second signal bus of the electrode assembly sub-unit 1140.1 is illustrated as a second signal bus 1136.1. For example, an embodiment of the first signal bus and the second signal bus of an electrode assembly sub-unit is described in conjunction with FIG. 8 as the first signal bus 732 and the second signal bus 736 of the configurable electrode assembly 708. Each electrode assembly sub-unit of the configurable electrode assembly includes a first matrix of individually addressable switches. Each addressable switch of the first matrix is configured to electrically couple a respective electrode sub-element of the plurality of electrode sub-elements with the first signal bus. Each electrode assembly sub-unit of the configurable electrode assembly includes a second matrix of individually addressable switches. Each addressable switch of the second matrix is configured to electrically couple a respective electrode sub-element of the plurality of electrode sub-elements with the second signal bus. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. For example, an embodiment of the first matrix of individually addressable switches and the second matrix of individually addressable switches of an electrode assembly sub-unit are described in conjunction with FIG. 3 as the first matrix of individually addressable switches 222 and the second matrix of individually addressable switches 226 of the configurable electrode assembly 208.

For example, the surface acoustic wave device 1100 may include an M=1000×N=100 array of elongated electrode sub-elements. In this embodiment, the surface acoustic wave device could approximate an interdigital transducer with fifty pairs of opposing fingers (which is a total of 100 fingers plus space between them) with each individual finger ~5 electrodes wide. For example, the widths could vary +/−1 to allow the average spacing to be selected to within 0.1%. For example, finger length could be controlled to +/−1%. In this example, there would be 100 sets of signal busses. This example provides an anticipated ability to generate a reasonable approximation of an arbitrary interdigital transducer pattern.

In an embodiment, the surface acoustic wave device 1100, includes a Rayleigh surface acoustic wave device. In an embodiment, the surface acoustic wave device includes a pseudo surface acoustic wave device. In an embodiment, the first signal bus is carried by the piezoelectric substrate. In an embodiment, the first signal bus is deposited on the piezoelectric substrate. In an embodiment, the first signal bus crosses each of the electrode sub-elements of the plurality electrode sub-elements. In an embodiment, the second signal bus is carried by the piezoelectric substrate. In an embodiment, the second signal bus is deposited on the piezoelectric substrate. In an embodiment, the second signal bus crosses each of the plurality of electrode elements.

In an embodiment of surface acoustic wave device 1100, the plurality M of electrode sub-elements include a row of a plurality M of sub-elements. In an embodiment, the plurality of electrode sub-elements each have a width of less than λ/8 (where the surface acoustic wavelength λ on the piezoelectric substrate=acoustic wave velocity $V_{SAW}$/center frequency $f_0$ of the device). In an embodiment, the plurality of electrode sub-elements are arranged in a transverse orientation.

In an embodiment of surface acoustic wave device 1100, if a first subset of at least two adjacent electrode sub-elements of the plurality M of electrode sub-elements of a first subset of consecutive instances of the N instances of the plurality electrode assembly sub-units are electrically coupled with their respective first signal buses by their respective first addressable switches, and if a second subset of at least two adjacent electrode sub-elements of the plurality M of electrode sub-elements of a second subset of consecutive instances of the N instances of the plurality electrode assembly sub-units are electrically coupled with their respective second signal buses by their respective second addressable switches, the second subset of consecutive instances of at least two adjacent electrode sub-elements not including any members of the first subset of consecutive instances of at least two adjacent electrode sub-elements, the electrode assembly is configured to initiate surface waves on the piezoelectric substrate 1105 in response to a signal applied across the respective first signal buses and the respective second signal buses. In an embodiment, each finger defined by the first subset of at least two consecutive instances of adjacent electrode sub-elements is transversely separated from each finger defined by the second subset of at least two consecutive instances of adjacent electrode sub-elements by a selected transverse distance. In an embodiment, the selected transverse distance is at least λ/4.

A partial example of the first subset of at least two adjacent electrode sub-elements of the plurality M of electrode sub-elements is illustrated in the embodiment 800 described in conjunction with FIG. 9. The embodiment 800 illustrates the surface wave device 600 of FIG. 8 where a first subset of at least two adjacent electrode sub-elements 710.1 & 710.2, and 710.9 & 710.10 of the plurality of electrode sub-elements 710 are electrically coupled to the first signal bus 732. In this embodiment of the surface wave device 1100, the surface wave device 1100 may be visualized as a stack or assemblage of at least two consecutive instances of the surface wave device 600 where the same first subset of at least two adjacent electrode sub-elements 710.1 & 710.2, and 710.9 & 710.10 of the plurality of electrode sub-elements 710 are electrically coupled to their respective first signal bus 732 in each of the at least two consecutive instances of the N instances of electrode assembly sub-units. Similarly, a partial example of the second subset of at least two adjacent electrode sub-elements of the plurality M of electrode sub-elements is illustrated by the surface wave device 600 of FIG. 8 where a second subset of at least two adjacent electrode sub-elements 710.5 & 710.6, and 710.13 & 710.14 of the plurality of electrode sub-elements 710 are electrically coupled to the second signal bus 736. In this embodiment of the surface wave device 1100, the surface wave device 1100 may be visualized as a stack or assemblage of at least two consecutive instances of the N instances of electrode assembly sub-units of the surface wave device 600 where the same second subset of at least two adjacent electrode sub-elements 710.5 & 710.6, and 710.13 & 710.14 of the plurality of electrode sub-elements 710 are electrically coupled to their respective second signal bus 736 in each of the at least two consecutive instances.

In an embodiment, the surface wave device 1100 includes a switch controller 1152 configured to operate an individually addressable switch of the first matrix of addressable switches and an individually addressable switch of the second matrix of addressable switches of each of the N instances of the electrode assembly sub-unit. In an embodiment, the switch controller is fabricated on the substrate 1105.

In an embodiment, the surface wave device 1100 includes a configuration manager 1154 configured to (i) receive a request for a device characteristic, and (ii) select settings of the first and second-matrices of addressable switches of each of the N instances of the electrode assembly sub-units implementing the requested device characteristic. In an embodiment, the device characteristic includes at least one of a requested center frequency $f_0$, bandwidth, or transfer function. In an embodiment, the request for device characteristic includes a request for an amplitude or phase response by the surface acoustic wave device. In an embodiment, the request for device characteristic includes a request for an arbitrary device characteristic.

In an embodiment, the surface wave device 1100 includes a first signal distribution bus 1138 coupled to each first signal bus of the N instances of the electrode assembly sub-unit. In an embodiment, the first signal distribution bus is carried by the piezoelectric substrate. In an embodiment, the first signal distribution bus is fabricated on the piezoelectric substrate. In an embodiment, the surface wave device includes a second signal distribution bus 1139 coupled to each second signal bus of the N instances of the electrode assembly sub-unit. In an embodiment, the second signal distribution bus is carried by the piezoelectric substrate. In an embodiment, the second signal distribution bus is fabricated on the piezoelectric substrate.

In an embodiment, the surface wave device 1100 includes a receiver configured to receive a request for a device characteristic.

Figure 14:
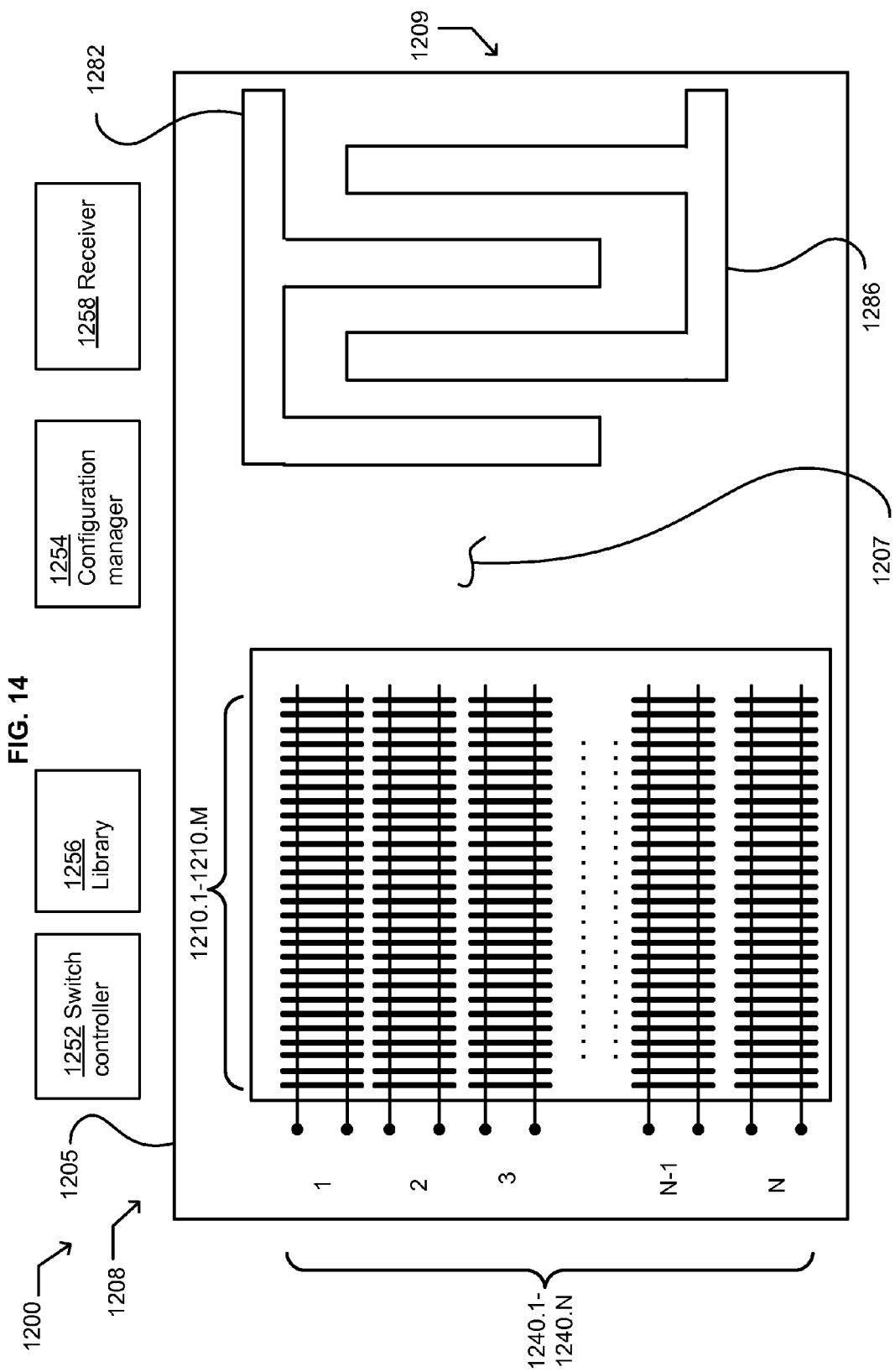
FIG. 14 illustrates an example surface acoustic wave device 1200.

FIG. 14 illustrates an example surface acoustic wave device 1200. The surface acoustic wave device includes a piezoelectric substrate 1205. The surface acoustic wave device includes an input electrode assembly and an output electrode assembly. In an embodiment, once programmed or configured, the input electrode assembly electromechanically coupled with the piezoelectric substrate may be described as an input interdigital transducer. In an embodiment, once programmed or configured, the output electrode assembly electromechanically coupled with the piezoelectric substrate may be described as an output interdigital transducer. The surface acoustic wave device includes a surface wave propagating region 1207 of the piezoelectric substrate. In an embodiment, the surface wave propagating region is located in a propagation path between the input electrode assembly and the output electrode assembly.

The surface acoustic wave device 1200 includes a configurable electrode assembly 1208 and another electrode assembly, illustrated by a fixed electrode assembly 1209. In the surface acoustic wave device, the input electrode assembly or the output electrode assembly includes the configurable electrode assembly. In an embodiment, the another electrode assembly may include another configurable electrode assembly or a fixed electrode assembly. A fixed electrode assembly 1209 is illustrated by a first fixed electrode 1282, and a second fixed electrode 1286.

The configurable electrode assembly 1208 includes a stack assemblage 1240 of N instances of electrode assembly sub-units. The N instances of electrode assembly sub-units are illustrated as electrode assembly sub-units 1240.1-1240.N. Each electrode assembly sub-unit including a plurality M of spaced-apart elongated electrode sub-elements 1210 electromechanically coupled with the piezoelectric substrate 1205. The plurality M of spaced-apart elongated electrode sub-elements of an electrode assembly sub-unit are illustrated in FIG. 14 as electrode sub-elements 1210.1-1210.M. For example, an embodiment of an electrode assembly sub-unit is described in conjunction with FIG. 8 by the configurable electrode assembly 708 where M=16. See also FIG. 11. Each electrode assembly sub-unit of the configurable electrode assembly includes a first signal bus proximate to each of the electrode sub-elements of the plurality M of electrode sub-elements and electrically isolated therefrom. For example, the first signal bus of the electrode assembly sub-unit 1240.1 is described in conjunction with FIG. 13 by the first signal bus 1132.1. Each electrode assembly sub-unit of the configurable electrode assembly includes a second signal bus proximate to each of the electrode sub-elements of the plurality M of electrode sub-elements and electrically isolated therefrom. For example, the second signal bus of the electrode assembly sub-unit 1240.1 is described in conjunction with FIG. 13 by the second signal bus 1136.1. For example, an embodiment of the first signal bus and the second signal bus of an electrode assembly sub-unit is described in conjunction with FIG. 8 as the first signal bus 732 and the second signal bus 736 of the configurable electrode assembly 708. Each electrode assembly sub-unit of the configurable electrode assembly 1208 includes a first matrix of individually addressable switches. Each addressable switch of the first matrix is configured to electrically couple a respective electrode sub-element of the plurality M of electrode sub-elements with the first signal bus. Each electrode assembly sub-unit of the configurable electrode assembly includes a second matrix of individually addressable switches. Each addressable switch of the second matrix is configured to electrically couple a respective electrode sub-element of the plurality M of electrode sub-elements with the second signal bus. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. For example, an embodiment of the first matrix of individually addressable switches and the second matrix of individually addressable switches of an electrode assembly sub-unit are described in conjunction with FIG. 3 as the first matrix of individually addressable switches 222 and the second matrix of individually addressable switches 226 of the configurable electrode assembly 208.

For example, the surface acoustic wave device 1200 may include an M=1000×N=100 array of elongated electrode sub-elements. In this embodiment, the surface acoustic wave device is expected to approximate an interdigital transducer with fifty pairs of opposing fingers (which is a total of 100 fingers plus space between them) with each individual finger ~5 electrodes wide. For example, the widths could vary +/−1 to allow the average spacing to be selected to within 0.1%. For example, finger length could be controlled to +/−1%. In this example, there would be 100 sets of signal busses. This example provides an anticipated ability to generate a reasonable approximation of an arbitrary interdigital transducer pattern.

In an embodiment, the surface acoustic wave device 1200 includes a Rayleigh surface acoustic wave device. In an embodiment, the surface acoustic wave device includes a pseudo surface acoustic wave device. In an embodiment, the surface acoustic wave device includes a surface wave propagating region 1207 of the piezoelectric substrate 1205 located in a propagation path between the input electrode assembly and the output electrode assembly. In an embodiment, the first signal bus is carried by the piezoelectric substrate. In an embodiment, the first signal bus is deposited on the piezoelectric substrate. In an embodiment, the first signal bus is formed on the piezoelectric substrate. In an embodiment, the first signal bus crosses each of the plurality of electrode elements. In an embodiment, the second signal bus is carried by the piezoelectric substrate. In an embodiment, the second signal bus is deposited on the piezoelectric substrate. In an embodiment, the second signal bus is formed on the piezoelectric substrate. In an embodiment, the second signal bus crosses each of the plurality of electrode elements. In an embodiment of the surface acoustic wave device 1200, each electrode sub-element of the plurality M of electrode sub-elements 1210 has a width of less than $\lambda/8$ (where the surface acoustic wavelength $\lambda$ on the piezoelectric substrate=acoustic wave velocity $V_{SAW}$/center frequency $f_0$ of the device). In an embodiment, the plurality M of the electrode sub-elements are arranged in a transverse orientation.

In an embodiment, the plurality M of electrode sub-elements 1210 of a first instance of an electrode assembly sub-unit of the stack assemblage have a respective end-to-end alignment with the plurality M of electrode sub-elements of an adjacent second instance of an electrode assembly sub-unit of the stack assemblage. In an embodiment, the electrode sub-elements of each instance of an electrode assembly sub-unit of the stack assemblage have a respective end-to-end alignment with the electrode sub-elements of every other instance of an electrode assembly sub-unit of the stack assemblage. In an embodiment, the stack assemblage 1240 of the N instances of the electrode assembly sub-units includes each electrode sub-element of the plurality M of electrode sub-elements 1210 with a same M index number in a common alignment. For example, a centerline of an elongated axis of electrode sub-element 1210.5 of instance 1240.50 has a centerline in a common alignment with centerline of an elongated axis of electrode sub-element 1210.5 of instance 1240.51. In an embodiment, the common alignment includes a centerline of an elongated length of each electrode sub-element with a same M index number aligned on a common centerline.

In an embodiment of the surface acoustic wave device 1200, if the input electrode assembly includes the configurable electrode assembly 1208, if a first subset of at least two adjacent electrode sub-elements of the plurality M of electrode sub-elements of a first subset of consecutive instances of the N instances of the plurality electrode assembly sub-units are electrically coupled with their respective first signal buses by their respective first addressable switches, and if a second subset of at least two adjacent electrode sub-elements of the plurality M of electrode sub-elements of a second subset of consecutive instances of the N instances of the plurality M of electrode assembly sub-units are electrically coupled with their respective second signal buses by their respective second addressable switches, the second subset of consecutive instances of at least two adjacent electrode sub-elements not including any members of the first subset of consecutive instances of at least two adjacent electrode sub-elements, the input electrode assembly is configured to initiate surface waves on the piezoelectric substrate 1205 in response to a signal applied across the respective first signal buses and the respective second signal buses. In an embodiment, the second selection of at least two adjacent electrode sub-elements are separated from the first selection of at least two adjacent electrode sub-elements by a selected transverse distance. In an embodiment, the selected transverse distance is at least $\lambda/4$. In an embodiment, the surface waves have amplitude or phase characteristics that are a function of the first subset of at least two adjacent electrode sub-elements and the second subset of at least two adjacent electrode sub-elements. In an embodiment, the first selection of at least two adjacent input electrode sub-elements of the plurality of electrode sub-elements includes at least five adjacent electrode sub-elements. In an embodiment, the configurable electrode assembly is configured to generate mechanical strains in the substrate in response to electrical signal applied across the respective first signal buses and the respective second signal buses.

A partial example of the first subset of at least two adjacent electrode sub-elements of the plurality M of electrode sub-elements 1210 is illustrated in the embodiment 800 of the surface wave device 600 described in conjunction with FIGS. 8 and 9. The embodiment 800 of the surface wave device 600 illustrates in FIG. 9 includes a first subset of at least two adjacent electrode sub-elements 710.1 & 710.2, and 710.9 & 710.10 of the plurality of electrode sub-elements 710 electrically coupled to the first signal bus 732. In the embodiment of the surface wave device 1200, the surface wave device 1200 may be visualized as a stack or assemblage of at least two consecutive instances of the surface wave device 600 where the same first subset of at least two adjacent electrode sub-elements 710.1 & 710.2, and 710.9 & 710.10 of the plurality of electrode sub-elements 710 are electrically coupled to their respective first signal bus 732 in each of the at least two consecutive instances of the N instances of electrode assembly sub-units. Similarly, a partial example of the second subset of at least two adjacent electrode sub-elements of the plurality M of electrode sub-elements is illustrated by the surface wave device 600 of FIG. 8 where a second subset of at least two adjacent electrode sub-elements 710.5 & 710.6, and 710.13 & 710.14 of the plurality of electrode sub-elements 710 are electrically coupled to the second signal bus 736. In the embodiment of the surface wave device 1200, the surface wave device 1200 may be visualized as a stack or assemblage of at least two consecutive instances of the N instances of electrode assembly sub-units of the surface wave device 600 where the same second subset of at least two adjacent electrode sub-elements 710.5 & 710.6, and 710.13 & 710.14 of the plurality of electrode sub-elements 710 are electrically coupled to their respective second signal bus 736 in each of the at least two consecutive instances.

In an embodiment of the surface acoustic wave device 1200, if the output electrode assembly includes the configurable electrode assembly 1208, if a first subset of at least two adjacent electrode sub-elements of the plurality M of electrode sub-elements of a first subset of consecutive instances of the N instances of the plurality electrode assembly sub-units are electrically coupled with their respective first signal buses by their respective first addressable switches, and if a second subset of at least two adjacent electrode sub-elements of the plurality M of electrode sub-elements of a second subset of consecutive instances of the N instances of the plurality electrode assembly sub-units are electrically coupled with their respective second signal buses by their respective second addressable switches, the second subset of consecutive instances of at least two adjacent electrode sub-elements not including any members of the first subset of consecutive instances of at least two adjacent electrode sub-elements, the output electrode assembly is configured to receive a surface wave initiated by the input electrode assembly and generate an electrical signal in response thereto across the respective first signal buses and the respective second signal buses. In an embodiment, the generated electrical signal has amplitude or phase characteristics that are a function of the first subset of at least two adjacent electrode elements and the second subset of at least two adjacent electrode elements. In an embodiment, the first subset of at least two adjacent electrode sub-elements of the plurality M of electrode sub-elements includes at least five adjacent electrode sub-elements.

In an embodiment of the surface acoustic wave device 1200, the input electrode assembly 1208 includes a first configurable electrode assembly and the output electrode assembly includes a second configurable electrode assembly.

In an embodiment of the configurable electrode assembly, the plurality M of elongated electrode sub-elements 1210 are fabricated on the piezoelectric substrate 1205. In an embodiment, the plurality M of electrode sub-elements are each respectively transversely spaced-apart a distance of less than $\lambda/16$. In an embodiment, the plurality M of elongated electrode sub-elements includes at least 500 instances of the elongated electrode sub-elements. In an embodiment, the plurality M of elongated electrode sub-elements includes at least 1000 instances of the elongated electrode sub-elements. In an embodiment, the stack assemblage of N instances of an electrode assembly sub-unit includes at least 50 instances of the electrode assembly sub-units. In an embodiment, the stack assemblage of N instances of an electrode assembly sub-unit includes at least 100 instances of the electrode assembly sub-units. In an embodiment, a length to width ratio of each of the plurality of elongated electrode sub-elements is greater than 10:1. In an embodiment, a length to width ratio of each of the plurality of elongated electrode sub-elements is greater than 30:1. In an embodiment, a length to width ratio of each of the plurality of elongated electrode sub-elements is greater than 100:1. In an embodiment, the assemblage includes an assemblage where the N instances of the electrode assembly sub-units are end to end spaced apart less than $\lambda/8$. In an embodiment, the assemblage includes an assemblage where the N instances of the electrode assembly sub-units are arranged in N generally parallel rows of the electrode assembly sub-units.

In an embodiment, an addressable switch of the first matrix of individually addressable switches or the second matrix of individually addressable switches includes a semi-conductor switch. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. In an embodiment, an addressable switch of the first matrix of individually addressable switches or the second matrix of individually addressable switches includes a semiconductor switch. In an embodiment, an addressable switch of the first matrix of individually addressable switches or the second matrix of individually addressable switches includes a floating-gate transistor. In an embodiment, the first matrix of individually addressable switches and the second matrix of individually addressable switches are included in a flash device having addressable MOSFET transistor switches. Each addressable MOSFET transistor switch is configured to electrically couple a respective electrode sub-element with the first signal bus or the second signal bus. In an embodiment, the first matrix of individually addressable switches and the second matrix of individually addressable switches are included in a device having addressable memory elements. Each addressable memory element configured to electrically couple a respective electrode sub-element with the first signal bus or the second signal bus. In an embodiment, an addressable switch of the first matrix of individually addressable switches or the second matrix of individually addressable switches includes a MEMS device. In an embodiment, an addressable switch of the first matrix of individually addressable switches or the second matrix of individually addressable switches includes a refreshable CMOS device. In an embodiment, an addressable switch of the first matrix of individually addressable switches or the second matrix of individually addressable switches includes a one-time programmable switch. In an embodiment, an addressable switch of the first matrix of addressable switches or the second matrix of addressable switches includes a reprogrammable switch. In an embodiment, an addressable switch of the first matrix of individually addressable switches or the second matrix of individually addressable switches includes a randomly accessible switch. In an embodiment, an individual addressable switch of the first matrix of individually addressable switches or the second matrix of individually addressable switches is addressable by application of a switching signal across an address line of the switch and a signal bus coupled to the individual addressable switch. In an embodiment, an individual addressable switch of the first matrix of individually addressable switches or the second matrix of individually addressable switches is addressable by application of a switching signal across a signal bus coupled to the individual addressable switch and an electrode sub-element coupled with the individual addressable switch. In an embodiment, an addressable switch is controlled using an address line coupled to the addressable switch and a signal bus. In an embodiment, the first matrix of addressable switches and the second matrix of addressable switches are configured to be collectively switched between a first arbitrary state and a second arbitrary state in less than one-hundredth of a second.

In an embodiment of the device 1200, at least two electrode sub-elements are arranged in a column and electrically coupled in a configuration where they are electrically isolated in response to an applied radiofrequency signal and electrically coupled in response to the switching signal. In an embodiment, the at least two electrode sub-elements are arranged in a column are electrically coupled by a resistor, inductor, or breakdown diode in response to the switching signal and electrically isolated in response to the applied radiofrequency signal. For example, at least two electrode sub-elements arranged in a column may be electrically coupled or decoupled in response to an applied DC voltage, or a relatively high-voltage pulse (higher than the maximum RF-signal voltage) between one bus and one electrode to close or open the switch at their intersection. For example, at least two electrode sub-elements arranged in a column may be electrically coupled or decoupled using the electrodes and busses themselves at the memory address lines. For instance, all the segments of one electrode "column" could be electrically connect together, e.g. with resistors or inductors or breakdown diodes, so that they would be electrically separate for an RF signal, but connected together for the purposes of programming the switches. For example, a low frequency signal may be used to drive buses and program the switches. In an embodiment, an addressable switch is controlled using an address line coupled to the addressable switch and a signal bus. In an embodiment, the first matrix of addressable switches and the second matrix of addressable switches are configured to be collectively switched between a first arbitrary state and a second arbitrary state in less than one-hundredth of a second.

In an embodiment, each electrode sub-assembly of the plurality M of electrode sub-assemblies 1210 includes a third signal bus crossing each electrode sub-element of the plurality of electrode sub-elements 1210; and a ground-matrix of individually addressable switches. Each addressable switch of the ground-matrix is configured to electrically couple a respective electrode sub-element of the plurality M of electrode sub-elements with the third signal bus.

In an embodiment, the device 1200 includes a first signal distribution bus coupled to each first signal bus of the N instances of the electrode assembly sub-unit. In an embodiment, the first signal distribution bus is carried by the piezoelectric substrate. In an embodiment, the first signal distribution bus is fabricated on the piezoelectric substrate. In an embodiment, the device includes a second signal distribution bus coupled to each second bus of the N instances of the electrode assembly sub-unit. In an embodiment, the second signal distribution bus is carried by the piezoelectric substrate. In an embodiment, the second signal distribution bus is fabricated on the piezoelectric substrate. An embodiment of the first and second signal distribution buses is described in conjunction with FIG. 13 with reference to first signal distribution bus 1138 and second signal distribution bus 1139. In an embodiment, the device includes a first signal distribution bus coupled to each first signal bus of the N instances of the input electrode assembly sub-unit; and a second signal distribution bus coupled to each second signal bus of the N instances of the input electrode assembly sub-unit. In an embodiment, the device includes a switching bus coupled to each addressable switch of the first matrix of addressable switches or of the second-matrix of addressable switches. An embodiment of switching bus includes the first switching bus 224 or the second switching bus 228 described in conjunction with FIG. 3.

In an embodiment of the device 1200, the addressable switches of the configurable electrode assembly 1208 are configured to be collectively switched between a first arbitrary state and a second arbitrary state in less than one-tenth of a second. In an embodiment of the device, the addressable switches of the configurable electrode assembly are configured to be collectively switched between a first arbitrary state and a second arbitrary state in less than one-hundredth of a second. In an embodiment of the device, the addressable switches of the configurable electrode assembly are configured to be collectively switched between a first arbitrary state and a second arbitrary state in less than one millisecond. In an embodiment of the device, addressable switches of the configurable electrode assembly are configured to be collectively switched between a first arbitrary state and a second arbitrary state in less than one microsecond.

In an embodiment, the configurable electrode assembly 1208 includes a reconfigurable electrode assembly. In an embodiment, the configurable electrode assembly includes a one-time configurable electrode assembly.

In an embodiment, the device 1200 includes a switch controller 1252 configured to operate an individually addressable switch of the first matrix of addressable switches and an individually addressable switch of the second matrix of addressable switches of each of the N instances of the electrode assembly sub-units. In an embodiment, the switch controller is configured to operate the individually addressable switches in response to a signal specifying switch settings selected to implement a device characteristic. In an embodiment, the device characteristic includes at least one of a requested center frequency $f_0$, bandwidth, or transfer function. In an embodiment, the switch controller is configured to initiate a permanent one-time programming of the individually addressable switches. In an embodiment, the switch controller is configured to initiate a state change of individually addressable switches. For example, a state change may include changing an individual switch or group of switches from a conducting state to a non-conducting state, or versa visa.

In an embodiment, the device 1200 includes a switch controller 1252 configured to operate an individually addressable switch of the first matrix of addressable switches and an individually addressable switch of the second matrix of addressable switches of each of the N instances of the electrode assembly sub-unit.

In an embodiment, the device 1200 includes a configuration manager 1254 configured to (i) receive a request for a device characteristic, and (ii) select settings of the first and second-matrices of addressable switches of each of the N instances of the electrode assembly sub-units implementing the requested device characteristic. In an embodiment, the device characteristic includes an amplitude or phase response. In an embodiment, the device characteristic includes an arbitrary device characteristic. In an embodiment, the (ii) select settings may be implemented using a selection algorithm. In an embodiment, the (ii) select settings includes (a) select an electrode pattern predicted or likely to produce the device characteristic and (b) select settings of the first and second-matrices of addressable switches of each of the N instances of the electrode assembly sub-units implementing the selected electrode pattern in the electrode sub-elements. In an embodiment, the configuration manager is configured to select an optimized electrode pattern. In an embodiment, the configuration manager is configured to select the electrode pattern in response to a library 1256 of at least two selectable device characteristics. In an embodiment, the configuration manager is configured to select the electrode pattern in response to a modeled interaction of the electrode sub-elements. In an embodiment, the modeled interaction includes stray capacitances. In an embodiment, the configuration manager is configured to select the electrode pattern response to a measured interaction of the electrode sub-elements. In an embodiment, the configuration manager is configured to select an electrode pattern in response to a closed-loop configuration. The selection including supplying one or more test settings, measuring a performance of the configurable electrode assembly with the test settings applied to the electrode sub-elements, and altering the test settings in response to the measured performance to converge on optimized selected settings implementing the requested device characteristic. In an embodiment, the configuration manager is configured to select the electrode pattern in response to a real time feedback loop monitoring a performance by the configurable electrode assembly with respect to the requested device characteristic, implementing a change in the settings, and then evaluating the performance by the configurable electrode assembly with the changed settings with respect to the requested device characteristic. For example, the real time feedback loop includes a real time feedback loop performing trial runs during a call or transmit/receive change over. In an embodiment, the configuration manager is further configured to output a signal specifying the selected settings.

In an embodiment, the device 1200 includes the library 1256 of at least two selectable device characteristics. Each selectable filter characteristic of the at least two selectable device characteristics includes settings of the addressable switches of the configurable electrode assembly 1208 implementing a device characteristic. For example, a device characteristic may include at least one of a requested center frequency $f_0$, bandwidth, or transfer function. In an embodiment, the library may be provided by the manufacturer of the surface acoustic wave device 1200, a third party, or from trial runs of the actual surface acoustic wave device.

In an embodiment of the device 1200 both the input electrode assembly and the output electrode assembly are fabricated on the piezoelectric substrate 1205. In an embodiment of the device, the plurality M of elongated electrode sub-elements 1210 of the configurable electrode assembly 1208 are fabricated on the piezoelectric substrate 1205, and the first signal bus and the second signal bus are fabricated on another substrate which is positioned proximate to the plurality elongated input electrode sub-elements.

In an embodiment, the device 1200 includes a receiver 1258 configured to receive a request for a device characteristic. In an embodiment, the request for the device characteristic includes requested finger positions, length, spacing, or width. In an embodiment, the request for the device characteristic includes requested settings of the first and second matrices of addressable switches of the configurable electrode assembly. In an embodiment, the request includes a request for a stored electrode pattern.

Figure 15:
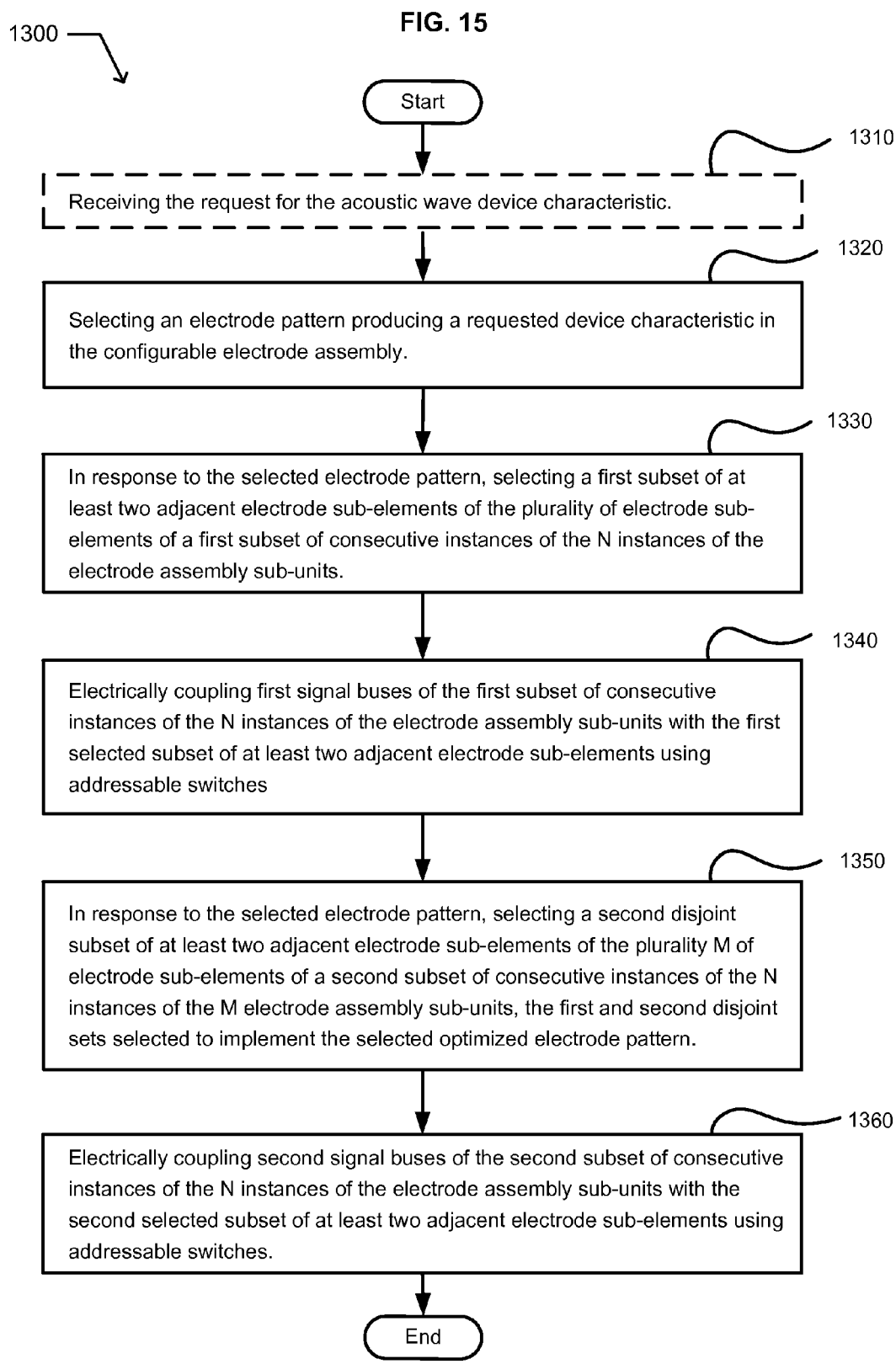
FIG. 15 illustrates an example operational flow 1300 implemented in a configurable electrode assembly of a surface acoustic wave device.

FIG. 15 illustrates an example operational flow 1300 implemented in a configurable electrode assembly of a surface acoustic wave device. The configurable electrode assembly including a stack assemblage of N instances of an electrode assembly sub-unit. Each electrode assembly sub-unit including a plurality M of elongated electrode sub-elements electromechanically coupled with a piezoelectric substrate. In an embodiment, each elongated electrode sub-element has a width of less than $\lambda/8$. In an embodiment, the configurable electrode assembly may include the configurable electrode assembly 1208 described in conjunction with FIG. 12.

After a start operation, the operational flow 1300 includes a configuration operation 1320. The configuration operation includes selecting an electrode pattern producing a requested device characteristic in the configurable electrode assembly. In an embodiment, the configurable electrode assembly is an input electrode assembly or an output electrode assembly. In an embodiment, the configuration operation may be implemented using the configuration manager 1254 described in conjunction with FIG. 12. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first choosing operation 1330 includes in response to the selected electrode pattern, selecting a first subset of at least two adjacent electrode sub-elements of the plurality of electrode sub-elements of a first subset of consecutive instances of the N instances of the electrode assembly sub-units. In an embodiment, the first choosing operation may be implemented using the configuration manager 1254 described in conjunction with FIG. 12. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first effecting operation 1340 includes electrically coupling first signal buses of the first subset of consecutive instances of the N instances of the electrode assembly sub-units with the first selected subset of at least two adjacent electrode sub-elements using addressable switches. In an embodiment, each addressable switch of the first matrix of addressable switches is configured to electrically couple a respective electrode sub-element of the plurality M of electrode sub-elements with a first signal bus. The first effecting operation may be implemented using the switch controller 1252 described in conjunction with FIG. 12. A second choosing operation 1350 includes in response to the selected electrode pattern, selecting a second disjoint subset of at least two adjacent electrode sub-elements of the plurality M of electrode sub-elements of a second subset of consecutive instances of the N instances of the M electrode assembly sub-units, the first and second disjoint sets selected to implement the selected optimized electrode pattern. The second choosing operation may be implemented using the configuration manager 1254 described in conjunction with FIG. 12. In an embodiment, the second choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A second effecting operation 1360 includes electrically coupling second signal buses of the second subset of consecutive instances of the N instances of the electrode assembly sub-units with the second selected subset of at least two adjacent electrode sub-elements using addressable switches. In an embodiment, each addressable switch of the second matrix of addressable switches is configured to electrically couple a respective electrode sub-element of the plurality of electrode sub-elements with a second signal bus. The second effecting operation may be implemented using the switch controller 952 described in conjunction with FIG. 11. The operational flow includes an end operation.

In an embodiment, the operational flow 1300 includes a receiving operation 1310 for receiving the request for the surface acoustic wave device characteristic. In an embodiment, the device characteristic includes at least one of a requested center frequency $f_0$, bandwidth, or transfer function.

In an embodiment of the operational flow 1300, if the input electrode assembly includes the configurable electrode assembly, the method includes applying an input signal across the first signal buses of the first subset of consecutive instances of the N instances of the plurality of electrode assembly sub-units and the second signal buses of the second subset of consecutive instances of the N instances of the plurality of electrode assembly sub-units. In an embodiment, the operational flow includes initiating surface waves on the piezoelectric substrate having amplitude or phase characteristics that are a function of (i) the first subset of at least two adjacent electrode sub-elements of the plurality of electrode sub-elements of a first subset of consecutive instances of the N instances of the electrode assembly sub-units and (ii) the second subset of at least two adjacent electrode sub-elements of the plurality of electrode sub-elements of a second subset of at least two adjacent electrode sub-elements of the plurality of electrode sub-elements of a second subset of consecutive instances of the N instances of the electrode assembly sub-units.

In an embodiment of the operational flow 1300, if the output electrode assembly includes the configurable electrode assembly, the method includes receiving a surface acoustic wave initiated by the input electrode assembly and generating an electrical signal in response thereto across the first signal buses of the first subset of consecutive instances of the N instances of the plurality of electrode assembly sub-units and the second signal buses of the second subset of consecutive instances of the N instances of the plurality of electrode assembly sub-units. In an embodiment, the generated electrical signal has amplitude or phase characteristics that are a function of (i) the first subset of at least two adjacent electrode sub-elements of the plurality of electrode sub-elements of a first subset of consecutive instances of the N instances of the electrode assembly sub-units and (ii) the second subset of at least two adjacent electrode sub-elements of the plurality of electrode sub-elements of a second subset of at least two adjacent electrode sub-elements of the plurality of electrode sub-elements of a second subset of consecutive instances of the N instances of the electrode assembly sub-units.

Figure 16:
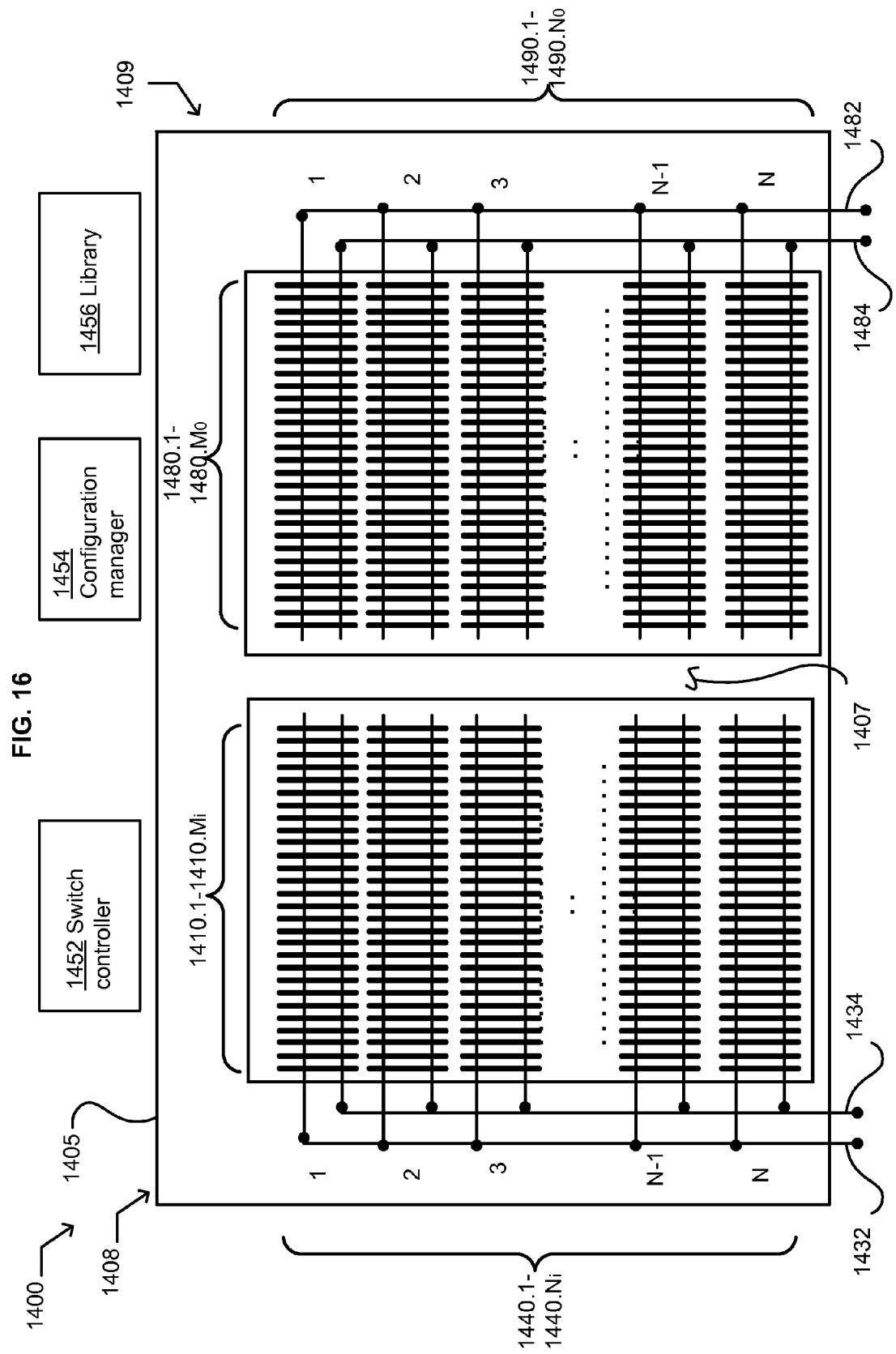
FIG. 16 illustrates an example surface acoustic wave device 1400.

FIG. 16 illustrates an example surface acoustic wave device 1400. The surface acoustic wave device includes a piezoelectric substrate 1405. The surface acoustic wave device includes a configurable input electrode assembly 1408. In an embodiment, once programmed or configured, the configurable input electrode assembly electromechanically coupled with the piezoelectric substrate may be described as an input interdigital transducer. In an embodiment, the configurable input electrode assembly including a stack assemblage 1440 of $N_i$ instances of input electrode assembly sub-units. The $N_i$ instances of electrode assembly sub-units are illustrated as electrode assembly sub-units 1440.1-1440.$N_i$. Each input electrode assembly sub-unit includes a plurality $M_i$ of elongated input electrode sub-elements electromechanically coupled with the piezoelectric substrate. The plurality $M_i$ of spaced-apart elongated electrode sub-elements of an electrode assembly sub-unit are illustrated in FIG. 16 as electrode sub-elements 1410.1-1410.$M_i$. For example, an embodiment of an electrode assembly sub-unit is described in conjunction with FIG. 8 by the configurable electrode assembly 708 where $M_i$=16. See also FIG. 11. Each input electrode assembly sub-unit includes a first input signal bus, crossing each of the input electrode sub-elements of the plurality of input electrode sub-elements, and electrically isolated therefrom. For example, the first input signal bus of each of the of $N_i$ instances of input electrode assembly sub-units is at least similar to the first signal bus 1132.1 described in conjunction with FIG. 13. Each input electrode assembly sub-unit includes a second input signal bus crossing each of the input electrode sub-elements of the plurality of input electrode sub-elements, and electrically isolated therefrom. For example, the second input signal bus of each of the of $N_i$ instances of input electrode assembly sub-units is at least similar to the second signal bus 1136.1 described in conjunction with FIG. 13. Each input electrode assembly sub-unit includes a first input-matrix of individually addressable switches. Each addressable switch of the first input-matrix is configured to electrically couple a respective input electrode sub-element of the plurality of input electrode sub-elements with the first input signal bus. Each input electrode assembly sub-unit includes a second input-matrix of individually addressable switches. Each addressable switch of the second input-matrix is configured to electrically couple a respective input electrode sub-element of the plurality of input electrode sub-elements with the second input signal bus. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. For example, an embodiment of the first matrix of individually addressable switches and the second matrix of individually addressable switches of an electrode assembly sub-unit are described in conjunction with FIG. 3 as the first matrix of individually addressable switches 222 and the second matrix of individually addressable switches 226 of the configurable electrode assembly 208.

The surface acoustic wave device 1400 includes a configurable output electrode assembly 1409. In an embodiment, once programmed or configured, the configurable output electrode assembly electromechanically coupled with the piezoelectric substrate may be described as an output interdigital transducer. In an embodiment, the configurable output electrode assembly includes a stack assemblage 1490 of $N_O$ instances of output electrode assembly sub-units. The $N_O$ instances of electrode assembly sub-units are illustrated as electrode assembly sub-units 1490.1-1490.$N_O$. Each output electrode assembly sub-unit includes a plurality $M_O$ of elongated output electrode sub-elements electromechanically coupled with the piezoelectric substrate. The plurality $M_O$ of spaced-apart elongated electrode sub-elements of an electrode assembly sub-unit are illustrated in FIG. 16 as electrode sub-elements 1480.1-1480.$M_O$. For example, an embodiment of an electrode assembly sub-unit is described in conjunction with FIG. 8 by the configurable electrode assembly 708 where $M_O$=16. See also FIG. 11. Each output electrode assembly sub-unit includes a first output signal bus, crossing each of the output electrode sub-elements of the plurality of output electrode sub-elements, and electrically isolated therefrom. For example, the first output signal bus of each of the $N_O$ instances of output electrode assembly sub-units is at least similar to the first signal bus 1132.1 described in conjunction with FIG. 13. Each output electrode assembly sub-unit includes a second output signal bus crossing each of the output electrode sub-elements of the plurality of output electrode sub-elements, and electrically isolated therefrom. For example, the second output signal bus of each of the $N_O$ instances of output electrode assembly sub-units is at least similar to the second signal bus 1136.1 described in conjunction with FIG. 13. Each output electrode assembly sub-unit includes a first output-matrix of individually addressable switches. Each addressable switch of the first output-matrix is configured to electrically couple a respective output electrode sub-element of the plurality of output electrode sub-elements with the first output signal bus. Each output electrode assembly sub-unit includes a second output-matrix of individually addressable switches. Each addressable switch of the second output-matrix is configured to electrically couple a respective output electrode sub-element of the plurality of output electrode sub-elements with the second output signal bus. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. For example, an embodiment of the first matrix of individually addressable switches and the second matrix of individually addressable switches of an electrode assembly sub-unit are described in conjunction with FIG. 3 as the first matrix of individually addressable switches 222 and the second matrix of individually addressable switches 226 of the configurable electrode assembly 208.

In an embodiment, the surface acoustic wave device 1400 device includes a surface wave propagating region 1407 of the piezoelectric substrate 1405. In an embodiment, the surface wave propagating region is located in a propagation path between the input electrode assembly 1408 and the output electrode assembly 1409.

In an embodiment, the plurality $M_i$ of input sub-elements 1410 each have a width of less than $\lambda/8$ (where the surface acoustic wavelength $\lambda$ on the piezoelectric substrate=acoustic wave velocity $V_{SAW}$/center frequency $f_0$ of the device). In an embodiment, the plurality of $M_i$ input electrode sub-elements are each respectively transversely spaced-apart a distance of less than $\lambda/16$. In an embodiment, the stack assemblage of the $N_i$ instances of the input electrode assembly sub-unit includes each input electrode sub-element with a same $M_i$ index number in a common alignment.

In an embodiment of the surface acoustic wave device 1400, the plurality $M_O$ of output sub-elements each have a width of less than $\lambda/8$ (where the surface acoustic wavelength on the piezoelectric substrate=acoustic wave velocity $V_{SAW}$/center frequency $f_0$ of the device). In an embodiment, the plurality of $M_O$ output electrode sub-elements are each respectively transversely spaced-apart a distance of less than $\lambda/16$.

In an embodiment of the surface acoustic wave device 1400, stack assemblage of the $N_O$ instances of the output electrode assembly sub-unit includes a centerline of an elongated length of each output electrode sub-element with a same $M_O$ index number aligned on a common centerline.

In an embodiment, the surface acoustic wave device 1400 includes a first input signal distribution bus 1432 coupled to each first input signal bus of the $N_i$ instances of the input electrode assembly sub-unit; and a second input signal distribution bus 1434 coupled to each second input bus of the $N_i$ instances of the input electrode assembly sub-unit. In an embodiment, the surface acoustic wave device includes a first output signal distribution bus 1482 coupled to each first output signal bus of the $N_O$ instances of the output electrode assembly sub-unit; and a second output signal distribution bus 1484 coupled to each second output bus of the $N_O$ instances of the output electrode assembly sub-unit.

In an embodiment, the surface acoustic wave device 1400 includes an input switching bus coupled to each addressable switch of the first input-matrix of addressable switches and of the second input-matrix of addressable switches. In an embodiment, the surface acoustic wave device includes an output switching bus coupled to each addressable switch of the first output-matrix of addressable switches and of the second output-matrix of addressable switches. An embodiment of a switching bus is illustrated by the first switching bus 224 or the second switching bus 228 described in conjunction with FIG. 3.

In an embodiment of the surface acoustic wave device 1400, if a first subset of at least two adjacent input electrode sub-elements of the plurality $M_i$ of input electrode sub-elements of a first subset of consecutive instances of the $N_i$ instances of the plurality input electrode assembly sub-units are electrically coupled with their respective first input signal buses by their respective first input addressable switches, and if a second subset of at least two adjacent input electrode sub-elements of the plurality $M_i$ of input electrode sub-elements of a second subset of consecutive instances of the $N_i$ instances of the plurality input electrode assembly sub-units are electrically coupled with their respective second input signal buses by their respective second addressable switches, the second subset of consecutive instances of at least two adjacent input electrode sub-elements not including any members of the first subset of consecutive instances of at least two adjacent input electrode sub-elements, the input electrode assembly 1408 is configured to initiate surface waves on the piezoelectric substrate 1405 in response to a signal applied across the first input signal distribution bus 1432 and the second input signal distribution bus 1434. In an embodiment, the surface waves on the piezoelectric substrate have amplitude or phase characteristics that are a function of the first subset of at least two adjacent input electrode sub-elements and the second subset of at least two adjacent input electrode sub-elements. In an embodiment, the first subset of at least two adjacent input electrode sub-elements of the input electrode sub-elements includes at least five adjacent input electrode sub-elements.

In an embodiment of the surface acoustic wave device 1400, if a first subset of at least two adjacent output electrode sub-elements of the plurality $M_O$ of output electrode sub-elements of a first subset of consecutive instances of the $N_O$ instances of the plurality output electrode assembly sub-units are electrically coupled with their respective first output signal buses by their respective first output addressable switches, and if a second subset of at least two adjacent output electrode sub-elements of the plurality $M_O$ of output electrode sub-elements of a second subset of consecutive instances of the $N_O$ instances of the plurality of output electrode assembly sub-units are electrically coupled with their respective second output signal buses by their respective second output addressable switches, the second subset of consecutive instances of at least two adjacent output electrode sub-elements not including any members of the first subset of consecutive instances of at least two adjacent output electrode sub-elements, the output electrode assembly 1409 is configured to receive a surface wave and generate an electrical signal in response thereto across the first output signal distribution bus 1482 and the second output signal distribution bus 1484. In an embodiment, the generated electrical signal has amplitude or phase characteristics that are a function of the first subset of consecutive instances of the instances of the plurality $N_O$ of output electrode assembly sub-units and the second subset of consecutive instances of the instances of the plurality $N_O$ of output electrode assembly sub-units.

Figure 17:
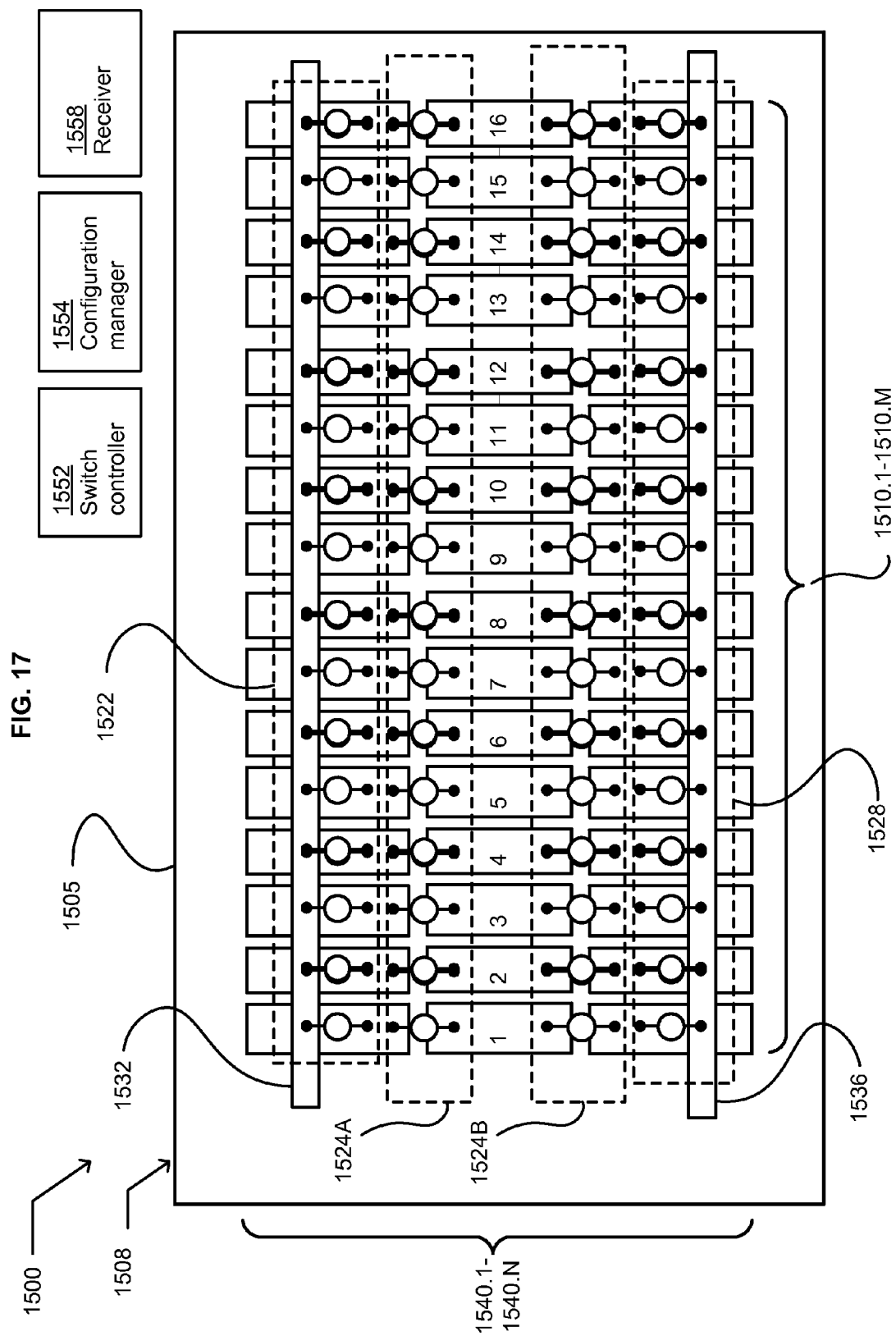
FIG. 17 illustrates a surface acoustic wave device 1500.

FIG. 17 illustrates a surface acoustic wave device 1500. The surface wave device includes a piezoelectric substrate 1505 and a configurable electrode assembly 1508. The configurable electrode assembly includes an array including N rows of M elongated electrode sub-elements. The M elongated electrode sub-elements are illustrated as elongated electrode sub-elements 1510.0-1510.M. The elongated electrode sub-elements electrically isolated from each other, and electromechanically coupled with the piezoelectric substrate. The M elongated electrode sub-elements of the N rows are arranged end-to-end in columns. The N rows are illustrated as rows 1540.1-1540.N. While the surface acoustic wave device is illustrated with N=3, in various embodiments N is greater than three. For example, in an embodiment, N=5. In another embodiment, N=10. In another embodiment, N=50. The configurable electrode assembly includes a first signal bus 1532 proximate to the first row 1540.1 of the N rows of M elongated electrode sub-elements and electrically isolated therefrom. The configurable electrode assembly includes a first matrix of individually row addressable switches 1522. Each addressable row switch of the first matrix is configured to electrically couple the first signal bus with a respective electrode sub-element of the first row of electrode sub-elements. The configurable electrode assembly includes a second signal bus 1536 proximate to the $N^{th}$ row of the N rows of the M elongated electrode sub-elements and electrically isolated therefrom. The configurable electrode assembly includes a second matrix of individually addressable row switches 1528. Each addressable row switch of the second matrix is configured to electrically couple the second signal bus with a respective electrode sub-element of the $N^{th}$ row of electrode sub-elements. The configurable electrode assembly includes a plurality of individually addressable column switches. The individually addressable column switches are illustrated by a first row of at least two individually addressable column switches 1524A and a second row of at least two individually addressable column switches 1524B. Each individually addressable column switch is respectively configured to electrically couple an elongated electrode of a column of the M columns with an end-to-end adjacent elongated electrode of the same column of the M columns.

In an embodiment, the surface acoustic wave device 1500 includes a Rayleigh surface acoustic wave device. In an embodiment, the surface acoustic wave device includes a pseudo surface acoustic wave device. In an embodiment, the first signal bus is carried by the piezoelectric substrate. In an embodiment, the first signal bus is deposited on the piezoelectric substrate. In an embodiment, the second signal bus is carried by the piezoelectric substrate. In an embodiment, the second signal bus is deposited on the piezoelectric substrate.

In an embodiment of the surface acoustic wave device 1500, each elongated electrode sub-element of the plurality M of elongated electrode sub-elements has a width of not more than $\lambda/4$. (where the surface acoustic wavelength $\lambda$ on the piezoelectric substrate=acoustic wave velocity $V_{SAW}$/ center frequency $f_0$ of the device). In an embodiment, each elongated electrode sub-element has a width of not more than $\lambda/8$.

In an embodiment, the surface acoustic wave device 1500 includes a switch controller 1552 configured to operate an addressable row switch of the first matrix of addressable row switches 1522, an addressable row switch of the second matrix of addressable row switches 1528, or an individually addressable column switch of the at least two individually addressable column switches, illustrated by a first row of at least two individually addressable column switches 1524A and a second row of at least two individually addressable column switches 1524B.

In an embodiment, the surface acoustic wave device 1500 includes a configuration manager 1554 configured to (i) receive a request for a device characteristic, and (ii) select settings of the first matrix of addressable row switches, the second matrix of addressable row switches and the plurality of individually addressable column switches implementing the requested device characteristic. In an embodiment, the request for device characteristic includes a request for an amplitude or phase response by the surface acoustic wave device. In an embodiment, the request for device characteristic includes a request for an arbitrary device characteristic. In an embodiment, the surface acoustic wave device 1500 includes a receiver 1558 configured to receive a requested device characteristic.

Figure 18:
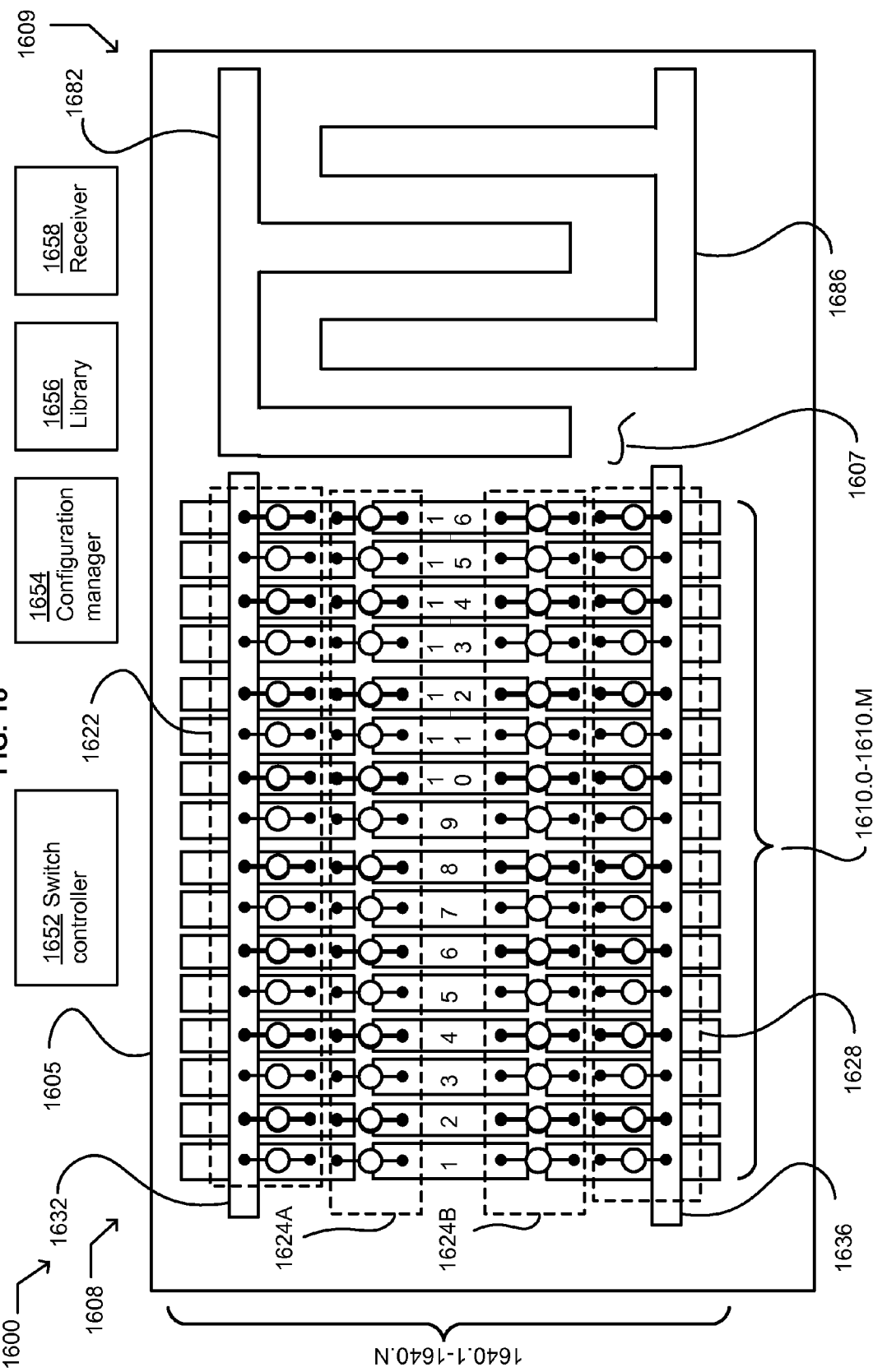
FIG. 18 illustrates an example surface acoustic wave device 1600.

FIG. 18 illustrates an example surface acoustic wave device 1600. The surface acoustic wave device includes a piezoelectric substrate 1605. The surface acoustic wave device includes an input electrode assembly and an output electrode assembly. In an embodiment, once programmed or configured, the input electrode assembly electromechanically coupled with the piezoelectric substrate may be described as an input interdigital transducer. In an embodiment, once programmed or configured, the output electrode assembly electromechanically coupled with the piezoelectric substrate may be described as an output interdigital transducer. The surface acoustic wave device includes a surface wave propagating region 1607 of the piezoelectric substrate. In an embodiment, the surface wave propagating region is located in a propagation path between the input electrode assembly and the output electrode assembly.

The surface acoustic wave device 1600 includes a configurable electrode assembly 1608 and another electrode assembly, illustrated by a fixed electrode 1609. In the surface acoustic wave device, the input electrode assembly or the output electrode assembly includes the configurable electrode assembly. In an embodiment, the another electrode assembly may include another configurable electrode assembly or a fixed electrode assembly. The fixed electrode assembly includes a first fixed electrode 1682, and a second fixed electrode 1686.

The configurable electrode assembly 1608 includes an array including N rows of M elongated electrode sub-elements. The M elongated electrode sub-elements are illustrated as elongated electrode sub-elements 1610.0-1610.M. The elongated electrode sub-elements electrically isolated from each other, and electromechanically coupled with the piezoelectric substrate. The M elongated electrode sub-elements of the N rows are arranged end-to-end in columns. The N rows are illustrated as rows 1640.1-1640.N. While the surface acoustic wave device is illustrated with N=3, in various embodiments N is greater than three. For example, in an embodiment, N=5. In another embodiment, N=10. In another embodiment, N=50. The configurable electrode assembly includes a first signal bus 1632 proximate to the first row 1640.1 of the N rows of M elongated electrode sub-elements and electrically isolated therefrom. The configurable electrode assembly includes a first matrix of individually row addressable switches 1622. Each addressable row switch of the first matrix is configured to electrically couple the first signal bus with a respective electrode sub-element of the first row of electrode sub-elements. The configurable electrode assembly includes a second signal bus 1636 proximate to the $N^{th}$ row of the N rows of the M elongated electrode sub-elements and electrically isolated therefrom. The configurable electrode assembly includes a second matrix of individually addressable row switches 1628. Each addressable row switch of the second matrix is configured to electrically couple the second signal bus with a respective electrode sub-element of the $N^{th}$ row of electrode sub-elements. The configurable electrode assembly includes a plurality of individually addressable column switches. The individually addressable column switches are illustrated by a first row of at least two individually addressable column switches 1624A and a second row of at least two individually addressable column switches 1624B. Each individually addressable column switch is respectively configured to electrically couple an elongated electrode of a column of the M columns with an end-to-end adjacent elongated electrode of the same column of the M columns.

In an embodiment of surface acoustic wave device 1600, if the input electrode assembly includes the configurable electrode assembly 1608, if a first selected electrode sub-element in the first row 1640.1 of the N rows of the plurality M of electrode sub-elements (a first base electrode sub-element) is electrically coupled to the first signal bus 1632, if a first selected subset of electrode sub-elements in an end-to-end alignment with the first base electrode sub-element and located in adjacent consecutive rows of the N rows of the electrode assembly sub-units are electrically coupled with the first base electrode sub-element by their respective individually addressable column switches, if a second selected electrode sub-element in the $N^{th}$ row 1640.N of the N rows of the plurality M of electrode sub-elements (a second base electrode sub-element) is electrically coupled to the second signal bus 1636, if a second selected subset of electrode sub-elements in an end-to-end alignment with the second base electrode sub-element and located in adjacent consecutive rows of the N rows of the electrode assembly sub-units are electrically coupled with the second base electrode sub-element by their respective individually addressable column switches, the configurable electrode assembly is configured in response to a signal applied across the first signal bus and the second signal bus to initiate surface waves on the piezoelectric substrate having amplitude or phase characteristics that are a function of (i) the first base electrode sub-element and the first selected subset of adjacent consecutive rows and (ii) the second base electrode sub-element and the second selected subset of adjacent consecutive rows. In an embodiment, the second base electrode sub-element is separated from the first base electrode sub-element by a selected transverse distance. In an embodiment, the selected transverse distance is at least $\lambda/4$. In an embodiment, the selected transverse distance is less than $\lambda/4$. In an embodiment, the first selection of at least two adjacent input electrode sub-elements of the M input electrode sub-elements includes at least five end-to-end adjacent input electrode sub-elements.

In an embodiment in use, for example, if the electrode sub-element 1610.2 of the row 1640.1 is selected as the first base electrode sub-element and coupled to the first signal bus 1632, if the electrode sub-element 1610.2 of the row 1640.2 and the electrode sub-element 1610.2 of the row 1640.N are selected as a first subset of electrode sub-elements in an end-to-end alignment with the first base electrode sub-element and electrically coupled with their respective individually addressable column switches of the first row of at least two individually addressable column switches 1524A and a second row of at least two individually addressable column switches 1524B, if the electrode sub-element 1610.4 of the row 1640.N is selected as the second base electrode sub-element and coupled to the second signal bus 1636, if the electrode sub-element 1610.4 of the row 1640.2 and the electrode sub-element 1610.2 of the row 1640.1 are selected as a second subset of electrode sub-elements in an end-to-end alignment with the second base electrode sub-element and electrically coupled with their respective individually addressable column switches of the first row of at least two individually addressable column switches 1524A and a second row of at least two individually addressable column switches 1524B, the input configurable electrode assembly is configured in response to a signal applied across the first signal bus and the second signal bus to initiate surface waves on the piezoelectric substrate having amplitude or phase characteristics that are a function of (i) the first base electrode sub-element and the first selected subset of adjacent consecutive rows and (ii) the second base electrode sub-element and the second selected subset of adjacent consecutive rows.

In an embodiment of surface acoustic wave device 1600, if the output electrode assembly includes the configurable electrode assembly 1608, if a first selected electrode sub-element in the first row 1640.1 of the N rows of the plurality of M electrode sub-elements (a first base electrode sub-element) is electrically coupled to the first signal bus 1632, if a first selected subset of electrode sub-elements in an end-to-end alignment with the first base electrode sub-element and located in adjacent consecutive rows of the N rows of the electrode assembly sub-units are electrically coupled with the first base electrode sub-element by their respective individually addressable column switches, if a second selected electrode sub-element in the $N^{th}$ row 1640.N of the N rows of the plurality of M electrode sub-elements (a second base electrode sub-element) is electrically coupled to the second signal bus 1636, if a second selected subset of electrode sub-elements in an end-to-end alignment with the second base electrode sub-element and located in adjacent consecutive rows of the N rows of the electrode assembly sub-units are electrically coupled with the second base electrode sub-element by their respective individually addressable column switches, the output configurable electrode assembly is configured to receive a surface wave and generate an electrical signal in response thereto across the first signal bus and the second signal bus in response to the surface acoustic wave on the piezoelectric substrate. In an embodiment, the generated electrical signal has amplitude or phase characteristics that are a function of (i) the first base electrode sub-element and the first selected subset of adjacent consecutive rows and (ii) the second base electrode sub-element and the second selected subset of adjacent consecutive rows. In an embodiment, the first selected subset of adjacent consecutive rows of electrode sub-elements of the M input electrode sub-elements includes at least five adjacent electrode sub-elements.

In an embodiment of surface acoustic wave device 1600, the input electrode assembly includes a first configurable electrode assembly 1608 and the output electrode assembly includes a second configurable electrode assembly. In an embodiment of surface acoustic wave device, the input electrode assembly includes a first instance of the configurable electrode assembly and the output electrode assembly includes a second instance of the configurable electrode assembly.

In an embodiment, the surface acoustic wave device 1600 includes a switch controller 1652 configured to operate an addressable row switch of the first matrix of addressable row switches, an addressable row switch of the second matrix of addressable row switches, or an individually addressable column switch of the at least two individually addressable column switches. In an embodiment, the switch controller is configured to operate the switches in response to signal specifying switch settings selected to implement a device characteristic. In an embodiment, the configurable electrode assembly 1608 includes the switch controller.

In an embodiment, the configurable electrode assembly 1608 includes a configuration manager 1654 configured to (i) receive a request for a device characteristic, and (ii) select settings of the first matrix of addressable row switches, of the second matrix of addressable row switches, or the at least two individually addressable column switches implementing the requested device characteristic. In an embodiment, the device characteristic includes a request for an amplitude or phase response by the surface acoustic wave device. In an embodiment, the device characteristic includes an arbitrary device characteristic. In an embodiment, the (ii) select settings includes (a) select an electrode pattern predicted to produce the device characteristic and (b) select settings of the first matrix of individually addressable row switches, the second matrix of individually addressable row switches, or the at least two individually addressable column switches implementing the selected electrode pattern in the electrode sub-elements.

In an embodiment, the surface acoustic wave device 1600 includes a configuration manager 1654 configured to (i) receive a request for an device characteristic, and (ii) select settings of the first matrix of individually addressable row switches, the second matrix of individually addressable row switches, or the at least two individually addressable column switches implementing the selected electrode pattern in the electrode sub-elements implementing the requested device characteristic. In an embodiment, the configurable electrode assembly 1608 includes the configuration manager.

In an embodiment, the surface acoustic wave device 1600 includes a library 1656 of at least two selectable device characteristics. Each selectable filter characteristic of the at least two selectable device characteristics includes settings of the addressable switches of the configurable electrode assembly implementing a device characteristic that includes a requested center frequency $f_0$, bandwidth, impulse response, delay, or transfer function. In an embodiment, the surface acoustic wave device 1600 includes a receiver 1658 configured to receive a requested device characteristic.

Figure 19:
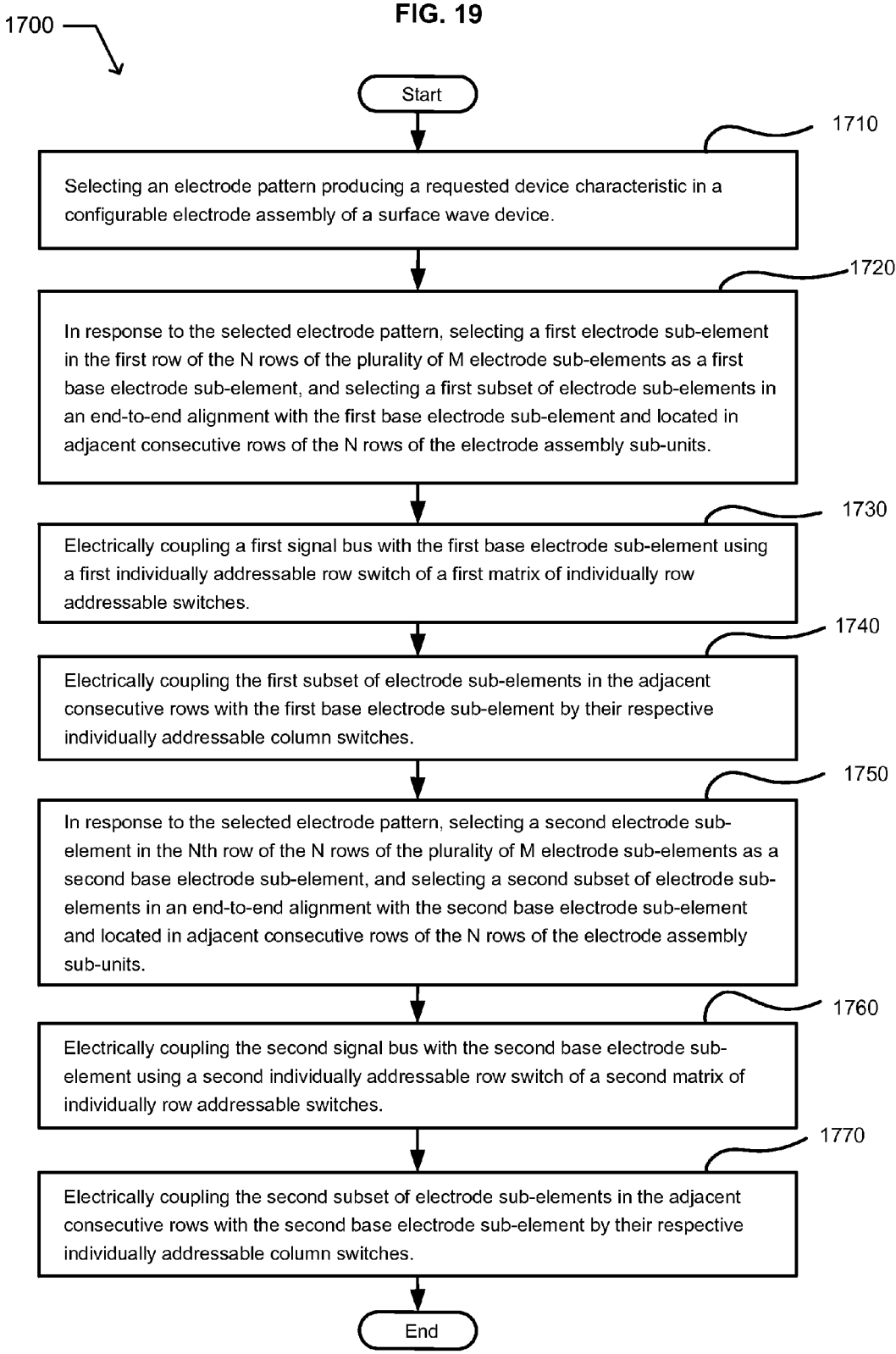
FIG. 19 illustrates an exemplary operational flow 1700 implemented in a configurable electrode assembly of a surface acoustic wave device.

FIG. 19 illustrates an exemplary operational flow 1700 implemented in a configurable electrode assembly of a surface acoustic wave device. The configurable electrode assembly including an array including N rows of M elongated electrode sub-elements, wherein the elongated electrode sub-elements electrically isolated from each other, and electromechanically coupled with the piezoelectric substrate, the M elongated electrode sub-elements of the N rows arranged end-to-end in M columns.

After a start operation, the operational flow 1700 includes a configuration operation 1710. The configuration operation includes selecting an electrode pattern producing a requested device characteristic in a configurable electrode assembly of a surface wave device. In an embodiment, the configurable electrode assembly is an input electrode assembly or an output electrode assembly. In an embodiment, the configuration operation may be implemented using the configuration manager 1654 described in conjunction with FIG. 18. In an embodiment, the configuration operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first choosing operation 1720 includes, in response to the selected optimized electrode pattern, selecting a first electrode sub-element in the first row of the N rows of the plurality of M electrode sub-elements as a first base electrode sub-element, and selecting a first subset of electrode sub-elements in an end-to-end alignment with the first base electrode sub-element and located in adjacent consecutive rows of the N rows of the electrode assembly sub-units. In an embodiment, the first choosing operation may be implemented using the configuration manager 1654 described in conjunction with FIG. 18. In an embodiment, the first choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A first base electrode effecting operation 1730 includes electrically coupling a first signal bus with the first base electrode sub-element using a first individually addressable row switch of a first matrix of individually row addressable switches. Each addressable row switch of the first matrix is configured to electrically couple the first signal bus with a respective electrode sub-element of the first row of electrode sub-elements. In an embodiment, the first base electrode effecting operation may be implemented using a first individually addressable row switch of a first matrix of individually row addressable switches 1622 described in conjunction with FIG. 18. A first finger forming operation 1740 includes electrically coupling the first subset of electrode sub-elements in the adjacent consecutive rows with the first base electrode sub-element by their respective individually addressable column switches. In an embodiment, the first finger forming operation may be implemented using the individually addressable column switches illustrated by the first row of at least two individually addressable column switches 1524A or the second row of at least two individually addressable column switches 1524B described in conjunction with FIG. 18. A second choosing operation 1750 includes, in response to the selected optimized electrode pattern, selecting a second electrode sub-element in the $N^{th}$ row of the N rows of the plurality of M electrode sub-elements as a second base electrode sub-element, and selecting a second subset of electrode sub-elements in an end-to-end alignment with the second base electrode sub-element and located in adjacent consecutive rows of the N rows of the electrode assembly sub-units. In an embodiment, the second choosing operation may be implemented using the configuration manager 1654 described in conjunction with FIG. 18. In an embodiment, the second choosing operation may be further implemented in part or in whole using the processing unit 21 and one or more components of the thin computing device 20 described in conjunction with FIG. 1, or the processor 120 and one or more components of the general purpose computing device 100 described in conjunction with FIG. 2. A second base electrode effecting operation 1760 includes electrically coupling the second signal bus with the second base electrode sub-element using a second individually addressable row switch of a second matrix of individually row addressable switches. In an embodiment, each addressable row switch of the second matrix is configured to electrically couple the second signal bus with a respective electrode sub-element of the $N^{th}$ row of electrode sub-elements. In an embodiment, the second base electrode effecting operation may be implemented using a second individually addressable row switch of a second matrix of individually row addressable switches 1628 described in conjunction with FIG. 18. A second finger forming operation 1770 includes electrically coupling the second subset of electrode sub-elements in the adjacent consecutive rows with the second base electrode sub-element by their respective individually addressable column switches. In an embodiment, the second finger forming operation may be implemented using the individually addressable column switches illustrated by the first row of at least two individually addressable column switches 1524A or the second row of at least two individually addressable column switches 1524B described in conjunction with FIG. 18. The operational flow includes an end operation. In an embodiment, the operational flow 1700 includes receiving the request for the device characteristic.

Figure 20:
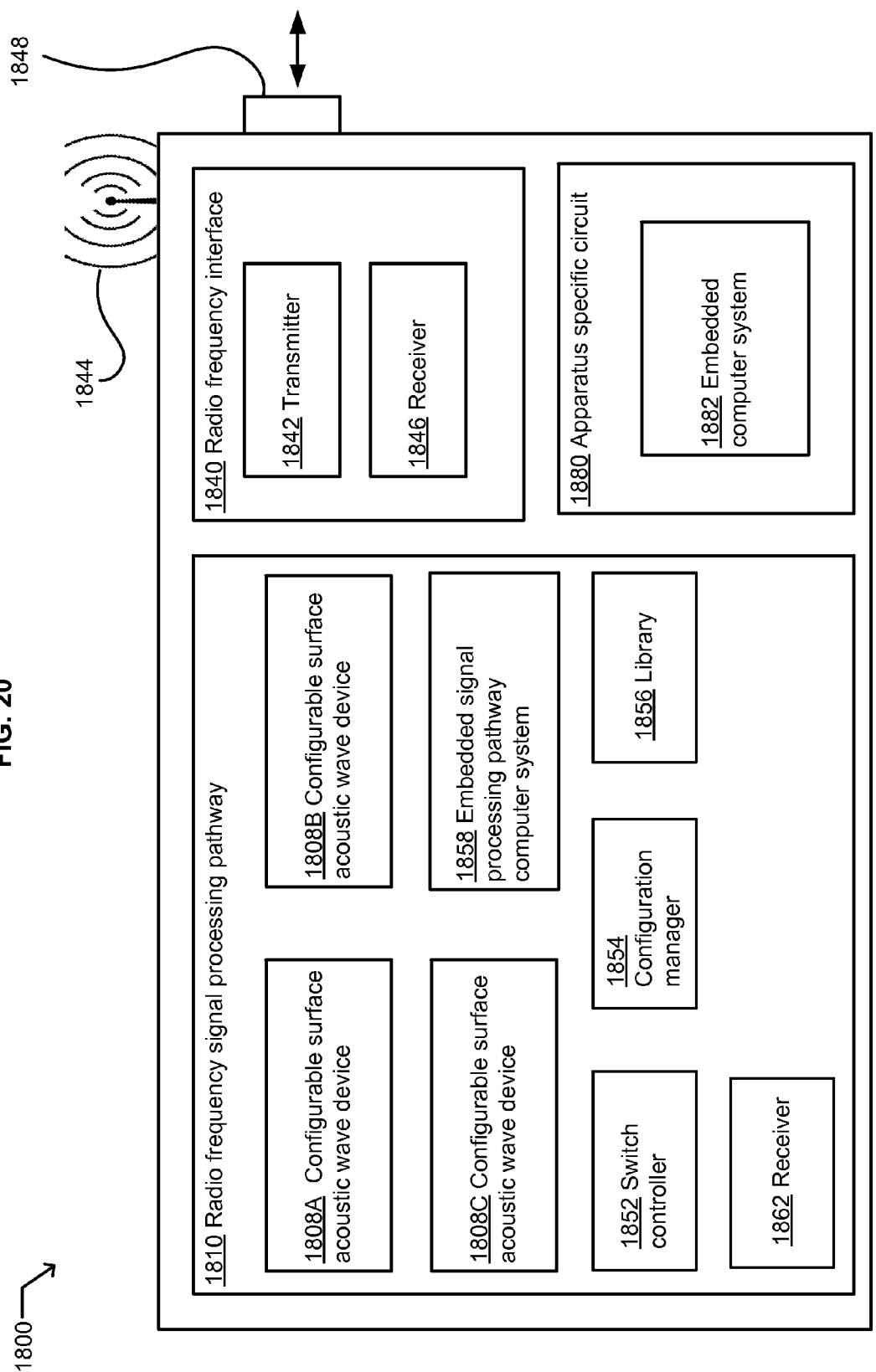
FIG. 20 illustrates an apparatus 1800.

FIG. 20 illustrates an apparatus 1800. The apparatus includes a radio frequency interface 1840 configured to receive or transmit radio frequency signals on a plurality of channels. The apparatus includes a radio frequency signal processing pathway 1810. The pathway includes at least one configurable surface acoustic wave device 1808 configured to filter or delay the radio frequency signals on at least two channels of the plurality of channels. The at least one configurable surface acoustic wave device is illustrated by configurable surface acoustic wave device 1808A, configurable surface acoustic wave device 1808B, and configurable surface acoustic wave device 1808C.

In an embodiment, the configurable surface acoustic wave device 1808 may be illustrated by reference to the configurable surface acoustic wave device 400 described in conjunction with FIG. 5. The configurable surface acoustic wave device includes the piezoelectric substrate 405, an input electrode assembly, and an output electrode assembly. The configurable surface acoustic wave device includes the surface wave propagating region 407 of the piezoelectric substrate.

Continuing with the illustration of the configurable surface acoustic wave device 1808 by reference to the configurable surface acoustic wave device 400 described in conjunction with FIG. 5, the configurable surface acoustic wave device 1808 includes the configurable electrode assembly 408 and another electrode assembly, illustrated by the fixed electrode assembly 409. In the surface acoustic wave device, the input electrode assembly or the output electrode assembly includes the configurable electrode assembly. In an embodiment, the another electrode assembly may include another configurable electrode assembly or a fixed electrode assembly. The fixed electrode assembly is illustrated by the first fixed electrode 482, illustrated in an embodiment with a first electrical contact 484, and a second fixed electrode 486, illustrated in an embodiment with a second electrical contact 488. The configurable electrode assembly 408 includes a plurality of spaced-apart elongated electrode elements 410 electromechanically coupled with the piezoelectric substrate 405. The plurality of spaced-apart elongated electrode elements 410 are illustrated by electrode elements 410.1-410.7. The configurable electrode assembly includes a first signal bus 432 proximate to each of the plurality of electrode elements, and electrically isolated therefrom. In an embodiment, an electrical contact 434 is coupled to the first signal bus. The configurable electrode assembly includes a first matrix of addressable switches 422. Each addressable switch of the first matrix of addressable switches is configured to electrically couple a respective electrode element of the plurality of electrode elements with the first signal bus. The configurable electrode assembly includes a second signal bus 436 proximate to each of the plurality of electrode elements, and electrically isolated therefrom. In an embodiment, a second electrical contact 438 is coupled to the second signal bus. The configurable electrode assembly includes a second matrix of addressable switches 426. Each addressable switch of the second matrix of addressable switches is configured to electrically couple a respective electrode element of the plurality of electrode elements with the second signal bus. The apparatus includes an apparatus specific circuitry 1880. In an embodiment of the configurable surface acoustic wave device 1808, the input electrode assembly 408 includes a first configurable electrode assembly and the output electrode assembly 409 includes a second configurable electrode assembly.

In an embodiment, the radio frequency interface 1840 is configured to receive or transmit airborne radio frequency signals on a plurality of channels, for example using an antenna 1844. In an embodiment, the radio frequency interface is configured to receive or transmit wire borne radio frequency signals on a plurality of channels, for example using the wire or cable input 1848. In an embodiment, the radio frequency interface includes a transmitter 1842. The apparatus of claim 375, wherein the radio frequency interface includes a receiver 1846.

In an embodiment, the radio frequency signal processing pathway 1810 includes the first configurable surface acoustic wave device 1808A configured to filter or delay the radio frequency signals on at least a first two channels of the plurality of channels and the second configurable surface acoustic wave device 1808B configured to filter or delay the radio frequency signals on at least a second two channels of the plurality of channels. In an embodiment, there may be a common channel included in the first two channels of the plurality of channels and the second two channels of the plurality of channels. In an embodiment, the radio frequency signal processing pathway includes the third configurable surface acoustic wave device 1808C configured to filter or delay the radio frequency signals on at least a third two channels of the plurality of channels.

In an embodiment, the radio frequency signal processing pathway 1810 including the configurable surface acoustic wave device 1808 are configured to tailor a frequency space response to a channel. For example, a tailored frequency response in a channel may be implemented based upon which neighboring channels are occupied. In an embodiment, the radio frequency signal processing pathway including the configurable surface acoustic wave device are configured to shift a receiving or transmitting transducer along the device axis, which would change the overall delay from input to output. For example, such a shift will be useful in adjusting the delay to maintain time and phase matching between multiple channels, or in maintaining a constant delay with temperature variations, or for relatively large shifts, changing the dispersion (delay vs. frequency) characteristics of a surface acoustic wave device.

In an embodiment, the apparatus specific circuit 1880 includes a mobile communications specific circuit. In an embodiment, the apparatus specific circuit includes a smart phone specific circuit. In an embodiment, the apparatus specific circuit includes a cellular communication specific circuit. In an embodiment, the apparatus specific circuit includes a global positioning system specific circuit. In an embodiment, the apparatus specific circuit includes a radar specific circuit. In an embodiment, the apparatus specific circuit includes a cable or wireless modem specific circuit. In an embodiment, the apparatus specific circuit includes an optical fiber communication system specific circuit. In an embodiment, the apparatus specific circuit includes a wireless hub or base station specific circuit. In an embodiment, the apparatus specific circuit includes a cellular communications system specific circuit.

In an embodiment, the radio frequency signal processing pathway 1810 includes a switch controller 1852 coupled to an addressable switch of the first matrix of addressable switches and an addressable switch of the second matrix of addressable switches of the configurable electrode assembly 1808. In an embodiment, the radio frequency signal processing pathway includes a configuration manager 1854 configured to (i) receive a request for a filter characteristic, and (ii) select settings of the first and second matrices of addressable switches of the configurable electrode assembly implementing the requested filter characteristic. In an embodiment, the radio frequency signal processing pathway includes an embedded signal processing pathway computer system 1858. In an embodiment, the radio frequency signal processing pathway includes a library 1856 of at least two selectable filter characteristics. Each selectable filter characteristic of the at least two selectable filter characteristics includes settings of the addressable switches of the configurable electrode assembly implementing a filter characteristic that includes at least one of a requested center frequency $f_0$, bandwidth, or transfer function.

In an embodiment, the apparatus specific circuit 1880 includes an embedded computer system 1882. For example, the embedded signal processing pathway computer system 1858 or the embedded computer system 1882 may include the processing unit 21 and one or more components of the thin computing device 20 described in conjunction with FIG. 1. For example, the embedded signal processing pathway computer system 1858 or the embedded computer system 1882 may include the processor 120 and one or more components of the general purpose computing device 100 described in conjunction with FIG. 2.

In an embodiment, the radio frequency signal processing pathway includes a receiver 1862 configured to receive a request for a filter characteristic. In an embodiment, the request for the filter characteristic includes a requested finger positions, length, spacing, or width. In an embodiment, the request for the filter characteristic includes requested settings of the first and second matrices of addressable switches of the configurable electrode assembly.

Figure 21:
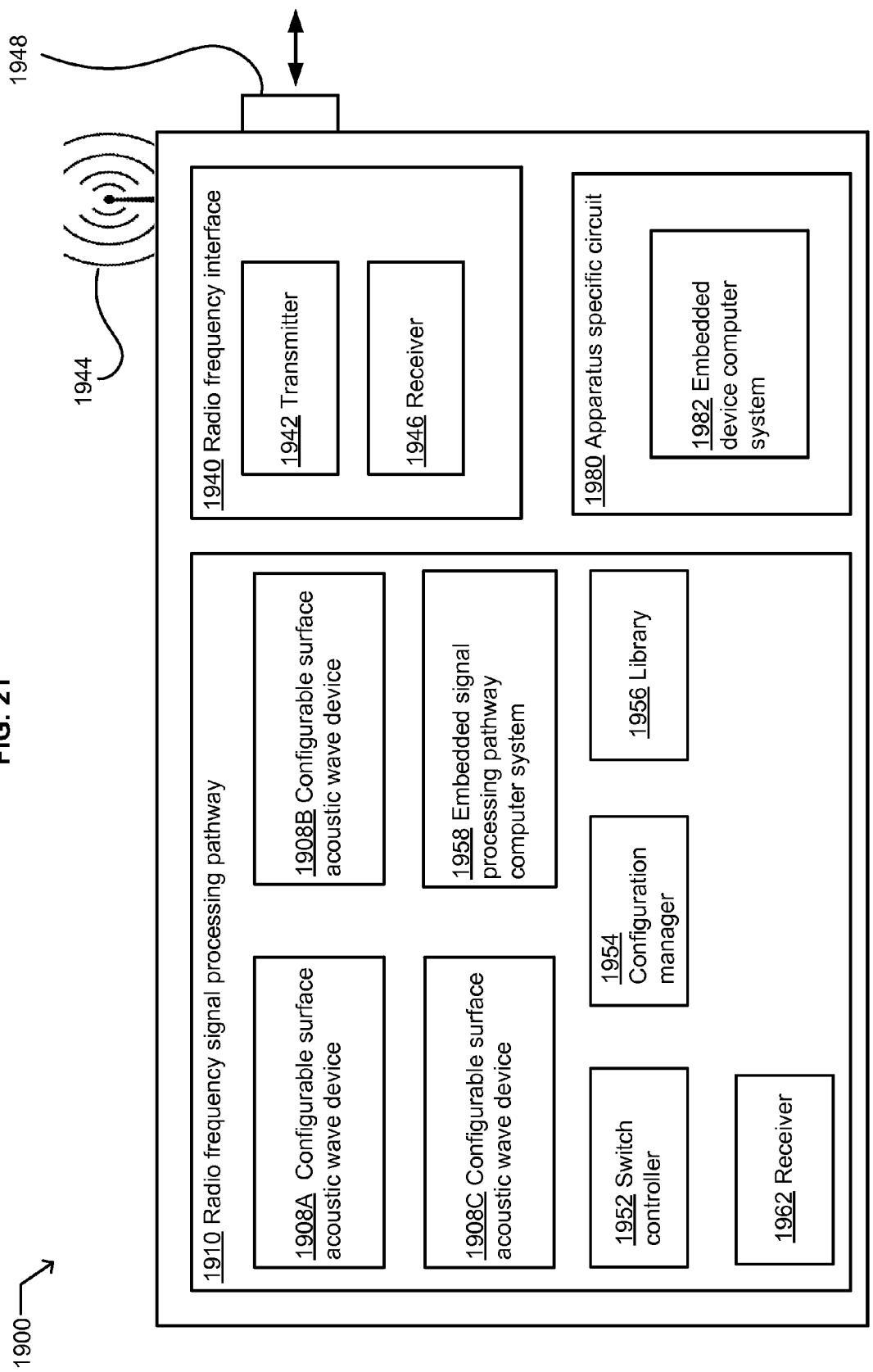
FIG. 21 illustrates an apparatus 1900.

FIG. 21 illustrates an apparatus 1900. The apparatus includes a radio frequency interface 1940 configured to receive or transmit radio frequency signals on a plurality of channels. The apparatus includes a radio frequency signal processing pathway 1910. In an embodiment, the radio frequency processing pathway is configured to process radio frequency signals between about 30 MHz and 3 GHz. The pathway includes at least one configurable surface acoustic wave device 1908 configured to filter or delay the radio frequency signals on at least two channels of the plurality of channels. In an embodiment, the plurality of channels includes a plurality of preset channels. For example, a plurality of preset channels may include a plurality of preset channels of a cellular communication network. For example, a plurality of preset channels may include a plurality of preset channels of an optical fiber system. The at least one configurable surface acoustic wave device is illustrated by configurable surface acoustic wave device 1908A, configurable surface acoustic wave device 1908B, and configurable surface acoustic wave device 1908C.

In an embodiment, the configurable surface acoustic wave device 1908 may be illustrated by reference to the configurable surface acoustic wave device 1200 described in conjunction with FIG. 14. The configurable surface acoustic wave device includes the piezoelectric substrate 1205, an input electrode assembly, and an output electrode assembly. The configurable surface acoustic wave device includes the surface wave propagating region 1207 of the piezoelectric substrate located in a propagation path between the input electrode assembly and the output electrode assembly.

Continuing with the illustration of the configurable surface acoustic wave device 1908 by reference to the configurable surface acoustic wave device 1200 described in conjunction with FIG. 14, the configurable surface acoustic wave device 1908 includes the configurable electrode assembly 1208 and another electrode assembly, illustrated by the fixed electrode assembly 1209. In the surface acoustic wave device, the input electrode assembly or the output electrode assembly includes the configurable electrode assembly. In an embodiment, the another electrode assembly may include another configurable electrode assembly or a fixed electrode assembly. The fixed electrode assembly is illustrated by the first fixed electrode 1282, and the second fixed electrode 1286. The configurable electrode assembly 1208 includes a stack assemblage 1240 of N instances of electrode assembly sub-units. The N instances of electrode assembly sub-units are illustrated as electrode assembly sub-units 1240.1-1240.N. Each electrode assembly sub-unit including a plurality M of spaced-apart elongated electrode sub-elements 1210 electromechanically coupled with the piezoelectric substrate. The plurality M of spaced-apart elongated electrode sub-elements of an electrode assembly sub-unit are illustrated in FIG. 14 as electrode sub-elements 1210.1-1210.M. For example, an embodiment of an electrode assembly sub-unit is described in conjunction with FIG. 8 by the configurable electrode assembly 708 where M=16. See also FIG. 11. Each electrode assembly sub-unit of the configurable electrode assembly includes a first signal bus proximate to each of the electrode sub-elements of the plurality M of electrode sub-elements and is electrically isolated therefrom. For example, the first signal bus of the electrode assembly sub-unit 1240.1 is described in conjunction with FIG. 13 by the first signal bus 1132.1. Each electrode assembly sub-unit of the configurable electrode assembly includes a second signal bus proximate to each of the electrode sub-elements of the plurality M of electrode sub-elements and is electrically isolated therefrom. For example, the second signal bus of the electrode assembly sub-unit 1240.1 is described in conjunction with FIG. 13 by the second signal bus 1136.1. For example, an embodiment of the first signal bus and the second signal bus of an electrode assembly sub-unit is described in conjunction with FIG. 8 as the first signal bus 732 and the second signal bus 736 of the configurable electrode assembly 708. Each electrode assembly sub-unit of the configurable electrode assembly 1208 includes a first matrix of individually addressable switches. Each addressable switch of the first matrix is configured to electrically couple a respective electrode sub-element of the plurality M of electrode sub-elements with the first signal bus. Each electrode assembly sub-unit of the configurable electrode assembly includes a second matrix of individually addressable switches. Each addressable switch of the second matrix is configured to electrically couple a respective electrode sub-element of the plurality M of electrode sub-elements with the second signal bus. For example, an embodiment of the first matrix of individually addressable switches and the second matrix of individually addressable switches of an electrode assembly sub-unit are described in conjunction with FIG. 8 as the first matrix of individually addressable switches 722 and the second matrix of individually addressable switches 726 of the configurable electrode assembly 708. For example, an embodiment of the first matrix of individually addressable switches and the second matrix of individually addressable switches of an electrode assembly sub-unit are described in conjunction with FIG. 3 as the first matrix of individually addressable switches 222 and the second matrix of individually addressable switches 226 of the configurable electrode assembly 208.

The apparatus 1900 includes an apparatus specific circuitry 1980. In an embodiment of the configurable surface acoustic wave device 1908A, the input electrode assembly 908 includes a first configurable electrode assembly and the output electrode assembly 909 includes a second configurable electrode assembly.

In an embodiment, the radio frequency interface 1940 is configured to receive or transmit airborne radio frequency signals 1944 on a plurality of channels. In an embodiment, the radio frequency interface is configured to receive or transmit wire borne radio frequency signals 1948 on a plurality of channels. In an embodiment, the radio frequency interface is configured to receive or transmit radio frequency modulated optical signals on a plurality of channels. In an embodiment, the radio frequency interface includes a transmitter 1942. In an embodiment, the radio frequency interface includes a receiver 1946.

In an embodiment, the radio frequency signal processing pathway 1910 includes the first configurable surface acoustic wave device 1908A configured to filter or delay the radio frequency signals on at least a first two channels of the plurality of channels and the second configurable surface acoustic wave device 1908B configured to filter or delay the radio frequency signals on at least a second two channels of the plurality of channels. In an embodiment, the radio frequency signal processing pathway includes the third configurable surface acoustic wave device 1908C configured to filter or delay the radio frequency signals on at least a third two channels of the plurality of channels.

In an embodiment, the apparatus specific circuit 1980 includes a mobile communications specific circuit. In an embodiment, the apparatus specific circuit includes a smart phone specific circuit. In an embodiment, the apparatus specific circuit includes a cellular communication specific circuit. In an embodiment, the apparatus specific circuit includes a global positioning system specific circuit. In an embodiment, the apparatus specific circuit includes a radar specific circuit. In an embodiment, the apparatus specific circuit includes a cable or wireless modem specific circuit. In an embodiment, the apparatus specific circuit includes an optical fiber communication system specific circuit. In an embodiment, the apparatus specific circuit includes a wireless hub or base station specific circuit. In an embodiment, the apparatus specific circuit includes a cellular communications system specific circuit.

In an embodiment, the radio frequency signal processing pathway 1910 includes a switch controller 1952 configured to operate an individually addressable switch of the first matrix of addressable switches and an individually addressable switch of the second matrix of addressable switches of each of the N instances of the electrode assembly sub-unit. In an embodiment, the radio frequency signal processing pathway includes a configuration manager 1954 configured to (i) receive a request for a filter characteristic, and (ii) select settings of the first and second-matrices of addressable switches of each of the N instances of the electrode assembly sub-units implementing the requested device characteristics implementing the requested filter characteristics. In an embodiment, the radio frequency signal processing pathway includes an embedded signal processing pathway computer system 1958. In an embodiment, the radio frequency signal processing pathway includes a receiver 1962.

In an embodiment, the radio frequency signal processing pathway includes a library 1956 of at least two selectable filter characteristics. Each selectable filter characteristic of the at least two selectable filter characteristics includes settings of the addressable switches of the configurable electrode assembly implementing a filter characteristic that includes at least one of a requested center frequency $f_o$, bandwidth, impulse response, delay, or transfer function. In an embodiment, the radio frequency signal processing pathway includes an embedded signal processing pathway computer system. In an embodiment, the apparatus specific circuitry 1980 includes an embedded computer system 1982.

Figure 22:
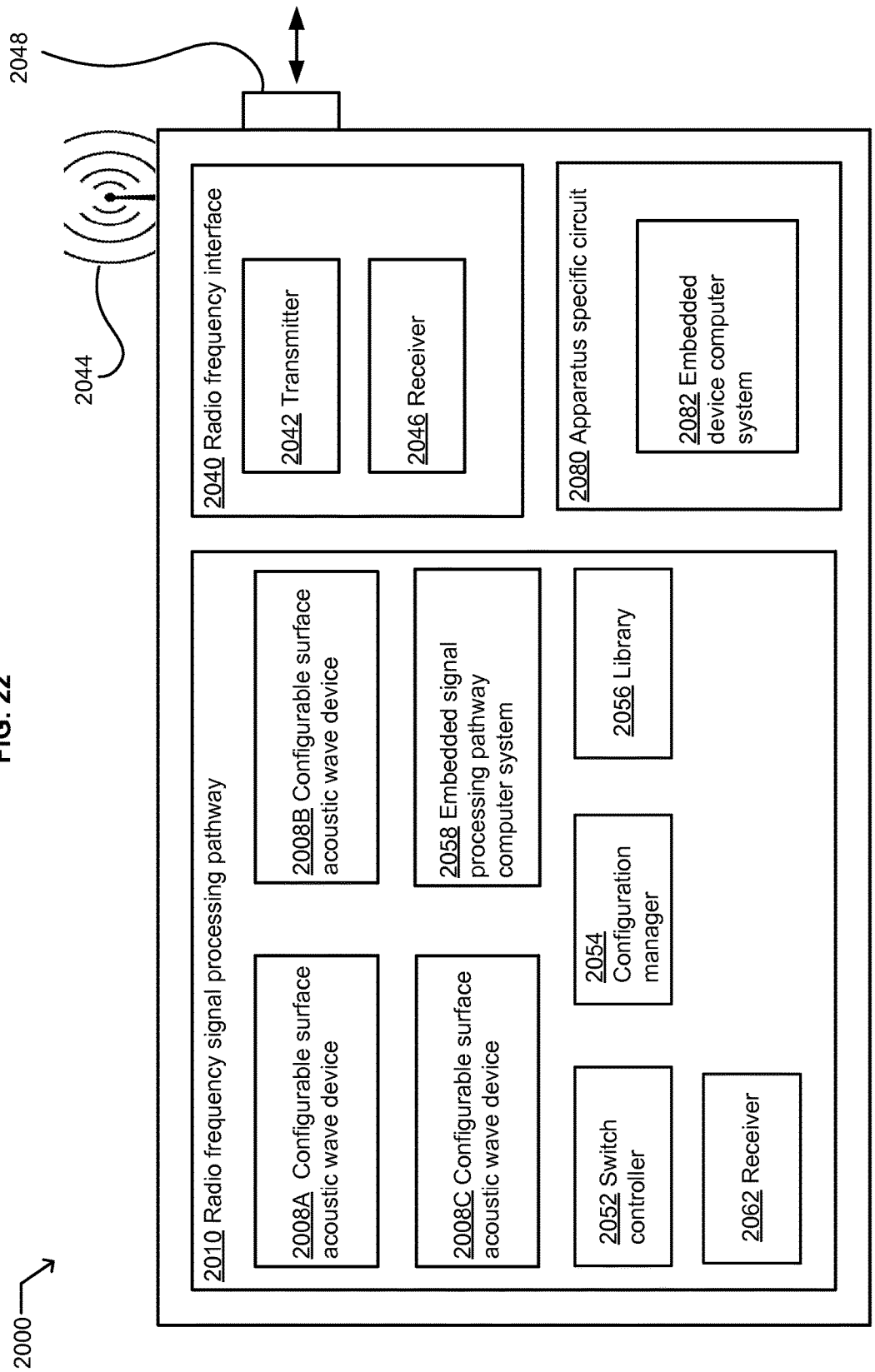
FIG. 22 illustrates an apparatus 2000.

FIG. 22 illustrates an apparatus 2000. The apparatus includes a radio frequency interface 2040 configured to receive or transmit radio frequency signals on a plurality of channels. The apparatus includes a radio frequency signal processing pathway 2010. The pathway includes a configurable surface acoustic wave device 2008 configured to filter or delay the radio frequency signals on at least two channels of the plurality of channels. The at least one configurable surface acoustic wave device is illustrated by configurable surface acoustic wave device 2008A, configurable surface acoustic wave device 2008B, and configurable surface acoustic wave device 2008C.

In an embodiment, the configurable surface acoustic wave device 2008A may be illustrated by reference to the configurable surface acoustic wave device 1600 described in conjunction with FIG. 18. The configurable surface acoustic wave device includes the piezoelectric substrate 1605, an input electrode assembly, and an output electrode assembly. The configurable surface acoustic wave device includes the surface wave propagating region 1607 of the piezoelectric substrate located in a propagation path between the input electrode assembly and the output electrode assembly.

Continuing with the illustration of the configurable surface acoustic wave device 1808 by reference to the configurable surface acoustic wave device 1600 described in conjunction with FIG. 18, the configurable surface acoustic wave device 2008A includes the configurable electrode assembly 1608 and another electrode assembly, illustrated by the fixed electrode assembly 1609. In the surface acoustic wave device, the input electrode assembly or the output electrode assembly includes the configurable electrode assembly. In an embodiment, the another electrode assembly may include another configurable electrode assembly or a fixed electrode assembly. The fixed electrode assembly is illustrated by the first fixed electrode 1682, and the second fixed electrode 1686.

The configurable electrode assembly 1608 includes an array including N rows of M elongated electrode sub-elements. The M elongated electrode sub-elements are illustrated as elongated electrode sub-elements 1610.0-1610.M. The elongated electrode sub-elements electrically isolated from each other, and electromechanically coupled with the piezoelectric substrate. The M elongated electrode sub-elements of the N rows are arranged end-to-end in columns. The N rows are illustrated as rows 1640.1-1640.N. While the surface acoustic wave device is illustrated with N=3, in various embodiments N is greater than three. For example, in an embodiment, N=5. In another embodiment, N=10. In another embodiment, N=50. The configurable electrode assembly includes a first signal bus 1632 proximate to the first row 1640.1 of the N rows of M elongated electrode sub-elements and electrically isolated therefrom. The configurable electrode assembly includes a first matrix of individually row addressable switches 1622. Each addressable row switch of the first matrix is configured to electrically couple the first signal bus with a respective electrode sub-element of the first row of electrode sub-elements. The configurable electrode assembly includes a second signal bus 1636 proximate to the $N^{th}$ row of the N rows of the M elongated electrode sub-elements and electrically isolated therefrom. The configurable electrode assembly includes a second matrix of individually addressable row switches 1628. Each addressable row switch of the second matrix is configured to electrically couple the second signal bus with a respective electrode sub-element of the $N^{th}$ row of electrode sub-elements. The configurable electrode assembly includes a plurality of individually addressable column switches. The individually addressable column switches are illustrated by a first row of at least two individually addressable column switches 1624A and a second row of at least two individually addressable column switches 1624B. Each individually addressable column switch is respectively configured to electrically couple an elongated electrode of a column of the M columns with an end-to-end adjacent elongated electrode of the same column of the M columns.

The apparatus 2000 includes an apparatus specific circuitry 2080. In an embodiment of the at least one configurable surface acoustic wave device 2008, the input electrode assembly 1208 includes a first configurable electrode assembly and the output electrode assembly 1209 includes a second configurable electrode assembly.

In an embodiment, the radio frequency interface 2040 is configured to receive or transmit airborne radio frequency signals 2044 on a plurality of channels. In an embodiment, the radio frequency interface is configured to receive or transmit wire borne radio frequency signals 2048 on a plurality of channels. In an embodiment, the radio frequency interface includes a transmitter 2042. In an embodiment, the radio frequency interface includes a receiver 2046.

In an embodiment, the radio frequency signal processing pathway 2010 includes the first configurable surface acoustic wave device 2008A configured to filter or delay the radio frequency signals on at least a first two channels of the plurality of channels and the second configurable surface acoustic wave device 2008B configured to filter or delay the radio frequency signals on at least a second two channels of the plurality of channels. In an embodiment, the radio frequency signal processing pathway includes the third configurable surface acoustic wave device 2008C configured to filter or delay the radio frequency signals on at least a third two channels of the plurality of channels. In an embodiment, the apparatus specific circuit 2080 includes a mobile communications specific circuit. In an embodiment, the apparatus specific circuit includes a smart phone specific circuit. In an embodiment, the apparatus specific circuit includes a cellular communication specific circuit. In an embodiment, the apparatus specific circuit includes a global positioning system specific circuit. In an embodiment, the apparatus specific circuit includes a radar specific circuit. In an embodiment, the apparatus specific circuit includes a cable or wireless modem specific circuit. In an embodiment, the apparatus specific circuit includes an optical fiber communication system specific circuit. In an embodiment, the apparatus specific circuit includes a wireless hub or base station specific circuit. In an embodiment, the apparatus specific circuit includes a cellular communications system specific circuit.

In an embodiment, the radio frequency signal processing pathway 2010 includes a switch controller 2052 configured to operate an addressable row switch of the first matrix of addressable row switches, an addressable row switch of the second matrix of addressable row switches, or an individually addressable column switch of the at least two individually addressable column switches.

In an embodiment, the radio frequency signal processing pathway 2010 includes a configuration manager 2054 configured to (i) receive a request for a filter characteristic, and (ii) select settings of the first matrix of addressable row switches, of the second matrix of addressable row switches, or the at least two individually addressable column switches implementing the requested filter characteristic. In an embodiment, the request for filter characteristic includes a request for an amplitude or phase response by the surface acoustic wave device. In an embodiment, the request for filter characteristic includes a request for an arbitrary filter characteristic.

In an embodiment, the radio frequency signal processing pathway 2010 includes an embedded signal processing pathway computer system 2058. In an embodiment, the apparatus specific circuitry 2080 includes an embedded computer system 2082. In an embodiment, the radio frequency signal processing pathway includes a receiver 2062 configured to receive a request for a filter characteristic.

All references cited herein are hereby incorporated by reference in their entirety or to the extent their subject matter is not otherwise inconsistent herewith.

In some embodiments, "configured" includes at least one of designed, set up, shaped, implemented, constructed, or adapted for at least one of a particular purpose, application, or function.

It will be understood that, in general, terms used herein, and especially in the appended claims, are generally intended as "open" terms. For example, the term "including" should be interpreted as "including but not limited to." For example, the term "having" should be interpreted as "having at least." For example, the term "has" should be interpreted as "having at least." For example, the term "includes" should be interpreted as "includes but is not limited to," etc. It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an (item) selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:
1. A surface acoustic wave device comprising:
a piezoelectric substrate;
a configurable electrode assembly including:
a plurality of spaced-apart elongated electrode elements electromechanically coupled with the piezoelectric substrate;
a first signal bus proximate to and crossing each of the plurality of electrode elements, and electrically isolated therefrom;
a first matrix of addressable switches, each addressable switch of the first matrix configured to electrically couple a respective electrode element of the plurality of electrode elements with the first signal bus;
a second signal bus proximate to and crossing each of the plurality of electrode elements, and electrically isolated therefrom; and a second matrix of addressable switches, each addressable switch of the second matrix configured to electrically couple a respective electrode element of the plurality of electrode elements with the second signal bus.

2. The surface acoustic wave device of claim 1, wherein the plurality of elongated electrode elements have a center-to-center transverse spacing of not more than $\lambda/2$ (where the surface wavelength $\lambda$=acoustic wave velocity $V_{SAW}$/center frequency $f_0$ of the device).

3. The surface acoustic wave device of claim 2, wherein a subgroup of the plurality of elongated electrode elements have a center-to-center transverse spacing of not more than $\lambda/4$.

4. The surface acoustic wave device of claim 1, further comprising:
a third signal bus proximate to and crossing each of the plurality of electrode elements, and electrically isolated therefrom; and
a third matrix of addressable switches, each addressable switch of the third matrix configured to electrically couple a respective electrode element of the plurality of electrode elements with the third signal bus.

5. The surface acoustic wave device of claim 1, wherein, when the first signal bus is electrically coupled to a first selected electrode element of the plurality of electrode elements by the respective addressable switches of the first matrix, and when the second signal bus is electrically coupled to a second selected electrode element of the plurality of electrode elements by the respective addressable switches of the second matrix, the second electrode elements not including the first selected electrode element, the configurable electrode assembly having an electrical response to a signal applied across the first signal bus and the second signal bus that is a function of the first selected electrode element and the second selected electrode element.

6. The surface acoustic wave device of claim 1, wherein an addressable switch of the first matrix of addressable switches or of the second matrix of addressable switches includes a semiconductor switch.

7. The surface acoustic wave device of claim 1, wherein the first matrix of addressable switches and the second matrix of addressable switches are included in a device having addressable memory elements, each addressable memory element configured to electrically couple a respective electrode element with the first signal bus or the second signal bus.

8. The surface acoustic wave device of claim 1, wherein an addressable switch of the first matrix of addressable switches or the second matrix of addressable switches includes a one-time programmable switch.

9. The surface acoustic wave device of claim 1, wherein an addressable switch of the first matrix of addressable switches or the second matrix of addressable switches includes a re-programmable switch.

10. The surface acoustic wave device of claim 1, wherein an addressable switch of the first matrix of addressable switches or the second matrix of addressable switches includes a randomly accessible switch.

11. The surface acoustic wave device of claim 1, wherein the first matrix of addressable switches or the second matrix of addressable switches includes coupled cells that are coupled with a memory array and are configured to be changed in a single operation.

12. The surface acoustic wave device of claim 1, wherein the first matrix of addressable switches and the second matrix of addressable switches are both configured to be collectively switched between a first arbitrary state and a second arbitrary state in less than one-tenth of a second.

13. The surface acoustic wave device of claim 1, wherein the configurable electrode assembly includes a reconfigurable electrode assembly.

14. The surface acoustic wave device of claim 1, wherein the configurable electrode assembly includes a one-time configurable electrode assembly.

15. The surface acoustic wave device of claim 1, further comprising:
a switch controller configured to operate an addressable switch of the first matrix of addressable switches and an addressable switch of the second matrix of addressable switches.

16. The surface acoustic wave device of claim 15, further comprising:
a configuration manager configured to (i) receive a request for a device parameter or sensitivity of the acoustic wave device, and (ii) select settings of the first and second matrices of addressable switches of the configurable electrode assembly implementing the requested device parameter or sensitivity.

17. The surface acoustic wave device of claim 16, wherein the (ii) select settings includes select the settings in response to a feedback loop monitoring a performance by the configurable electrode assembly with respect to the requested device parameter or sensitivity, implementing a change in the settings of the first and second matrices of addressable switches in response to the monitored performance, and then evaluating the performance by the configurable electrode assembly with the changed settings with respect to the requested device parameter or sensitivity.

18. The surface acoustic wave device of claim 1, further comprising:
a receiver configured to receive a request for a device parameter or sensitivity of the device.

19. A surface acoustic wave device comprising:
a piezoelectric substrate;
an input electrode assembly; and
an output electrode assembly;
the input electrode assembly or the output electrode assembly comprising a configurable electrode assembly, the configurable electrode assembly including:
a plurality of spaced-apart elongated electrode elements electromechanically coupled with the piezoelectric substrate;
a first signal bus proximate to and crossing each of the plurality of electrode elements, and electrically isolated therefrom;
a first matrix of addressable switches, each addressable switch of the first matrix of addressable switches configured to electrically couple a respective electrode element of the plurality of electrode elements with the first signal bus;
a second signal bus proximate to and crossing each of the plurality of electrode elements, and electrically isolated therefrom; and
a second matrix of addressable switches, each addressable switch of the second matrix of addressable switches configured to electrically couple a respective electrode element of the plurality of electrode elements with the second signal bus.

20. The surface acoustic wave device of claim 19, wherein the first signal bus crosses each of the plurality of electrode elements within a length of each of the plurality of electrode elements.

21. The surface acoustic wave device of claim 19, wherein the second signal bus crosses each of the plurality of electrode elements within a length of each of the plurality of electrode elements.

22. The surface acoustic wave device of claim 19, wherein, when the input electrode assembly includes the configurable electrode assembly, when the first signal bus is electrically coupled to a first selected electrode element of the plurality of electrode elements by the respective addressable switches of the first set, and when the second signal bus is electrically coupled to a second selected electrode element of the plurality of electrode elements by the respective addressable switches of the second matrix, the second selected electrode elements not including the first selected electrode element, the input electrode assembly forms an electrical-to-acoustic-wave transducer that responds to an input signal applied across the first signal bus and the second signal bus by generating surface waves on the piezoelectric substrate described by a transducer response function responsive to the first selected electrode element and the second selected electrode element.

23. The surface acoustic wave device of claim 19, wherein, when the output electrode assembly includes the configurable electrode assembly, when the first signal bus is electrically coupled to a first selected electrode element of the plurality of electrode elements by the respective addressable switches of the first set, and when the second signal bus is electrically coupled to a second selected electrode element of the plurality of electrode elements by the respective addressable switches of the second matrix, the second selected electrode elements not including the first selected electrode element, the output electrode assembly is configured to receive a surface acoustic wave initiated by the input electrode assembly and generate an electrical signal in response thereto, the generated electrical signal having amplitude or phase characteristics that are a function of the first selected electrode element and the second selected electrode element.

24. The surface acoustic wave device of claim 19, wherein the plurality of electrode elements have a center-to-center transverse spacing of not more than $\lambda/2$ (where the surface wavelength $\lambda$=acoustic wave velocity $V_{SAW}$/center frequency $f_0$ of the device).

25. The surface acoustic wave device of claim 24, wherein each electrode element has a width of not more than $\lambda/4$.

26. The surface acoustic wave device of claim 19, wherein an addressable switch of the first matrix of addressable switches or the second matrix of addressable switches includes a programmable switch.

27. The surface acoustic wave device of claim 19, wherein a switch of the first matrix of addressable switches or the second matrix of addressable switches includes a randomly accessible switch.

28. The surface acoustic wave device of claim 19, wherein the input electrode assembly includes a first instance of the configurable electrode assembly and the output electrode assembly includes a second instance of the configurable electrode assembly.

29. The surface acoustic wave device of claim 19, further comprising:
a switch controller configured to operate an addressable switch of the first matrix of addressable switches and an addressable switch of the second matrix of addressable switches.

30. The surface acoustic wave device of claim 29, wherein the switch controller is configured to operate an addressable switch of the first matrix of addressable switches and an addressable switch of the second matrix of addressable switches in response to a signal specifying switch settings selected to implement a requested device characteristic.

31. The surface acoustic wave device of claim 29, wherein the switch controller is configured to initiate a permanent one-time programming of a switch of the first matrix of addressable switches and a switch of the second matrix of addressable switches.

32. The surface acoustic wave device of claim 29, wherein the switch controller is configured to initiate a state change of a switch of the first matrix of addressable switches and of a switch of the second matrix of addressable switches.

33. The surface acoustic wave device of claim 19, wherein the device includes:
a configuration manager configured to (i) receive a request for an acoustic wave device characteristic, and (ii) select settings of the first and second matrices of addressable switches of the configurable electrode assembly implementing the requested device characteristic.

34. The surface acoustic wave device of claim 33, wherein the request for acoustic wave device characteristic includes a request for an amplitude or phase response by the surface acoustic wave device.

35. The surface acoustic wave device of claim 33, wherein the (ii) select settings includes (a) select an optimized electrode pattern to produce the requested device characteristic and (b) select settings of the first and second matrices of addressable switches implementing the selected optimized electrode pattern in the electrode elements.

36. The surface acoustic wave device of claim 19, wherein the configurable electrode assembly further includes:
a third signal bus proximate to each electrode element of the plurality of electrode elements, and electrically isolated therefrom; and
a third matrix of addressable switches, each addressable switch of the third matrix configured to electrically couple a respective electrode element of the plurality of electrode elements with the third signal bus.

37. The surface acoustic wave device of claim 19, further comprising:
a receiver configured to receive a request for an acoustic wave device characteristic of the surface acoustic wave device.

38. The surface acoustic wave device of claim 37, wherein the request for an acoustic wave device characteristic includes a requested impulse response.

39. A surface wave device comprising:
a piezoelectric substrate;
an input electrode assembly including:
a plurality of spaced-apart elongated input electrode elements electromechanically coupled with the piezoelectric substrate;
a first input signal bus proximate to and crossing each of the plurality of input electrode elements, and electrically isolated therefrom;
a first input-matrix of addressable switches, each addressable switch of the first input-matrix configured to electrically couple a respective input electrode element of the plurality of input electrode elements with the first input signal bus;
a second input signal bus proximate to and crossing each of the plurality of input electrode elements, and electrically isolated therefrom; and
a second input-matrix of addressable switches, each addressable switch of the second input-matrix configured to electrically couple a respective input electrode element of the plurality of input electrode elements with the second input signal bus; and an output electrode assembly including:

a plurality of spaced-apart elongated output electrode elements electromechanically coupled with the piezoelectric substrate;

a first output signal bus proximate to and crossing each of the plurality of output electrode elements, and electrically isolated therefrom;

a first output-matrix of individually addressable switches, each addressable switch of the first output-matrix configured to electrically couple a respective output electrode element of the plurality of output electrode elements with the first output signal bus;

a second output signal bus proximate to and crossing each of the plurality of output electrode elements, and electrically isolated therefrom; and a second output-matrix of individually addressable switches, each addressable switch of the second output-matrix configured to electrically couple a respective output electrode element of the plurality of output electrode elements with the second output signal bus.

40. The surface wave device of claim 39, wherein, when the first input signal bus is electrically coupled to a first selected input electrode element of the plurality of input electrode elements by the respective addressable switches of the first input-matrix, and when the second input signal bus is electrically coupled to a second input electrode element of the plurality of input electrode elements by the respective addressable switches of the second input-matrix, the second selected input electrode elements not including the first selected input electrode elements, the input electrode assembly is configured to initiate in response to an input signal applied across the first signal bus and the second signal bus surface waves on the piezoelectric substrate having amplitude or phase characteristics that are a function of the first selected input electrode element and the second selected input electrode element.

41. The surface wave device of claim 39, wherein, when the first output signal bus is electrically coupled to a first selected output electrode element of the plurality of output electrode elements by the respective addressable switches of the first output-matrix, and when the second output signal bus is electrically coupled to a second selected output electrode element of the plurality of output electrode elements by the respective addressable switches of the second output-matrix, the second selected output electrode element not including the first selected output electrode element, the output electrode assembly is configured to receive a surface acoustic wave initiated by the input electrode assembly and generate an electrical signal in response thereto, the generated electrical signal having amplitude or phase characteristics that are a function of the first selected output electrode elements and the second selected output electrode elements.

42. The surface wave device of claim 39, wherein the plurality of spaced-apart elongated input electrode elements have a center-to-center transverse spacing of not more than $\lambda/2$ (where the surface wavelength $\lambda$=acoustic wave velocity $V_{SAW}$/center frequency $f_0$ of the device).

43. The surface wave device of claim 39, wherein the plurality of spaced-apart elongated output electrode elements have a center-to-center transverse spacing of not more than $\lambda/2$ (where the surface wavelength $\lambda$=acoustic wave velocity $V_{SAW}$/center frequency $f_0$ of the device).

* * * * *